United States Patent
Moriya et al.

(10) Patent No.: US 7,337,112 B2
(45) Date of Patent: Feb. 26, 2008

(54) DIGITAL SIGNAL CODING AND DECODING METHODS AND APPARATUSES AND PROGRAMS THEREFOR

(75) Inventors: Takehiro Moriya, Tokyo (JP); Akio Jin, Kokubunji (JP); Takeshi Mori, Higashiyamato (JP); Kazunaga Ikeda, Fujisawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 11/610,921

(22) Filed: Dec. 14, 2006

(65) Prior Publication Data

US 2007/0083362 A1    Apr. 12, 2007

Related U.S. Application Data

(62) Division of application No. 10/226,138, filed on Aug. 23, 2002, now Pat. No. 7,200,561.

(30) Foreign Application Priority Data

| | | |
|---|---|---|
| Aug. 23, 2001 | (JP) | 2001-252475 |
| Nov. 30, 2001 | (JP) | 2001-366734 |
| Nov. 30, 2001 | (JP) | 2001-366806 |
| Dec. 3, 2001 | (JP) | 2001-368759 |
| Feb. 28, 2002 | (JP) | 2002-052905 |
| Mar. 5, 2002 | (JP) | 2002-058448 |
| Mar. 5, 2002 | (JP) | 2002-058521 |
| Mar. 8, 2002 | (JP) | 2002-064037 |

(51) Int. Cl.
*G10L 21/02* (2006.01)
*G10L 11/04* (2006.01)
*G10L 21/00* (2006.01)

(52) U.S. Cl. .............. 704/228; 704/206; 704/219
(58) Field of Classification Search .......... None
See application file for complete search history.

(56) References Cited

U.S. PATENT DOCUMENTS 4,142,071 A    2/1979   Croisier et al.

(Continued)

FOREIGN PATENT DOCUMENTS

EP    0 905 918    3/1999

(Continued)

OTHER PUBLICATIONS

P. Craven, et al., Journal of the Audio Engineering Society, vol. 44, No. 9, XP-000699724, pp. 706-720, "Lossless Coding for Audio Discs," Sep. 1, 1996.

(Continued)

*Primary Examiner*—David Hudspeth
*Assistant Examiner*—Brian L. Albertalli
(74) *Attorney, Agent, or Firm*—Oblon, Spivak, McClelland, Maier & Neustadt, P.C.

(57) ABSTRACT

At the coder side, bits of samples of each frame of an input digital signal are concatenated every digit common to the samples across each frame to generate equi-order bit sequences, which are output as packets. At the decoding side, the input equi-order sequences are arranged inversely to their arrangement at the coder side to reconstruct sample sequences. When a packet dropout occurs, a missing information compensating part 430 correct the reconstructed sample sequences in a manner to reduce an error between the spectral envelope of the reconstructed sample sequence concerned and a known spectral envelope.

20 Claims, 43 Drawing Sheets

U.S. PATENT DOCUMENTS

| | | | |
|---|---|---|---|
| 5,130,985 | A | 7/1992 | Kondo et al. |
| 5,539,842 | A | 7/1996 | Schwartz |
| 5,577,161 | A * | 11/1996 | Pelaez Ferrigno .......... 704/226 |
| 5,839,100 | A | 11/1998 | Wegener |
| 5,870,704 | A * | 2/1999 | Laroche ..................... 704/209 |
| 6,226,325 | B1 | 5/2001 | Nakamura |
| 6,275,796 | B1 * | 8/2001 | Kim et al. .................. 704/230 |
| 6,463,410 | B1 | 10/2002 | Fuchigami et al. |
| 6,498,811 | B1 | 12/2002 | Van Der Vleuten |
| 6,606,592 | B1 * | 8/2003 | Cho et al. ................... 704/219 |
| 6,675,148 | B2 | 1/2004 | Hardwick |
| 7,013,266 | B1 * | 3/2006 | Berger ........................ 704/203 |

FOREIGN PATENT DOCUMENTS

| | | |
|---|---|---|
| JP | 9-9266 | 1/1997 |
| JP | 10-51791 | 2/1998 |
| JP | 11-331852 | 11/1999 |
| JP | 2001-44847 | 2/2001 |

OTHER PUBLICATIONS

M. Bosi, et al. Journal of the Audio Engineering Society, vol. 45, No. 10, XP-000730161, pp. 789-812, "ISO/IEC MPEG-2 Advanced Audio Coding," Oct. 1, 1997.

K. Brandenburg, et al., Signal Processing: Image Communication, vol. 15, XP-000885372, pp. 423-444, "MPEG-4 Natural Audio Coding," Jan. 2000.

K. Ikeda, et al., IEEE Transactions on Consumer Electronics, vol. 44, No. 3, XP-000851616, pp. 1032-1037, "Audio Transfer System on PHS Using Error Protected Stereo Twin VQ," Aug. 1998.

Takehiro Moriya, et al., Lossless Scalable Audio Coder and Quality Enhancement, ICASSP'02, Proceeding, 2002 IEEE International Conference, vol. 2, 2002, pp. 1829-1832.

T. Moriya, et al., IEEE International Conference on Acoustics, Speech, and Signal Processing, vol. 2 of 6, pp. 889-892, XP-002901946, "A Design of Lossy and Lossless Scalable Audio Coding," Jun. 5, 2000.

S.W. Kim, 108th AES Convention, Online, Samsung AIT, 18 pages, XP-002253927, "MPEG-4 BSAC Technology," Feb. 19, 2000.

M. Hans, et al., IEEE Signal Processing Magazine, vol. 18, No. 4, pp. 21-32, XP-001053611, "Lossless Compression of Digital Audio," Jul. 2001.

N. Iwakami, et al., Acoustics, Speech, and Signal Processing, pp. 3095-3098, XP 010151999, "High-Quality Audio-Coding at Less Than 64 KBIT/S by Using Transform-Domain Weighted Interleave Vector Quantization (TWINVQ)," May 9-12, 1995.

Liebchen et al., "Lossless Transform Coding of Audio Signals," Presented at 102nd AES Convention, Munich, 1997.

* cited by examiner

FIG. 42
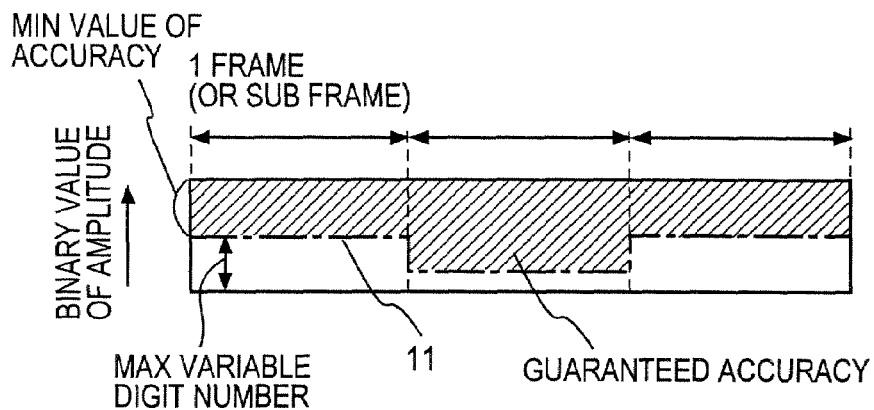
FIG. 43A
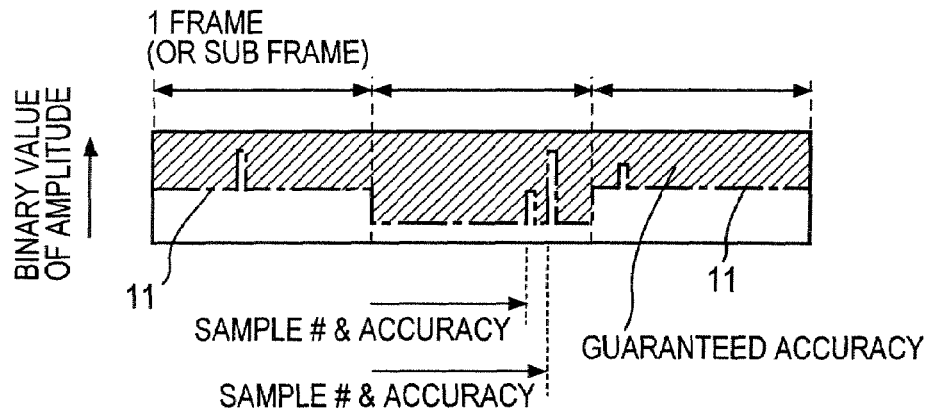
FIG. 43B
| EXCEP NUMBER | POSITION | VALUE | POSITION | VALUE | · · · · · · | MAX VARIABLE DIGIT NUMBER |
|---|---|---|---|---|---|---|

DIGITAL SIGNAL CODING AND DECODING METHODS AND APPARATUSES AND PROGRAMS THEREFOR

This is a Divisional application of Ser. No. 10/226,138 filed Aug. 23, 2002 now U.S. Pat. No. 7,200,561 and claims the benefit of priority from the Japanese Patent Application Nos. 2001-252475 filed Aug. 23, 2001; 2001-366734 filed Nov. 30, 2001; 2001-366806 filed Nov. 30, 2001; 2001-368759 filed Dec. 3, 2001; 2002-052905 filed Feb. 28, 2002; 2002-058448 filed Mar. 5, 2002; 2002-058521 filed Mar. 5, 2002; and 2002-064037 filed Mar. 8, 2002.

BACKGROUND OF THE INVENTION

The present invention relates to coding and decoding methods for reducing the number of bits that represent various digital signals such as an acoustic signal and an image signal and apparatuses and programs therefor, particularly, to those capable of controlling allowable distortion.

To compress audio and visual information, there are proposed an irreversible distortion-prone or lossy coding scheme, and a distortion-free or lossless coding scheme. For irreversible compression coding (or lossy compression coding), there are several well known schemes such as ITU-T (International Telecommunications Union—Telecom Standardization) and ISO/IEC MPEG (International Organization for Standardization/International Electrotechnical Commission Moving Picture Experts Group) standard schemes. With these irreversible compression coding schemes, it is possible to compress the original digital signal down to $1/10$ or less with a little loss of signal data. However, the loss depends on the coding condition or the input signal, and may sometimes lead to degradation of the reconstructed signal.

On the other hand, a known reversible compression coding (or lossless compression coding) scheme capable of completely reconstructing the original signal is a universal compression coding scheme for to compressing data files and texts of computers. This compression coding scheme is able to compress any type of signals while learning the statistics of the input sequence; tests or the like can be compressed down to approximately $1/2$, but in the case of audio and visual data, their compression ratio is only about 20%.

A combination use of high-compression-ratio irreversible coding and reversible compression of an error between the reconstructed and the original signal, flexible use either the high-compression-ratio irreversible coding or allows the reversible compression coding as required.

The inventor of the present application has proposed the above combined compression coding scheme in Japanese Patent Application Laid-Open Gazette No. 44847/01 "Coding Method, Decoding Method and Apparatuses Therefor and Recording Media Having Recorded Thereon Programs Therefor." While described in detail in the above gazette, the combined compression coding scheme will be described below in brief with reference to FIG. 1.

In a coder 10, a digital input signal (hereinafter referred to also as an input signal sample sequence) is input via an input terminal 100, and in a frame separation part 100 the input signal sample sequence is separated into frames each consisting of, for example, 1024 input signal samples.

In an irreversible quantization part 120 the output from the frame forming part 110 is subjected to irreversible compression coding. This coding may be of any scheme suited to the digital input signal as long as it enables the input signal to be reconstructed to some extent when it is decoded. For example, when the input signal is a speech signal, ITU-T speech coding or the like can be used; in the case of music, MPEG or TwinVQ (Transform-Domain Weighted Interleaved Vector Quantization) can be used; and in the case of video, MPEG or the like can be used. Further, various irreversible quantization schemes mentioned in the above-mentioned Japanese gazette can also be employed. Incidentally, the output from the irreversible quantization part 120 will hereinafter be referred to as an "irreversibly compressed code I(n)."

In an inverse quantization part 130 of the same configuration as that of a decoding part (i.e. an inverse quantization part 230) corresponding to the irreversible quantization part 120, a locally reconstructed signal is generated from the irreversibly compressed code I(n). An error signal between the locally reconstructed signal and the original digital input signal is calculated in a subtraction part 140. Usually the amplitude of the error signal is appreciably smaller than the amplitude of the original digital input signal. Accordingly, as compared with reversibly compression coding of the digital input signal as it is, reversible compression coding of the error signal permits reduction of the amount of information.

To increase the efficiency of the reversible compression coding, a rearrangement part 160 rearranges bits of the error signal (i.e. a bit sequence or stream). The details of processing by the rearrangement part 160 will be described below with reference to FIG. 2. In the digital input signal (FIG. 2A) a positive or negative integer of each sample value (amplitude) is represented using a 2's complement format. Error signal samples between the digital input signal and the corresponding locally reconstructed signal are shown in FIG. 2B. The rearrangement part 160 converts the error signal (that is, a bit sequence) from a bit sequence of the 2's complement format to a bit sequence of a sign-magnitude format (a binary number of sign and magnitude) (FIG. 2C). In the converted error signal, MSB (Most Significant Bit) to a second LSB (Least Significant Bit) represent the magnitude of its amplitude and LSB the sign of the amplitude.

Next, in the rearrangement part 160 the error signal samples converted to the sign-magnitude format are combined at their respective corresponding bit positions (i.e., MSB, second MSB, . . . , LSB), successively in a temporal order in FIG. 2 (FIG. 2D). Each of these bit sequences (e.g., consisting of 1024 bits at the same bit position) will hereinafter be referred to as a "equi-position bit sequence." In the above rearrangement the value of each error signal remains unchanged. Since the error signal is small in amplitude, however, high-order bits all become "0s" frequently. As a result, a sequence of "0s" provides enhanced efficiency in the reversible compression coding of the error signal.

Next, the output from the rearrangement part 160 is subjected to reversible compression coding in a reversible coding part 150. The reversible coding part 150 performs the reversible compression coding of the equi-position bit sequences by entropy coding which utilizes, for example, the presence of a consecutive sequence or a frequent-occurrence sequence, such as Huffman coding or arithmetic coding, the coded equi-position bit sequences being provided to a decoder 20. The compression efficiency will be increased as well by applying to the output from the rearrangement part 160 universal coding that reversibly compresses a text or the like.

As the result of the above processing, the coder 10 outputs the irreversibly compressed code I(n) from the irreversible quantization part 120 and the reversibly compressed code I(e) from the reversible coding part 150.

In the decoder 20 a decoding part 210 decodes the reversibly compressed code I(e). And a rearrangement part 220 sequentially outputs the error signals for each frame by performing processing reverse to that of the rearrangement part 160. The inverse quantization part 230 decodes the irreversibly compressed code I(n). An addition part 240 adds the outputs from the inverse quantization part 230 and the rearrangement part 160. Finally, a frame combining part 250 sequentially outputs the output signal from the addition part 240 to reconstruct the original input signal sample sequence, which is provided at an output terminal 260.

The conventional reversible compressing coding scheme presents a problem that when a bit erasure occurs during transmission, each sample to be reconstructed by the rearrangement part of the decoder 20 gets mixed with bits of other samples, seriously degrading the reconstructed signal quality. This prior art scheme provides a compression ratio of approximately ½ at the highest and cannot achieve a ⅓ or ¼ compression ratio with no substantial deterioration of quality nor can it implement compression with a satisfactory accuracy.

Moreover, even if the number of bits of the digital value representing the amplitude of the original signal is reduced by one bit, it is possible to restore the original waveform with the same accuracy as that with no bit reduction, but reducing four or more bits raises an auditory-sensation problem that high quantization noise is noticeable.

SUMMARY OF THE INVENTION

It is therefore an object of the present invention to provide coding and decoding methods which prevent a bit erasure during transmission from leading to serious degradation of the decoded signal quality and apparatuses which embody the methods.

A coding method according to the present invention comprises the steps of:

(a) generating multiple sets of data either consisting of multiple sets of lossless data of bits over said samples at each one of bit positions of said digital signal in said frame or consisting of lossy data and lossless data of an error signal due to said lossy data; and (b) coding said multiple sets of data to produce codes.

A decoding method according to the present invention comprised the steps of:

(a) decoding input codes to produce multiple sets of data either consisting of multiple sets of lossless data of bits over said samples at each one of bit positions of said digital signal in said frame or consisting of lossy data and lossless data of an error signal due to the lossy data; and (b) reconstructing a digital signal based on said multiple sets of data.

A coder for coding a digital signal for each frame according to the present invention comprises:

means for generating multiple sets of data either consisting of multiple sets of lossless data of bits over said samples at each one of bit positions of said digital signal in said frame or consisting of lossy data and lossless data of an error signal due to said lossy; and means for coding said multiple sets of data to produce codes.

A decoder which reconstructs a sequence of samples of a digital signal for each frame according to the present invention comprises:

means for decoding input codes to produce multiple sets of data either consisting of multiple sets of lossless data of bits over said samples at each one of bit positions of said digital signal in said frame or consisting of lossy data and lossless data of an error signal due to the lossy data; and means for reconstructing a digital signal based on said multiple sets of data.

According to the coding method of the present invention, each piece of transmission/recording unit data is put in packet form, and hence, even if the amount of information is reduced by intentionally erasing the packet in accordance with the channel capacity or storage capacity during coding, the decoding method of the present invention enables the transmission/recording unit data to be compensated for the packet erasure.

In this specification, the packet erasure refers to the cases: where all packets of one frame are not input to the decoder because of intentionally removing packets of one frame so as to control the amount of information; where a packet erasure occurs because a router or the like does not send out some packets due to traffic congestion in a communication network or due to transmission line failure or abnormality of a recording/playback unit; and where because of an error in the input packet the transmission/recording unit data concerned cannot be decoded nor can it be used.

BRIEF DESCRIPTIN OF THE DRAWINGS

FIG. 42 is a diagram showing an example of an accuracy-guaranteed locally reconstructed signal 11;

FIG. 43A is a diagram showing another example of the accuracy-guaranteed locally reconstructed signal 11;

FIG. 43B is a diagram showing an example of a code group including an exception code Ige and a digit number code Ig.

DETAILED DESCRIPTION OF THE PREFERRED EMBODIMENTS

Figure 1:
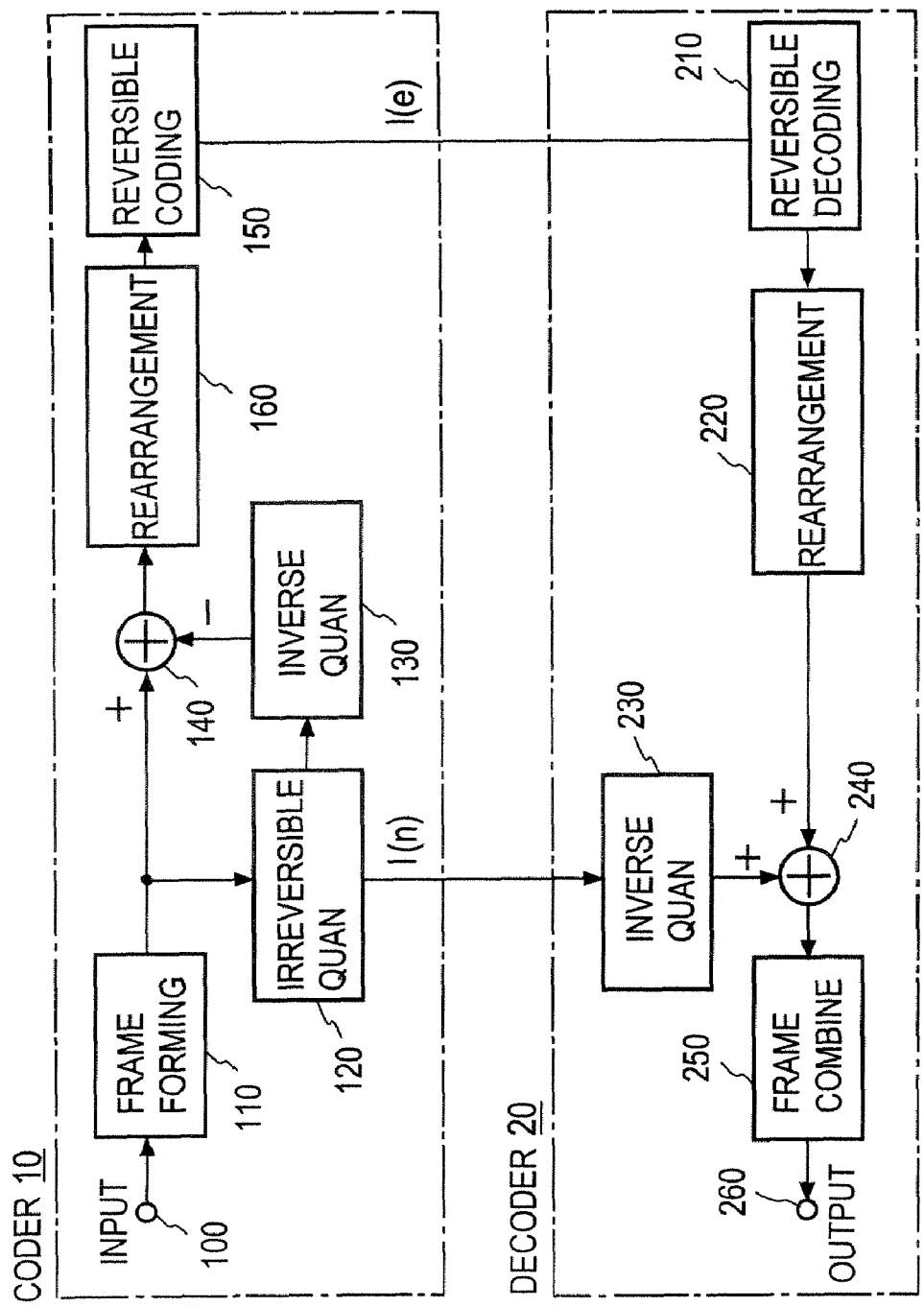
FIG. 1 is a block diagram illustrating functional configurations of a coder and a decoder in the prior art

Referring to the accompanying drawings, embodiments of the present invention will hereinafter be described. The parts corresponding to those previously described in respect of the prior art will be identified by the same reference numerals as those used therefor.

Embodiment 1

Figure 3:
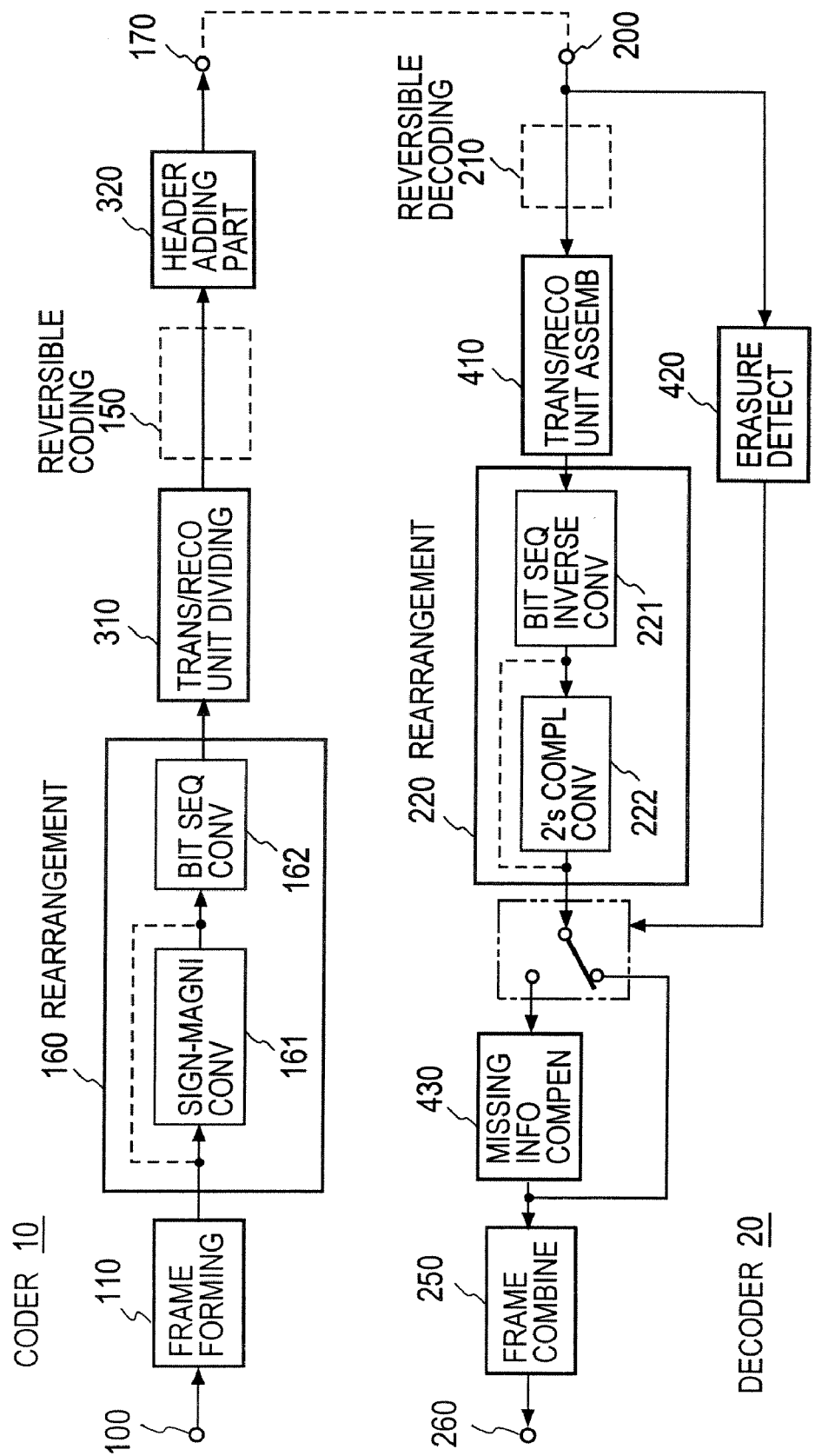
FIG. 3 is a block diagram illustrating the functional configuration of a coder and a decoder according to Embodiment 1 of the present invention.

In FIG. 3 there are depicted in block form the coder 10 and the decoder 20 according to this embodiment of the present invention. This embodiment differs from the FIG. 1 prior art example in the provision of a header adding part 320, which sends out signals in a packet to reduce the influence of a bit error during transmission on the quality of reconstructed signal.

In the coder 10 an input signal sample sequence from an input terminal 100 is separated by a frame forming part 110 into frames each consisting of, for example, 1024 input signal samples (that is, n=samples at 1024 sample points), and in the rearrangement part 160 bits at each bit position in amplitude bit sequences of the respective samples are formed in the frame. In this case, the amplitude of the input signal sample sequence is represented by a positive or negative integer in the 2's complement format; it is preferable that, as is the case with the prior art, each sample represented in the 2's complement format be converted to an m-bit binary format consisting of a sign bit and absolute value in a sign-magnitude conversion part 161 and that m-bit samples of each frame be converted to bit sequences each formed by sequential bits at each bit positions of the respective m-bit samples over the entire frame in a bit sequence converting part 162, which bit sequences will hereinafter be referred to as equi-position bit sequences. As indicated by the broken line in FIG. 3, however, the output from the frame separation part 100 may be fed directly to the bit sequence conversion part 162, wherein bits at each of the bit positions are concatenated in the frame to form equi-position bit sequences.

In the present invention, the equi-position bit sequences from the rearrangement part 160 are provided to a transmission/recording unit separation part 310, wherein they are each separated to transmission or storage unit data. This unit will hereinafter be referred to as a block and also as a packet. Each piece of the transmission/recording unit data separated is reversibly compressed in a reversible coding part 150, if necessary. In the header adding part 320 a header containing a serial number, for instance, is imparted to each piece of the reversibly compressed transmission/recording unit so that during decoding the separated pieces of transmission recording data may be reconstructed as one frame, and the unit data is provided as a packet to an output terminal 170. Incidentally, the reversible coding part 150 is similar to that 150 used in the prior art example.

Figure 4A:
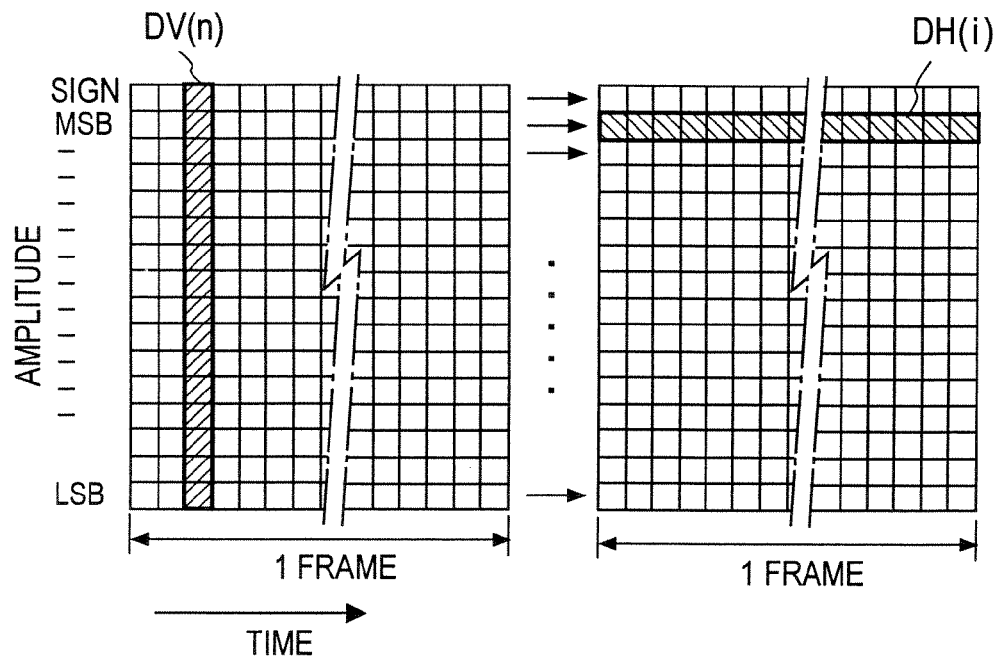
FIG. 4A is a diagram showing an example of processing of the rearrangement part 160.

An ordinary input signal sample represents a positive or negative integer in the 2's complement format, but in this example, bits of numerical value sequences of every frame after conversion of the digital input signal to the binary format consisting of the sign bit and absolute value are rearranged, that is, converted to the equi-position bit sequences and they are separated into transmission/recording unit data as shown in FIG. 4A. The respective m-bit samples of one frame in a sign-magnitude format are sequentially arranged in a temporal order as depicted at the left-hand side of FIG. 4A. For the sake of better understanding of the amplitude bit sequence of an n-th sample, it is shown as a thick-lined amplitude bit sequence DV(n), where n represents the sample number in a temporal order in the frame; for example, n=1, 2, ..., 1024. As will be described, for example, in case where input data is a speech signal, if a bit is lost due to a packet erasure on the transmission line, the reconstructed speech quality is distorted more seriously the higher-order the bit is in the amplitude bit sequence DV(n). In this instance, the sign bit distorts the speech quality most seriously; hence, in this example, the sign bit of each amplitude bit sequence DV(n) is placed adjacent to the MSB of the absolute value, and in FIG. 4A it is placed right above MSB.

In this example, as shown on the right-hand side of FIG. 4A, only sign bits (signs) of amplitude values of the respective samples are first concatenated in a temporal order to form equi-position bit sequences in the frame. Next, only MSBs of the amplitude values are concatenated in the frame to form an equi-position bit sequence. Thereafter, bits at each of other bit positions are similarly concatenated across the frame to form equi-position bit sequences. Finally, only LSBs are concatenated in the frame to form an equi-position bit sequence. An example of such equi-position bit sequences is indicated by a thick-lined frame DH(i), where i represents each bit position in the equi-position bit sequence DV(n); for example, i=1, 2, ..., 17, counted from the MSB. In the above rearrangement, the contents included in the frame remain unchanged.

In the transmission/recording unit separation part 310 each equi-position bit sequence DH(i) or adjacent plural equi-position bit sequences DH(i) are separated into pieces of transmission/recording unit data. In this case, transmission/recording unit data formed by one equi-position bit sequence and transmission/recording unit data by plural equi-position bit sequences may be interleaved in one frame.

Figure 4B:
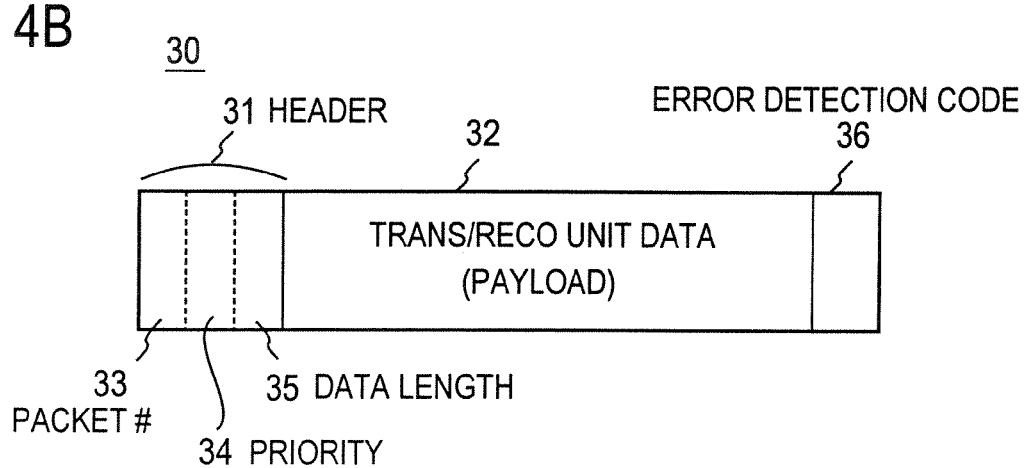
FIG. 4B is a diagram showing an example of the format of a packet.

Each piece of the transmission/recording unit data is provided to the header adding part 320, wherein a header 32 is added to the transmission/recording unit data (payload) 32 as shown in FIG. 4B, for instance. The header 31 contains a packet number 33 consisting of, for example, a frame number and the number of the transmission/recording unit data in the frame, and if necessary, the priority level 34 of the packet and the data length 35, enabling the decoder side to reconstruct the digital signal sequence for each frame accordingly.

Transmission of data length 35 is not necessary if the data length of the transmission/recording unit data is fixed. When it is compressed in the reversible coding part 150, the data length may, however, sometimes differ with packets.

In general, an error detecting code 35 for detecting an error in the packet, such as a CRC code, is added to the end of the payload 32 to form one packet 30, which is provided to the output terminal 170.

In the case of assigning priorities to the packets 30, codes representing higher priorities are given to packets containing transmission/recording unit data corresponding to higher-order bit positions of the amplitude bit sequence. That is, when each equi-position bit sequence DH(i) is separated, the packet containing data of smaller i in DH(i) is given a higher priority. In the example of FIG. 4A, the sign amplitude bit sequence DH(1) containing the sign bit corresponding to i=1 is given the highest priority. The amplitude bit sequences for the LSB to MSB can be assigned priorities in an increasing order, instead it is also possible to assign different priority levels to, for example, plural high-order bits and a common lower level priority to plural low-order bits. The number of priority levels assigned to the bit sequences can be smaller than the number of the bit sequences. In the case of using the reversible compression coding in combination with the high-compression irreversible quantization as described previously with reference to the prior art, the highest priority level may be given to the bit sequence representing the high-compression encoded code as will be described.

In the decoder 20, when the packet 30 input via an input terminal 200 has its transmission/recording unit data reversibly compressed, the packet 30 is reversibly decoded in a reversible decoding part 210 (identical with the conventional decoding part 210), and in a transmission/recording unit assembling part 410, based on the packet numbers, pieces of transmission/recording unit data of respective packets 30 are assembled every frame, for example, as indicated by the equi-position bit sequence DH(i) on the right side of FIG. 4A. The assembled equi-position bit sequence is fed to a data rearrangement part 220, wherein they are converted to an amplitude bit sequence DV(n), that is, a sample sequence (waveform sample sequence). In this case, when each sample is represented by the amplitude value in a sign-absolute value format, the equi-position bit sequences are rearranged to amplitude bit sequences in a bit sequence conversion part 221, after which each amplitude bit sequence is converted to a 2's complement binary format in a 2's complement conversion part 222. Incidentally, when the transmission/recording unit data is based on a equi-position bit sequence directly rearranged from an amplitude bit sequence in the 2's complement format, the amplitude bit sequence from the bit sequence conversion part 221 is provided as a decoded sample to a frame combining part 250 as indicated by the broken lines in FIG. 3.

In the present invention, if the occurrence of an erasure in a series of packet numbers of the input packets is detected in an erasure detecting part 420, which decides that the packets of the packet numbers are missing, and the amplitude bit sequences from the rearrangement part 220 are not provided directly to the frame combining part 250, instead they are fed to the missing information compensating part 430, wherein they are compensated for missing information, after which the amplitude bit sequences are provided to the frame combining part 250.

The compensation for missing information in the missing information compensating part 430 is made by estimating the missing information from known information. When a packet that usually contains a bit near the LSB side and hence lower in priority fails to transmit, since the value of the bits corresponding to the missing portion cannot be determined, the waveform has to be reconstructed using a small numerical value, for example, 0 or an intermediate value that the missing portion can take. Although the accuracy of a determined number of bits on the MSB side can be retained, but the bit erasure results in large perceptual distortion for the reasons given below. The spectrum of the original sound leans in energy toward the low frequency range as indicated by the solid line in FIG. 5, whereas the distortion component by the bit erasure has a nearly flat spectral shape as indicated by the broken line and its high-frequency component is larger than in the original sound and heard as noise. To solve this problem, the value of uncertain waveform is corrected so that the spectrum of the uncertain component becomes close to an average spectrum or a spectrum determined for each frame. This reduces the high-frequency component of the spectrum of the distortion component after correction as indicated by the one-dot chain line in FIG. 5, masking the distortion by the original sound and hence improving quality.

Figure 5:
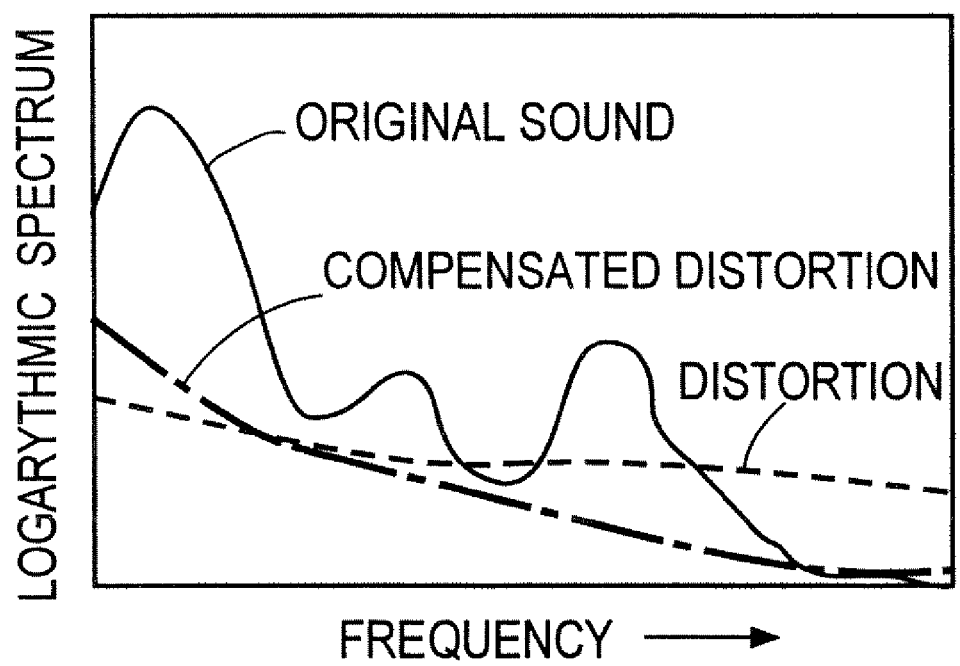
FIG. 5 is a graph showing an example of comparison between the original sound and a distortion component in association with processing by a missing information compensating correcting part 430.

That is, when an average spectrum of several preceding frames or a determined spectrum in a separately obtained frame to be described is close to the solid-lined spectrum in FIG. 5, for instance, compensation is made for the missing information so that a spectrum available from information other than the missing information of the current frame goes close to the solid-line spectrum in FIG. 5. A preferable correction scheme will be described later on in connection with another embodiment. A simple scheme is to remove a noise component in the high-frequency range by smoothing the input reconstructed sample sequence by low-pass filter in the erasure correction part 430. The cut-off characteristics of the low-pass filter is so chosen as to attenuate the high-frequency component according to the characteristics if the spectral envelope of the original signal is known. Alternatively, the cut-off characteristics may be adaptively changed according to the shape of an average spectrum obtained as mentioned above or a determined spectrum of each frame.

Since missing information resulting from a packet erasure can be compensated for in the decoder 20 as described above, even if the coding compression efficiency is increased by intentionally refraining from sending the LSB side packets as required, it is possible for the decoder 20 to perform decoding or reconstruction with perceptually lossless quality.

Embodiment 2

Figure 6:
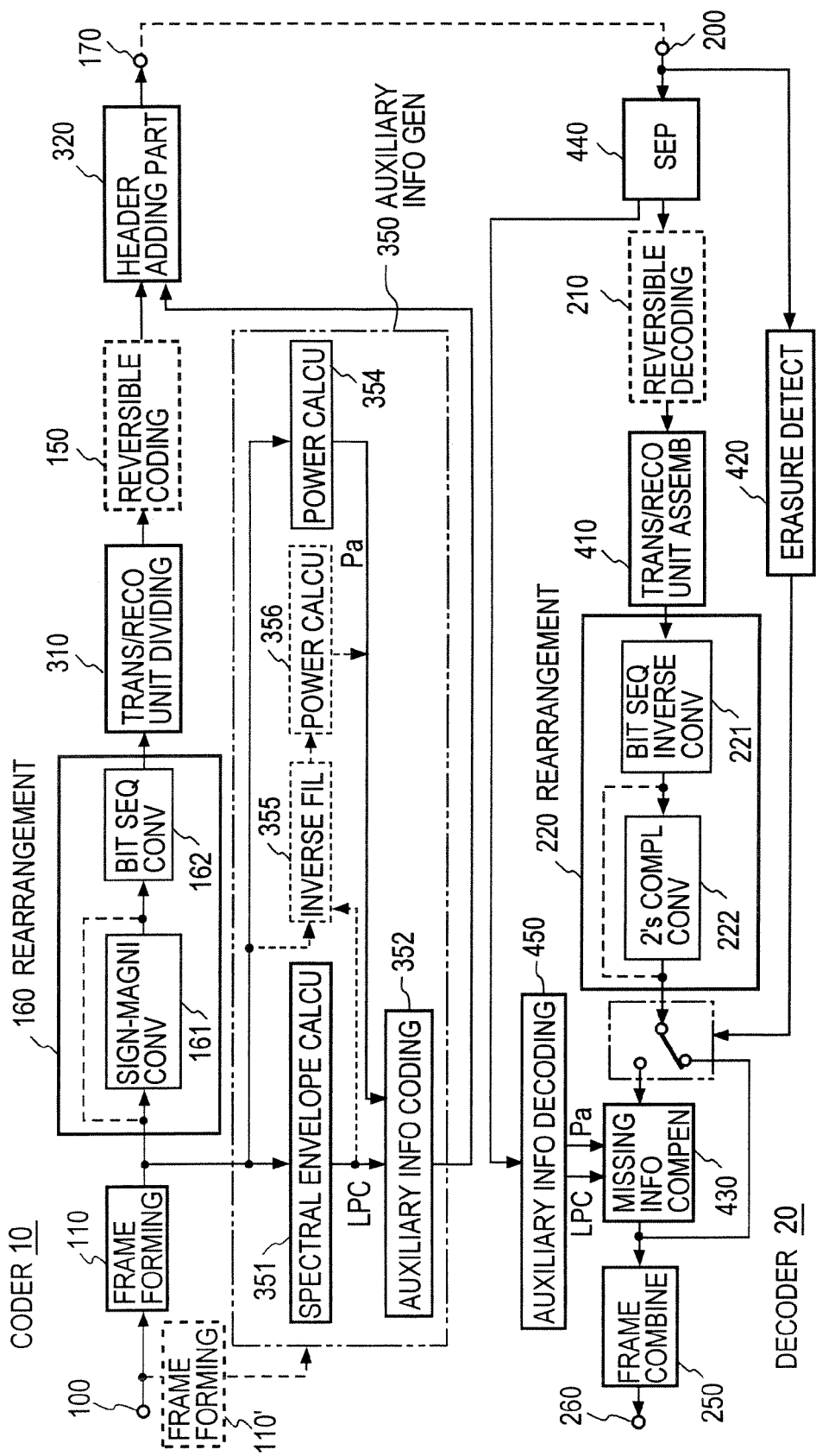
FIG. 6 is a block diagram illustrating functional configurations of a coder and a decoder according to Embodiment 2 of the present invention.

FIG. 6 illustrates in block form a second embodiment of the present invention. In the coder 10 the input signal sample sequence separated for each frame in the frame forming part 110 is provided to an auxiliary information generating part 350. The auxiliary information generating part 350 comprises a spectral envelope calculating part 351, a power calculating part 354 and an auxiliary information coding part 352. The input signal sample sequences separated in the frame forming part 110 for each frame are provided to the spectral envelope calculating part 351, wherein coefficients representing the spectral envelope are calculated, for example, as linear prediction coefficients LPC by linear predictive analysis, and in the power calculating part 354 the average power Pa of the input signal sample sequences for each frame is calculated.

Alternatively, the input signal sample sequences are input to an inverse filter 355 formed based on the linear prediction coefficients LPC, wherein their spectral envelopes are flattened, and the average power of the flattened signals is calculated in a power calculating part 356. The linear prediction coefficients LPC and the average power Pa are fed to the auxiliary information coding part 352, wherein they are encoded with low bits such as 30 to 50 bits to provide auxiliary information. The auxiliary information is provided to the header adding part 320, wherein it is added to a representative packet of each frame, for example, a packet containing the transmission/recording unit data including the sign bit; alternatively, it is output as an independent packet.

Incidentally, since an increase in the frame length will not cause an considerable change in the spectral envelope parameter calculated in the spectral envelope calculating part 351 nor will it produce a significant change in the amount of information of the spectral envelope coefficients encoded in the auxiliary information coding part 352, the digital input signal to be applied to the rearrangement part 160 is separated by a frame forming part 110' for a frame length longer than its frame length and then provided to the auxiliary information generating part 350 to enhance the efficiency of reversible compression as indicated by the broken lines in FIG. 6.

In the decoder 20, the packet input to the input terminal 200 is fed to a separation part 440, wherein it is separated into the transmission/recording unit data and the auxiliary information. The transmission/recording unit data is provided to the decoding part 210, and the auxiliary information is provided to an auxiliary information decoding part 450, which decodes the parameter representing the spectral envelope of the frame concerned. That is, the linear prediction coefficients LPC and the average power Pa, are provided to the missing information compensating part 430. The missing information compensating part 430 uses the spectral envelope coefficients LPC and the average power Pa to compensate for missing information as described previously in connection with Embodiment 1.

Alternatively, each potential combination of values as the missing information (bit) are added to each sample value to obtain candidates for a compensated sample sequence (waveform), then spectral envelopes of these candidates are calculated, and that one of the candidates for the compensated sample sequence (waveform) whose spectral envelope is the closest to the decoded spectral envelope of the auxiliary information is provided as a compensated sample sequence to the frame combining part 250. Incidentally, the reversible coding part 150 and the decoding part 210 in FIG. 6 may be omitted.

Compensation Based on Auxiliary Information

In the case of producing the candidates for the compensated sample sequence by use of each combination of possible values for the missing information, an increase in the amount of missing information (bit) causes a considerable increase in the number of candidates, giving rise to a problem that is computational complexity. A description will be given below of the 10 processing by the missing information compensating part 430 and its functional configuration that will overcome such a problem.

Figure 7:
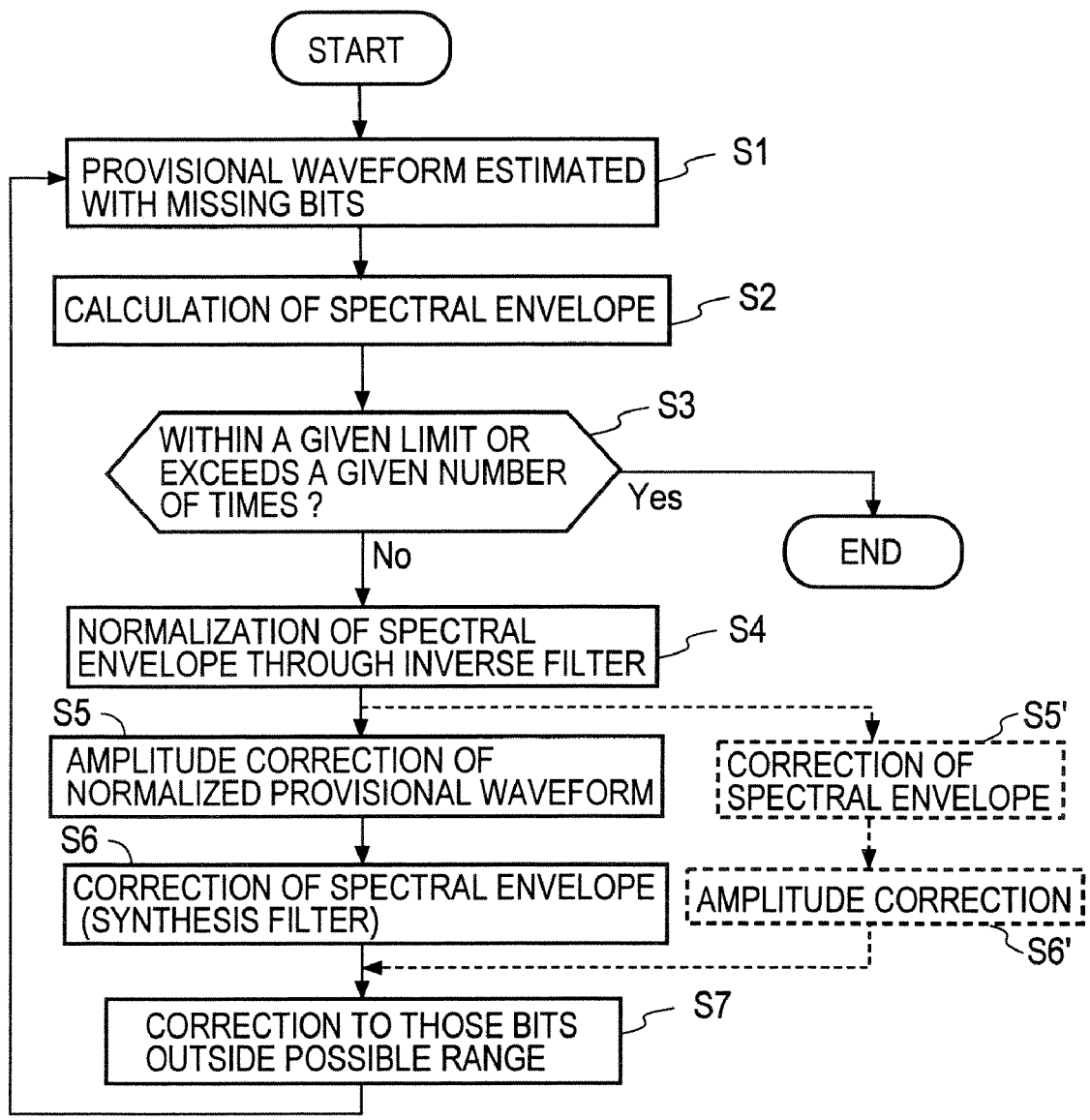
FIG. 7 is a flowchart showing an example of a procedure by the missing information compensating part 430 in the case of using auxiliary information.
Figure 8:
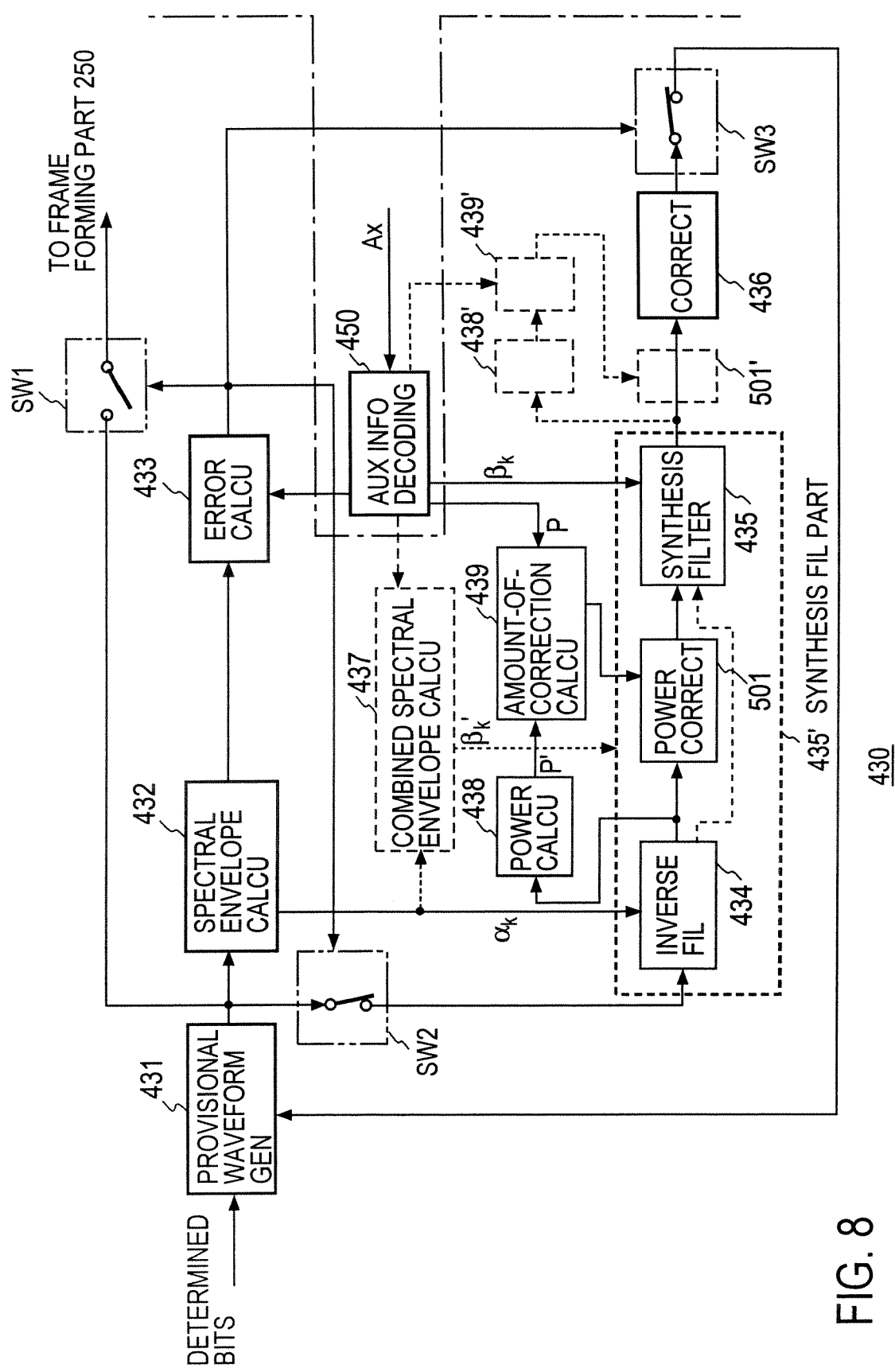
FIG. 8 is a block diagram corresponding to FIG. 7, depicting an example of the functional configuration of the missing information compensating part 430.

FIG. 7 depicts an example of the procedure to be followed and FIG. 8 an example of the functional configuration of the missing information compensating part. In the first place, only determined bits input to a provisional waveform generating part 431 from the rearrangement part 220 are used to reconstruct a provisional waveform (a provisional sample sequence) in the frame (S1). The provisional waveform is generated with the missing bit fixedly set to, for example, 0 or an intermediate value of the missing bit between the maximum and the minimum. For example, if low-order four bits are missing, their values are any one of 0 to 15; provisionally, it is set to 8 or 7.

Next, the spectral envelope coefficients of the provisional waveform are calculated in a spectral envelope calculating part 432 (S2). The spectral envelope coefficients can be estimated by subjecting the provisional waveform to an all-pole-type linear predictive coding analysis used in speech analysis, for instance. On the other hand, received auxiliary information Ax is decoded in the auxiliary information decoding part 450 to provide the spectral envelope coefficients of the original sound, and in an error calculating part 433 the spectral envelope coefficients of the original sound are compared with the spectral envelope coefficients of the provisional waveform, and if the error between them is within a given range the provisional waveform is provided as a corrected output waveform signal to the frame combining part 250 via a switch SW1 (S3).

In step S3, if the error between the estimated spectral envelope coefficients and the decoded spectral envelope coefficients are not within a given range, an inverse characteristic of the spectral envelope coefficients of the estimated provisional waveform are given to the provisional waveform (S4). More specifically, the spectrum of the provisional waveform is flattened by applying it via a switch SW2 to, for example, an inverse filter (all-zero) 434 of, for example, a set of all-pole-type linear prediction coefficients by use of the linear prediction coefficients representing the spectral envelope coefficients of the provisional waveform calculated in step S2.

Next, the average power of such spectrum-flattened waveform signals is calculated in a power calculating part 438, and in an amount-of-correction calculating part 439 the average power and the decoded average power from in the auxiliary information decoding part 450 are used to calculate the amount of correction, for example, the ratio or difference between them, and the amount of correction is used to correct the amplitude of the flattened signal in a power correcting part 501. That is, the output from the inverse filter 434 is multiplied by or added with the amount of correction to make its power equal to the decoded power (S5). Next, the amplitude-corrected flattened signal is multiplied by the spectral envelope coefficients of the auxiliary information to generate a provisional waveform having its spectral envelope coefficients corrected (S6). That is, the output from the power correcting part 501 is applied to an all-pole-type synthesis filter 435 using the parameter LPC representing the spectral envelope of the auxiliary information to produce a spectrum-corrected waveform. The spectral envelope of this waveform is close to that of the original sound.

However, the amplitude value of the spectrum-corrected waveform is corrected to a correct value in a correcting part 436 since there is a possibility that the amplitude value contains a bit contradictory to the determined bit in the amplitude value of the waveform with bit erasure (S7). For example, when lower-order four bits of a 16-bit amplitude value are unclear or missing, since an uncertainty width of values that each sample can take is 16, the amplitude value is corrected to that one of the values which is the closest to the spectrum-corrected waveform. That is, when the amplitude value falls outside the range, (XXXXXXXXXXXX0000~XXXXXXXXXXXX1111), of values possible for the corrected sample value in each sample, the amplitude value is corrected to a limit value closest to the sample of the spectrum-corrected waveform within the possible range. As a result, determined bits of the amplitude value are all coincident with the those of the original sound, and the spectral envelope also becomes equal to that of the original sound.

The corrected waveform can be returned, as the provisional waveform in step S1, via a switch SW3 to the provisional waveform generating part 431 to repeat step S2 et seq. Incidentally, it is presumed that the waveform (sample value) is an integer value, but in a filter calculation it is handles as a real number; hence, it is necessary that the filter output value be put in an integer. In the case of a synthesis filter, the result of conversion differs depending on the waveform is converted for each sample or for each frame, but the both methods can be used.

The broken lines in FIGS. 7 and 8 show a modification of the above procedure. That is, after the provisional waveform is flattened in step S4, the flattened waveform (flattened signal) is applied to the synthesis filter 435 to obtain a spectral-waveform-corrected reconstructed sample sequence (waveform) (S5'), and the spectral-envelope-corrected waveform is amplitude-corrected in a power correcting part 501' (S6'), after which the procedure goes to step S7. In this instance, the average power of the spectral-envelope-corrected waveform from the synthesis filter 435 is calculated in a power calculating part 438', and in an amount-of-correction calculating part 439' an amount of correction is calculated from the calculated average power and the decoded power of the auxiliary information (from the power calculating part 356 in the coder 10), and in a power correcting part 501' the obtained amount of correction is used to correct the amplitude of the output from the synthesis filter 435.

Figure 9:
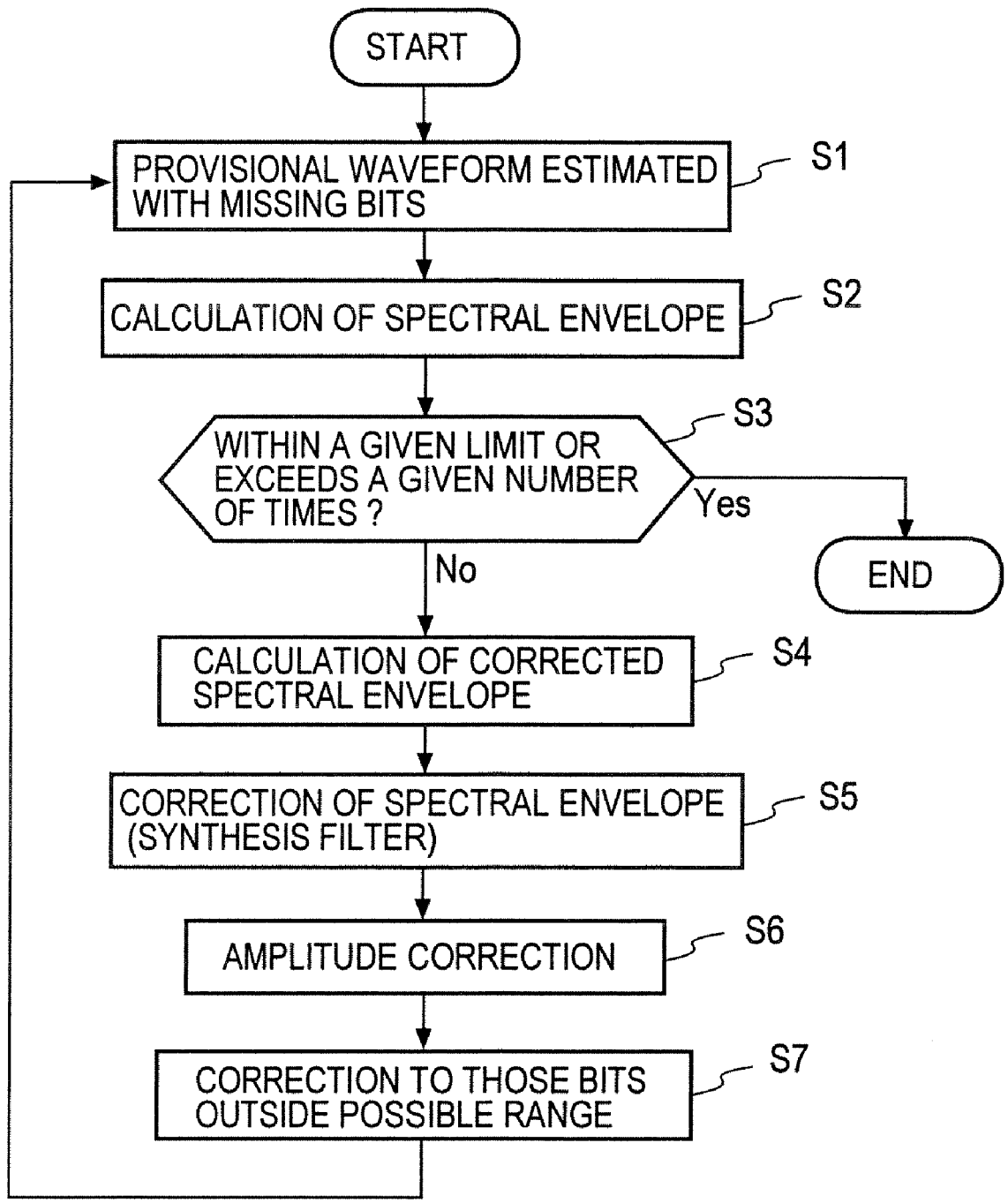
FIG. 9 is a flowchart showing another example of the procedure by the missing information compensating part 430 in the case of using auxiliary information.

Turning next to FIG. 9, a description will be given of another example of the missing information compensating procedure using auxiliary information.

Steps S1 to S3 and S6 are identical with steps S1 to S3 and S7 in FIG. 7. In this example, filter coefficients of a single synthesis filter part 438 are calculated (S4 in FIG. 9) which is an assembly of the inverse filter 434 of an inverse characteristic to the spectral envelope estimated in step S2 and the synthesis filter 435 using the linear prediction coefficients LPC representing the spectral envelope in the auxiliary information. In step S5 the provisional waveform is applied to the synthesis filter 438 to synthesize a corrected waveform. The corrected spectral envelope waveform is amplitude corrected (S6). This amplitude correction is made by the power calculating part 438', the amount-of-correction calculating part 439' and the power correcting part 501' indicated by the broken lines in FIG. 8.

The functional configuration for the FIG. 9 is indicated by the broken lines in FIG. 8. That is, the filter coefficients of the synthesis filter 438 are calculated in a composite spectral envelope calculating part 437 from the estimated spectral envelope parameter from the spectral envelope calculating part 432 and the decoded spectral envelope coefficients from the auxiliary information decoding part 450. The calculated filter coefficients are set in the synthesis filter part 438, to which the provisional waveform is provided. The output from the synthesis filter part 438 is amplitude corrected in the power correcting part 501'.

The calculation of the filter coefficients of the synthesis filter part 438 may be conducted, for example, as described previously in connection with FIG. 10. The linear prediction coefficients as the spectral envelope coefficients of the provisional waveform are converted by the coefficient converting part 437a to the linear prediction cepstrum coefficients Ca, and the linear prediction coefficients obtained as the decoded spectral envelope coefficients of the auxiliary information are converted by the coefficient converting part 437b to the linear prediction cepstrum coefficients Cb. These coefficients Ca and Cb are applied to the subtracting part 437c to obtain the differences Cb−Ca, which is inversely converted by the inverse conversion part 437d to the linear prediction coefficients, which are used as the filter coefficients of the synthesis filter 438. The conversion to the linear predictive coefficients can be done using, for example, the method described in Japanese Patent Application Laid-Open Gazette No. 248996/96 entitle "Method for Determining Filter Coefficients of Digital Filter."

The procedure of FIG. 9 necessitates the calculation by the synthesis spectral envelope calculating part 437 but involves only one filtering calculation of the provisional waveform. The correction processing in FIGS. 7 and 9 may also be performed in the frequency domain.

Figure 10:
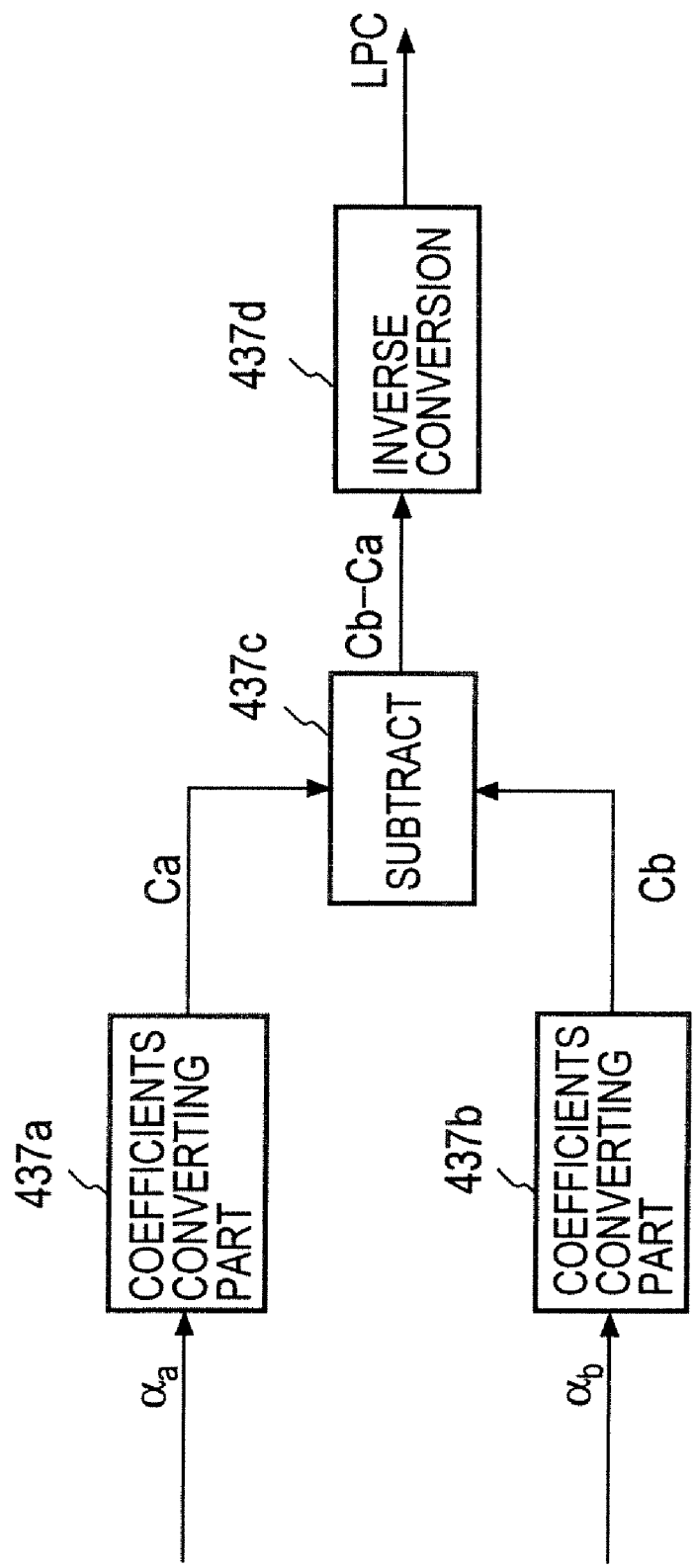
FIG. 10 is a block diagram illustrating the functional configuration of a concrete example of a composite spectral envelope calculating part 437.

The spectrum correction based on LPC decode from the auxiliary information in steps S6 (or S5') and S5 in the loop of each of the flowcharts of FIGS. 7 and 9 is indented to reduce the spectral distortion between the original sound and the reconstructed signal—this reduces the amount of correction and hence prevents divergence of the corrected waveform. This can be done in the examples of FIGS. 7 and 9 by multiplying both of linear prediction coefficients $\alpha_k$ of the inverse filter 434 and linear prediction coefficients $\beta_k$ and $\beta_k'$ of the synthesis filters 435 and 438 by a k-th power ($\gamma^k$) of a constant $\gamma$ equal to or smaller than 1 (k being the order of the parameter). In the example of FIG. 10 the linear prediction cepstrum coefficients Ca and Cb need only to be multiplied by a constant equal to or smaller than 1. In the repetitive process in FIGS. 7 and 9, too, it is also possible to set the constant $\gamma$ to a value close to a at the beginning of the repetition and gradually reduce the value of the constant $\gamma$ as convergence proceeds, thereby decreasing the estimation error.

Incidentally, the multiplication of the coefficients $\alpha_k$, $\beta_k$ and $\beta_k'$ by $\gamma^k$ and the multiplication of the linear predictive cepstrum coefficients by the constant equal to or smaller than 1 are equivalent to a multiplication by predictive coefficients with the band of the spectral envelope characteristics enlarged, making the spectral envelope of the provisional waveform (sample sequence) and the decoded spectral envelope of the auxiliary information dull or less sharp.

In FIGS. 7 and 9, step S3 can be omitted, in which case steps S1, S2, S4, S5 (S5'), S6 (S6') and S7 are performed only once or repeated a predetermined number of times to output the corrected waveform (sample sequence). Further, as shown in FIGS. 7 and 9, when the number of times step S3 is carried out exceeds a predetermined value, the corrected waveform obtained finally at that time may be output.

Embodiment 3

Figure 11:
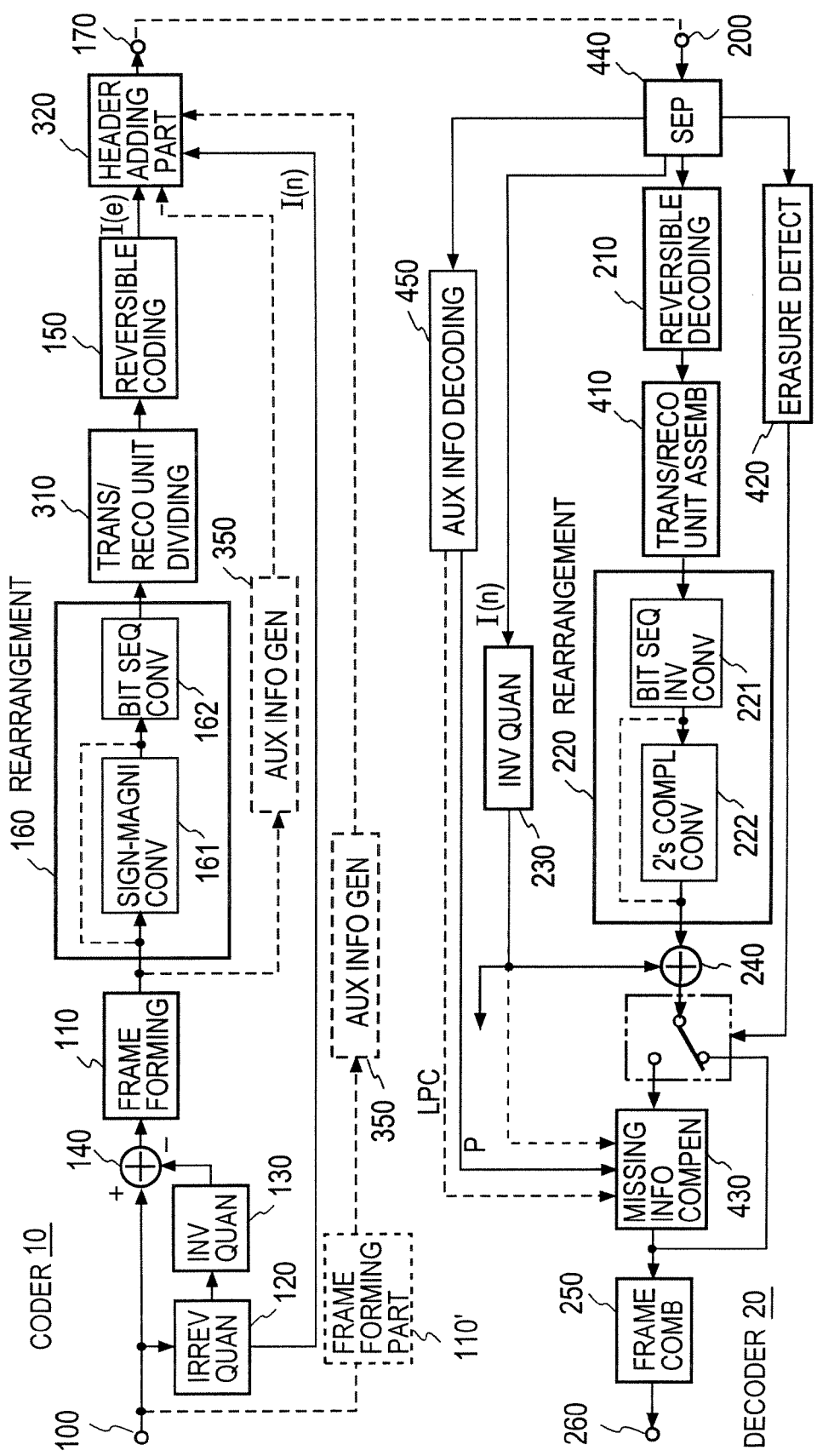
FIG. 11 is a block diagram illustrating a coder and a decoder according to Embodiment 3 of the present invention.

FIG. 11 illustrates in block form a third embodiment of the present invention applied to the coding scheme that is a combination of the high-compression-ratio irreversible coding described previously with reference to the FIG. 1 prior art example and the reversible compression of the error signal between the reconstructed signal and the original signal. As is the case with the FIG. 1 prior art example, in the coder 10 the digital input signal sequence from the input terminal 100 is irreversibly quantized in the high-compression-ratio irreversible quantization part 120, then the quantized information is inversely quantized (that is, decoded) in the inverse quantization part 130, then the difference between the inversely quantized signal (reconstructed signal) and the original digital input signal sequence from the input terminal 100 is calculated in the subtraction part 140, and the error signal that is the difference signal is applied to the frame forming part 110. That is, as described previously, the error signal for each frame is subjected to the rearrangement of its bit sequences and the separation to the transmission/recording unit data, and the transmission/recording unit data is reversibly compressed and is added with the header 31 in the header adding part 320 to form a packet.

The quantized code I(n) from the irreversible quantization part 120 is also fed to the header adding part 320, wherein it is added with the header 31 to form a packet. At this time, the highest priority level is assigned to the bit sequence of this quantized code. Further, as indicated by the broken lines in FIG. 11, for the error signal or sample sequence, a parameter representing the spectral envelope of the original input signal sample sequence and its average power are generated as auxiliary information in the auxiliary information generating part 350, and the auxiliary information is sent out as an independent packet or after being stored in a packet with high priority level.

In this embodiment, the decoder 20 performs correction after synthesizing the original sound, that is, after reconstructing the original sound signal waveform by adding together in the adder 240 the original sound signal waveform reconstructed by inverse quantization and the error signal waveform. In a separation part 440 the irreversibly quantized code I(n), the auxiliary information and the transmission/recording unit data are separated from the packet input to the input terminal 200. The irreversibly quantized code I(n) is inversely quantized in an inverse quantization part 230. The auxiliary information is decoded in the auxiliary information decoding part 450, and the decoded parameter representing the spectral envelope and the average power are provided to the missing information compensating part 430. On the other hand, the pieces of transmission/recording unit data are reversibly decoded, assembled together and rearranged in a sequential order as described previously, by which the vertical bit sequence, that is, the error signal samples sequence is reconstructed, and the reconstructed error signal and the inversely quantized signal from the inverse quantization part 230 are added together in the adding part 240. The added signal is applied to the missing information compensating part 430 when a packet erasure is detected in erasure detecting part 420.

The missing information compensating part 430 may use any of the above-mentioned compensating schemes. In the case of using the decoded parameter representing the spectral envelope of the auxiliary information, the parameter representing the corresponding spectral envelope, if available in the inverse quantization part 230, can be used. Alternatively, as indicated by the broken lines in FIG. 11, in the coder 10 the auxiliary information is generated in the auxiliary information generating part 350 from the output error signal from the frame forming part 110 or from the input signal separated frame-wise by the frame forming part 110' and input via the input terminal 100, and the auxiliary information is added to any one of packets, or output as an independent packet. In the decoder 20, the auxiliary information is separated in the separation part 440, and the auxiliary information is decoded in the auxiliary information decoding part 450, from which the decoded information is fed to the missing information compensating part 430.

Figure 12:
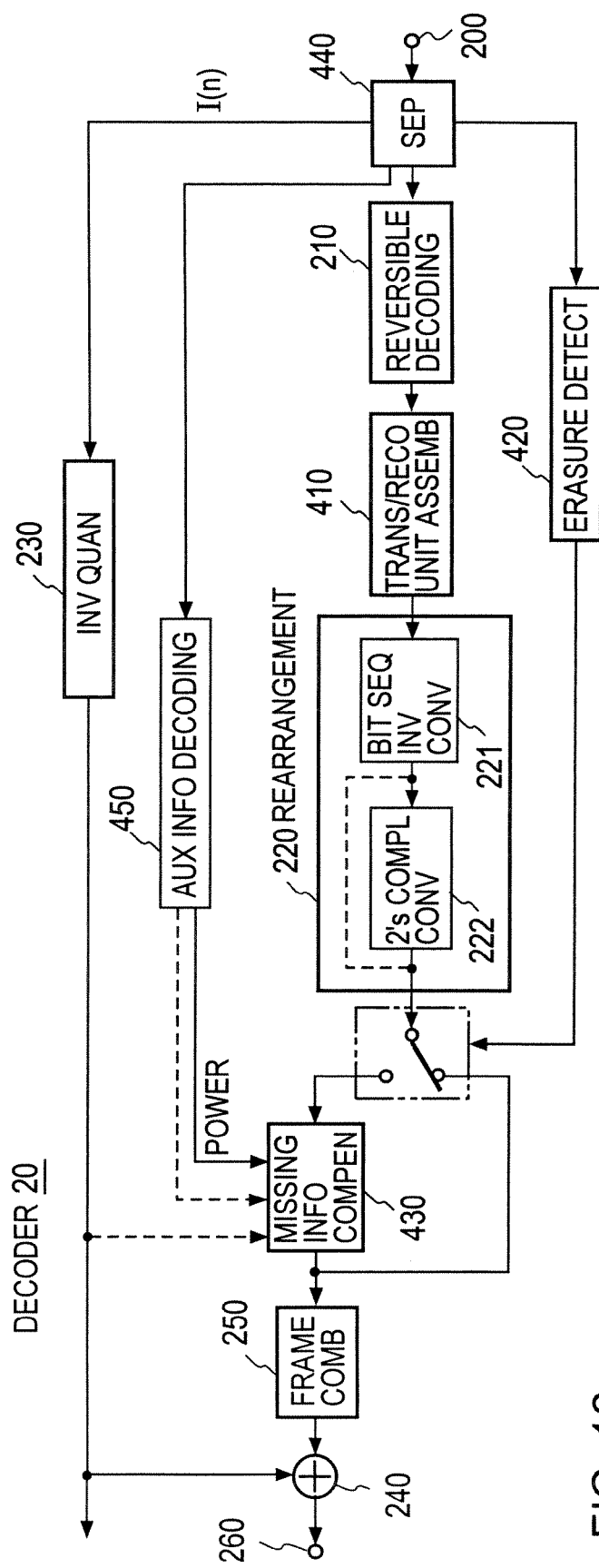
FIG. 12 is a block diagram illustrating a modified form of the decoder according to Embodiment 3.

As described above, in the case of using the irreversibly quantized code and the error signal, the error signal prior to the synthesis of the original sound may be compensated for missing information in the decoder 20. That is, for example, as shown in FIG. 12, in the case of a packet erasure, the rearranged output from the rearrangement part 220 is provided to the missing information compensating part 430, wherein it is compensated for missing information, and the compensated output is applied to the frame combining part 250. For the compensation in the missing information compensating part 430 any one of the afore-mentioned schemes can be used. In the case of using the spectral envelope of the auxiliary information, the output from the auxiliary information decoding part 450 is used; alternatively, a parameter representing the corresponding spectral envelope, if available in the inverse quantization part 230, may also be used. The reconstructed error signal from the frame combining part 250 and the inversely quantized signal from the inverse quantization part 230 are added together in the addition part 240 to reconstruct the original sound signal.

Also in the examples of FIGS. 11 and 12, the average power need not always be used as the auxiliary information.

As depicted in FIG. 11, in case where the coder 10 separates the error signal in the frame forming part 110 for each frame, the compression efficiency in the reversible coding part 150 can be enhanced by setting the separation frame in the frame forming part 110, for example, approximately 16 times longer than the frame (for example, 1024 samples) of quantization processing in the irreversible quantization part 120. However, the separation frame length in the frame forming part 110 causes a decoding delay.

In the embodiments of FIGS. 6 and 11, the rearrangement part 160 need not always be provided with the sign-absolute value conversion part 160. In other words, the bit sequences in a format of the 2's complement can be rearranged. This may decrease the coding efficiency but is effective in case where only the amplitude resolution (scalability of amplitude precision) is more important than the compression ratio.

In the examples of FIGS. 11 and 12, the output from the inverse quantization part 230 as well as the output signal from the terminal 260 may be used as the reconstructed signal in response to the request for fidelity of the reconstructed signal.

In the above-described examples, the coder 10 and the decoder 20 can also be implemented by executing a coding program and a decoding program on a computer. In such cases, the programs are downloaded to a program memory of the computer from a CD-ROM or flexible magnetic disk or via a communication line.

Figure 13A:
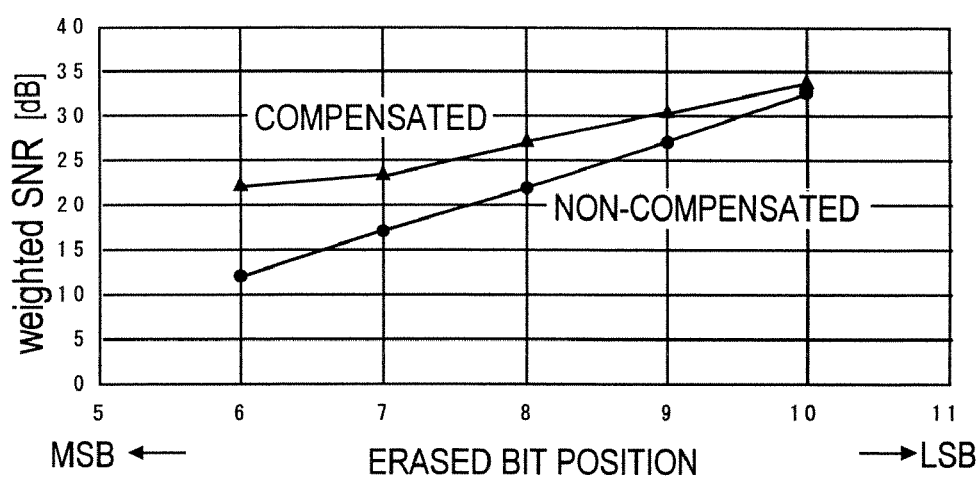
FIG. 13A is a graph showing SNR of a decoded signal according to computer simulation for explaining the effect of the present invention.
Figure 13B:
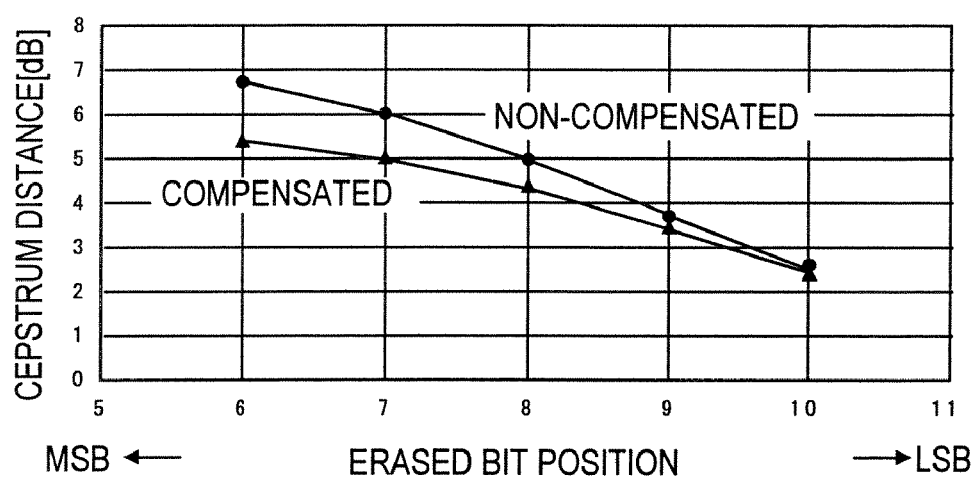
FIG. 13B is a graph showing cepstrum distance between a decoded signal and an original signal according to computer simulation for explaining the effect of the present invention.

To demonstrate the effect of the present invention, computer simulations on the third embodiment (coding in FIG. 11 and decoding in FIG. 12) were performed. The number of digits of the sample value of the error signal (including a sign signal) was set to 16; sixth to tenth bits dropped out; the error signal was compensated for being smoothed by a low-pass filter in the missing information compensating part 430; and psycho-acoustically corrected SNR (perceptually weighted SNR) of a decoded signal (at the output terminal 260) and the cepstrum distance (distortion of the spectral envelope) between the decoded signal and the original sound signal were calculated. The results of the computer simulations are shown in FIGS. 13A and 13B. For reference purposes, SNR and the cepstrum distance with no compensation for missing information are also shown. From FIGS. 13A and 13B it can be seen that in case of a 6-th bit erasure, the compensation for missing information according to the present invention performs a significant improvement in comparison to the prior art with no such erasure compensation.

Embodiment 4

Figure 14:
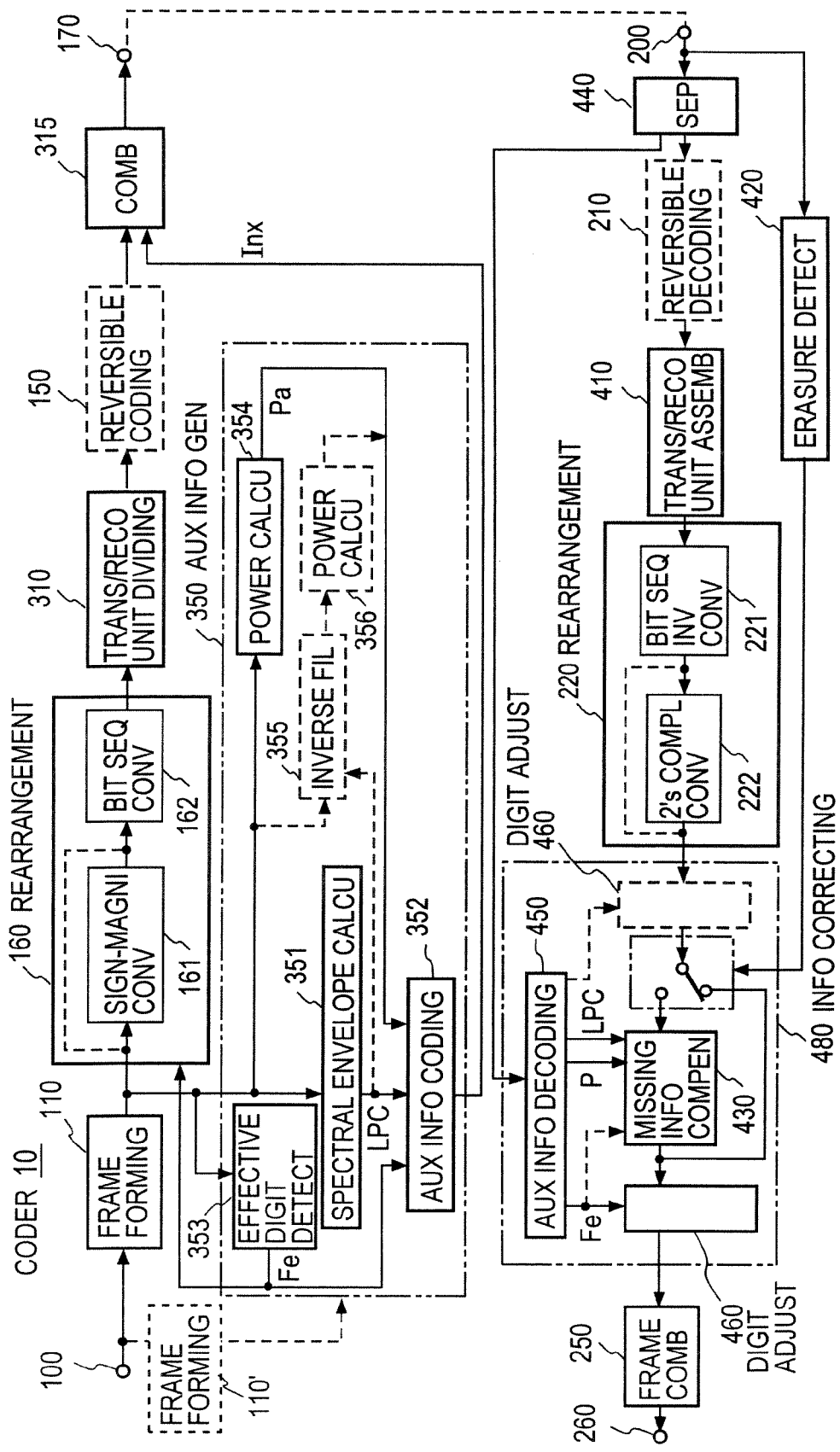
FIG. 14 is a block diagram illustrating a coder and a decoder according to Embodiment 4 of the present invention.

FIG. 14 illustrates the coder 10 and the decoder 20 according to another embodiment of the present invention. This embodiment is a modification of the auxiliary information generating part 350 in the FIG. 6 embodiment. As previously described, in the coder 10 the input signal sample sequence from the input terminal 100 is separated by the frame separation part 100 into frames each consisting of 1024 samples, for instance. In this embodiment, the number of digits representing the maximum one of absolute values of the input digital signals of the respective frames is detected as an effective digit number Fe in an effective digit-number detecting part 353 in the auxiliary information generating part 350.

For each frame separated in the frame forming part 110, the input signal sample sequences are rearranged in the rearrangement part 160. In this embodiment bits of the respective samples (amplitude bit sequences) within the portion corresponding to the effective digit number Fe are arranged in the temporal direction. In this case, the positive- or negative-integer amplitude of each input signal sample is in a format based on a 2's complement, but it is desirable that each sample in a format based on a 2's complement be converted to a binary number consisting of sign bit and absolute value in the sign-absolute value conversion part 161 as referred to previously with reference to the prior art example and that the corresponding bits (digits) of the respective samples (amplitude bit sequences) be rearranged in the bit sequence conversion part 162 to bit sequences (equi-position bit sequences) in which the corresponding bits are sequentially concatenated in a temporal order. As indicated by the broken lines in FIG. 14, however, the respective samples in a format of the 2's complement need not always be provided to the conversion part 161, but instead they may also be provided intact directly to the bit sequence conversion part 162 in which the samples of the digital signal are rearranged to bitstreams over samples with the corresponding bits concatenated in a temporal order.

Figure 15A:
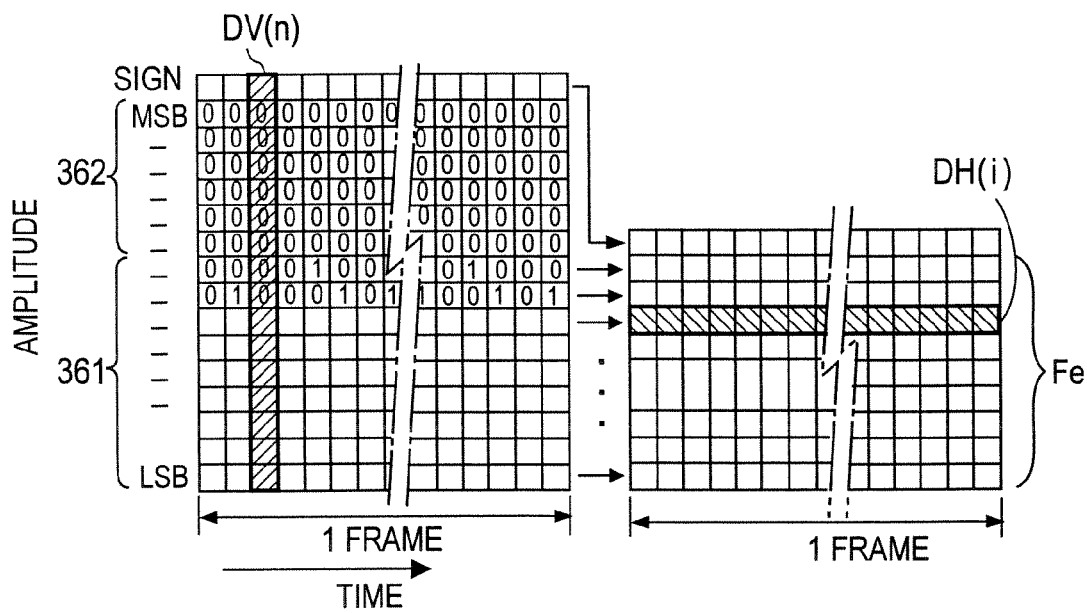
FIG. 15A is a diagram showing an example of processing by the rearrangement part 160.

That is, an ordinary input signal sample represents the positive or negative integer in a format of the 2's complement, but in this example the input signal sample is converted to a binary number consisting of sign bit and absolute value, which is further converted to a numerical value, and then the input signal sample is converted to an equi-position bit sequence (or a bitstreams), thereafter being separated into transmission/recording unit data in the transmission/recording unit dividing part 310. An example is shown in FIG. 15A. Respective samples in the sign-absolute-value format are sequentially arranged in a temporal order for each frame as indicated by the amplitude bit sequence on the left-hand side of FIG. 15A. For the sake of better understanding of one amplitude bit sequence, it is shown as a thick-lined amplitude bit sequence DV(n), where n represents time in one frame; for example, n=1, 2, . . . , 1024. In this example, the sign bit of each amplitude bit sequence DV(n) is placed right above MSB of the absolute value.

In this instance, that one of the digits closest to MSB in each of the amplitude bit sequences of one frame which is "1" is detected, and the number of digits from LSB to the digit "1" is obtained as the effective digit number Fe. The bits of the digital signals of one frame in the range 361 within the effective digit number Fe and the sign bits are converted to bit sequences. The bits at the digits in the range 362 from the digit higher-order than the effective digit number Fe to MSB are not converted to equi-position bit sequences.

In the first place, as depicted on the right side of FIG. 15A, only sign bits of the amplitude values of respective samples in this example are concatenated in a temporal order to produce a sequence (equi-position bit sequence) in the frame. Next, only those digits within the effective digit number Fe which correspond to the largest numerical value are concatenated in the frame to produce sequences (equi-position bit sequences). Similarly, corresponding bits at each of the subsequent digits are concatenated in a temporary order to form an equi-position bit sequence, and finally only LSBs are concatenated into an equi-position bit sequence. An example of these equi-position bit sequences is indicated by the thick-lined bit sequence DH(i) on the right-hand side of FIG. 15A, where i indicates the order of generation of each equi-position bit sequence. The above rearrangement does not ever change the contents of the data in the frame.

Figure 15B:
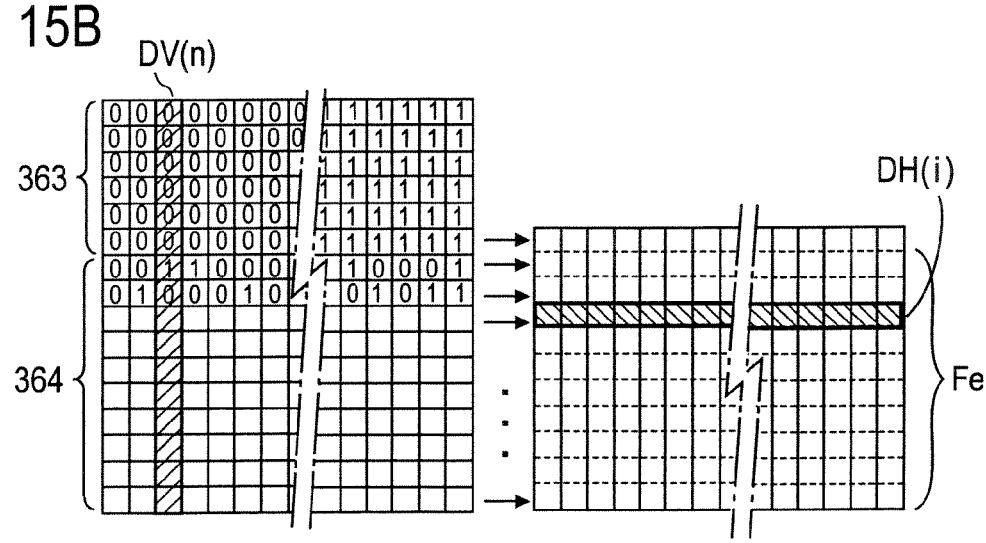
FIG. 15B is a diagram showing an example of processing of a 2's complement value by the rearrangement part 10.

Incidentally, when the digital signal represents the positive or negative integer in a format of the 2's complement, those digits higher-order than the digit representing the maximum one of the absolute values become all "0s" or all "1s" depending on whether the amplitude bit sequences are of positive or negative value as indicated by amplitude bit sequences of one frame in FIG. 15B and as shown in the range 364 in FIG. 15B. the number of digits in the other range 363 is detected as the effective digit number Fe. Only the bits in the range 364 and the bits (digits) adjacent to the range 364, only sign bits, are converted to equi-position bit sequences as indicated on the right side of FIG. 15B.

In the transmission/recording unit separation part 310, the output from the rearrangement part 160 is separated to pieces of transmission/recording unit data every equi-position bit sequence DH(i) or every plurality of adjacent equi-position bit sequences DH(i). In this instance, pieces of transmission/recording unit data each formed by one equi-position bit sequence and pieces of transmission/recording unit data each formed by plural equi-position bit sequences may be interleaved in the same frame.

The pieces of transmission/recording unit data thus separated are each provided to the header addition part 320, wherein the header 31 is added to the transmission/recording unit data (payload) 32 as shown in FIG. 4C, for instance.

In this embodiment, the auxiliary information generating part 350 comprises a spectral envelope calculating part 351, an auxiliary information coding part 352, an effective digit number detecting part 353 and a power calculating part 354. The effective digit number Fe detected by the effective digit number detecting part 353 in the input signal sample sequence from the frame forming part 110 is encoded in the auxiliary information coding part 352, thereafter being output. Alternatively, if each sample has an m-bit configuration, it is evident that m−Fe may be sent in encoded form in place of the effective digit number Fe. Further, in this example, the input signal sample sequence separated in the frame forming part 110 for each frame is provided to the spectral envelope calculating part 351, wherein linear prediction coefficients LPC are obtained by linear predictive coding analysis, for instance, as a parameter representing the spectral envelope, and in the power calculating part 354 the average power Pa of the frame is calculated. Alternatively, the sample sequence of the input signal is input to an inverse filter 355 formed based on the linear prediction coefficients LPC calculated in the spectral envelope calculating part 351, by which the spectral envelope is flattened, and the average power Pa of such flattened signals is calculated in the power calculating part 356.

The linear prediction coefficients LPC and the average power Pa are also encoded with low bits, about 30 to 50 bits, into auxiliary information in the auxiliary information coding part 340. The auxiliary information encoded from the effective digit number Fe, the spectral envelope parameters LPC and the average power Pa are provided to the header addition part 320, wherein they are added in a representative packet of each frame, for instance, a packet having stored therein the transmission/recording unit data including a sign bit, or it is output as an independent packet. Like the FIG. 6 embodiment, the auxiliary information such as the spectral envelope parameters LPC and the average power Pa can be obtained for an input signal frame separated in the frame forming part 110' using a frame length longer than that in the frame forming part 110 as indicated by the broken line, by which the efficiency of the reversible compression can be enhanced.

In the decoder 20, the packet 30 input to the input terminal 200 is separated by the separation part 440 into the transmission/recording unit data and the auxiliary information. The transmission/recording unit data is provided to the decoding part 210 (identical with that 210 in FIG. 1), and the auxiliary information is provided to the auxiliary information decoding part 450. The auxiliary information decoding part 450 decodes the effective digit number Fe, the spectral envelope parameters LPC and the average power Pa of the frame concerned, and provides the effective digit number Fe to a digit adjusting part 460 and the spectral envelope parameters LPC and the average power Pa to the missing information compensating part 430. The mission information compensating part 430, the auxiliary information decoding part 450 and the digit adjusting part 480 constitute an information compensating part 480.

When the transmission/recording unit data is reversibly compressed, it is reversibly decoded in the decoding part 210, and respective pieces of transmission/recording unit data are provided to a transmission/recording unit assembling part 410, wherein based on the packet numbers, they are assembled into one frame formed by plural packets, for example, such an equi-position bit sequence as shown on the right side of FIG. 15A. The assembled data is fed to the rearrangement part 220, wherein the equi-position bit sequences are converted to amplitude bit sequences, that is, to the signal sample sequences (waveform). In this case, when each sample is represented by an amplitude value in a sign-absolute binary format, the equi-position bit sequences are converted by the bit sequence conversion part 221 into amplitude bit sequences as depicted on the right side of FIG. 15B unlike the rearrangement described above with reference to FIG. 15A, and then in the 2's complement conversion part 222 each amplitude bit sequence from the bit sequence conversion part 221 is converted to the 2's complement format, that is, the amplitude bit sequence of the negative sign bit has its "1" and "0" exchanged.

Incidentally, when the transmission/recording unit data is based the equi-position bit sequence directly rearranged from the amplitude bit sequence in a format of the 2's complement, the amplitude bit sequence from the bit sequence conversion part 221 is provided intact to the digit adjusting part 400. The digit adjusting part 460 performs digit adjusting for each amplitude bit sequence according to the decoded effective digit number Fe. That is, in order that the number of the bits (the number of digits) of the amplitude bit sequence may become equal to that of the original signal samples, "0" or "1" is added to the high-order digit of the amplitude bit sequence, depending on whether the sign bit is positive or negative, that is, a bit in the range 363 in FIG. 15B, for instance, is added. The digit-adjusted amplitude bit sequence is provided as a decoded sample to the frame combining part 250.

When a packet erasure occurs, the packet number of the missing packet is detected by the erasure detecting part 420, and the amplitude bit sequence from the rearrangement part 220 is not directly provided to the digit adjusting part 460, but instead it is fed to the missing information compensating part 430, wherein the amplitude bit sequence (sample) is compensated for the missing information, and the amplitude bit sequence is supplied to the digit adjusting part 460.

The compensation in the missing information compensating part 430 is performed by estimating the missing information from known information. The missing information compensating part 430 compensates for the missing information so that the spectrum available from other information than the missing information of the frame concerned approaches an average spectrum of several preceding frames as in the embodiments described previously or a determined spectrum in a frame obtained as the result of decoding of the auxiliary information as referred to later on. A simple compensating method is to remove a noise component in the high-frequency region by the input reconstructed sample sequence to a low-pass filter in the missing information compensating part 430. The cut-off characteristic of the low-pass filter is chosen such that it attenuates the high-frequency component according to its characteristic if the spectral envelope of the original signal is known. Alternatively, the cut-off characteristic may adaptively be changed according to the average power or the shape of a spectrum determined for each frame.

Even if the bit rate is decreased by intentionally refraining from sending LSB side packets to the decoder 20, as required, with a view to reduction of the amount of information through utilization of the fact that the decoder 20 is capable of compensating for the information lost because of a packet erasure as described above, the decoder 20 is capable of implementing decoding or signal reconstruction free from the psycho-acoustical problem.

It is also possible to use as an alternative to the above the method described below. All possible combinations of the missing information (bit) are added to each sample value to produce candidates for a compensated sample sequence (waveform), then the spectral envelopes of the candidates are calculated, and that one of the candidate for the compensated sample sequence (waveform) whose spectral envelope is the closest to the decoded spectral envelope of the auxiliary information is output as a compensated sample sequence to the digit adjusting part 460. Incidentally, the reversible coding part 150 and the decoding part 210 in FIG. 14 may be omitted.

Compensation Based on Auxiliary Information

In the case of producing the candidates for the compensated sample sequence by use of all possible combinations for the missing information, an increase in the amount of missing information (bit) causes a considerable increase in the number of candidates, giving rise to a problem such as an impractical computational complexity. An embodiment to implement the processing by means of the missing information compensating part 430 and its functional configuration is described below.

Figure 16:
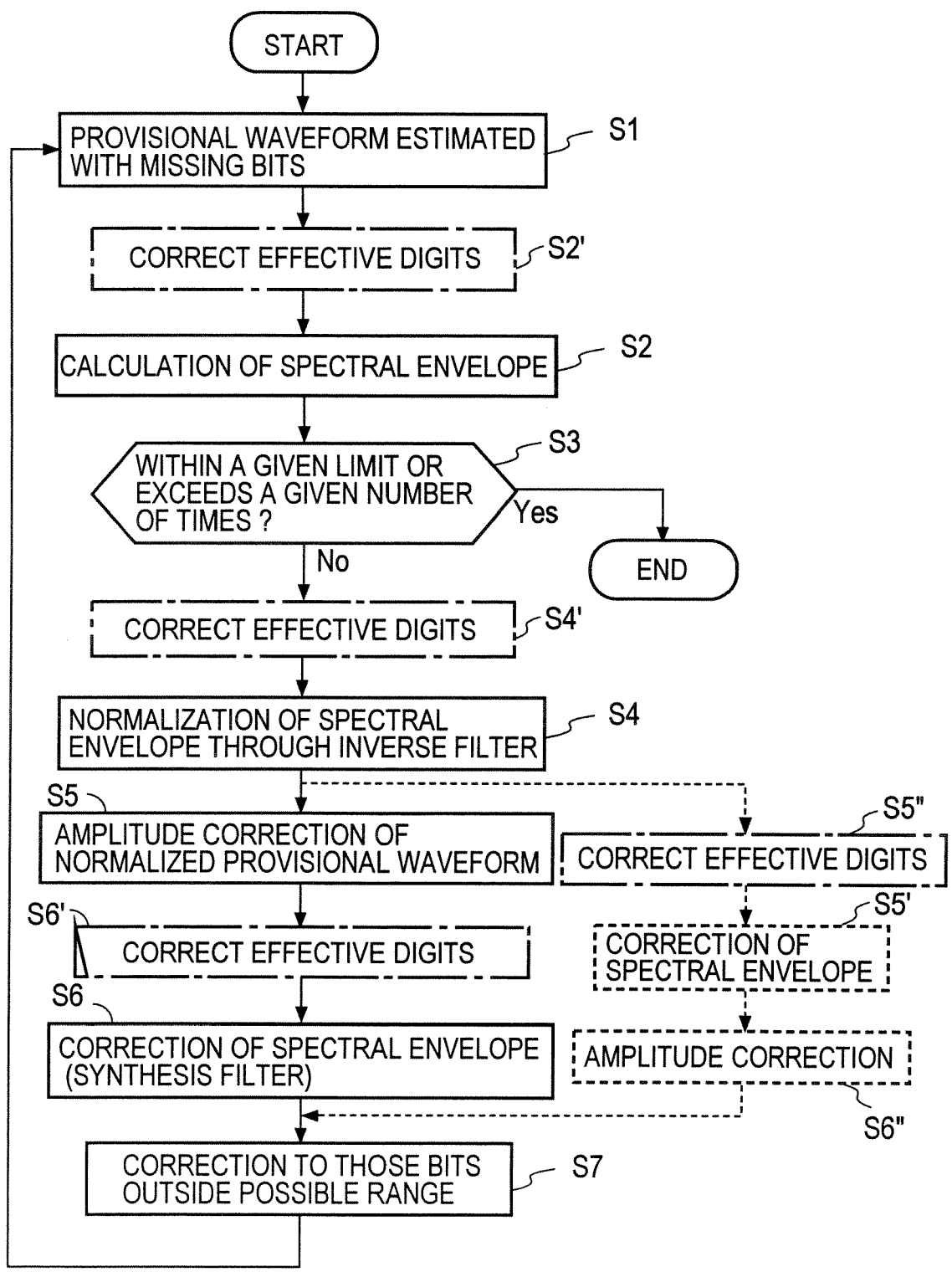
FIG. 16 is a flowchart showing another example of the procedure by the missing information compensating part 430 in the case of using auxiliary information.
Figure 17:
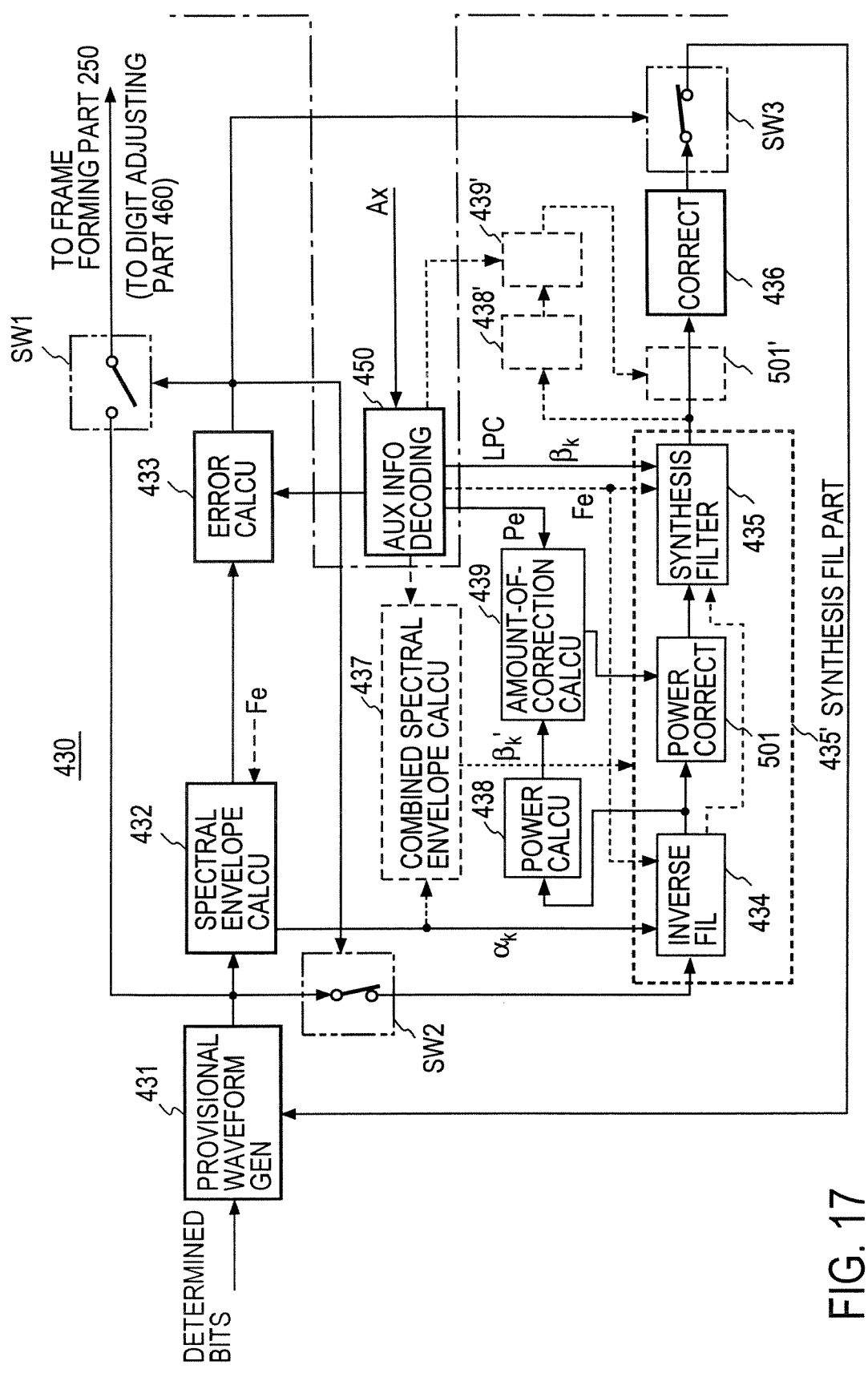
FIG. 17 is a block diagram corresponding to FIG. 16, illustrating an example of the functional configuration of the missing information compensating part 430.

FIG. 16 depicts an example of the procedure to be followed and FIG. 17 an example of the functional configuration of the missing information compensating part 430. Steps S1 to S6 are the same as steps S1 to S4, S6 and S7 in FIG. 7. In the first place, only determined bits input to the provisional waveform generating part 431 from the rearrangement part 220 are used to reconstruct a provisional waveform (a provisional sample sequence) in the frame (S1). The provisional waveform is reconstructed with the missing bit fixedly set to, for example, 0 or an intermediate value for a possible missing bit. For example, if low-order four bits are missing, their values are any one of 0 to 15; provisionally, it is set to 8 or 7.

Next, the spectral envelope of the provisional waveform is calculated in the spectral envelope calculating part 432 (S2). The spectral envelope coefficients can be analyzed by subjecting the provisional waveform to an all-pole-type linear predictive coding analysis that is used in speech analysis, for instance. On the other hand, received auxiliary information Ax is decoded in the auxiliary information decoding part 450 to provide the spectral envelope coefficients of the original sound, and in an error calculating part 433 the spectral envelope coefficients of the original sound are compared with the spectral envelope coefficients of the provisional waveform, and if the error between them is smaller than a predetermined value Δd, the provisional waveform is provided as a corrected output waveform signal to the frame combining part 250 (S3).

In step S3, if the error between the estimated spectral envelope coefficients and the decoded spectral envelope coefficients is not smaller than the predetermined value Δd, an inverse characteristic of the spectral envelope coefficients of the estimated provisional waveform is given to the provisional waveform (S4). More specifically, coefficients representing the spectral envelope of the provisional waveform obtained in step S2 are set in, for example, an all-pole-type (all-zero-type) linear prediction inverse filter 434, and the provisional waveform is applied to the inverse filter 434 to flatten the spectrum of the provisional waveform to obtain a flattened signal. The average power of such a flattened signal is calculated in the power calculating part 438. In an amount-of-correction calculating part 439 an amount of correction is calculated from the average power and the decoded average power (the output from the power calculating part 438) from the auxiliary information decoding part 450 to detect the ratio or difference between them. Based on the calculated amount of correction, the power correcting part 501 corrects the amplitude of the output from the inverse filter 434 that is, multiples or adds the output from the inverse filter 434 by or with the amount of correction so that the power of the provisional waveform equals to the decoded power (S5).

Next, the characteristics of the spectral envelope of the auxiliary information is imparted to the amplitude-corrected flattened signal to correct its spectral envelope (S6). The output from the power correcting part 501 is applied to an all-pole-type synthesis filter 435 using the parameters LPC representing the spectral envelope of the auxiliary information to produce a spectrum-corrected waveform. The spectral envelope of this waveform is close to that of the original sound.

However, since there is a possibility that the spectrum-correct waveform is contradictory to already determined bits in the amplitude bit sequence, it is corrected to a correct value in the correcting part 436 (S7).

Step S2 and the subsequent steps can be repeated using the corrected waveform as the provisional waveform in step S1. When the decoded effect digit number Fe differs with frames, the samples can be processed by the linear prediction coding analysis in the spectral envelope calculating part 432 (step S2), by the inverse filter 434 (step S4) and by the synthesis filter 435 (step S6) span the current and preceding frames. In this instance, even during the current frame processing, it is necessary that the effective digit number Fe of the immediately preceding frame be made equal to the effective digit number Fe of the current frame prior to the analysis or filtering. When the effective digit number Fe of the immediately preceding frame is smaller than the effective digit number Fe of the current frame by N digits, the sample of the immediately preceding frame is shifted N digits to the low-order side to reduce the amplitude value, with the effective digit number equal to that of the current frame. Conversely, when the effective digit number of the immediately preceding frame is larger than the effective digit number of the current frame by M digits, the sample of the immediately preceding frame is temporarily upward shifted by M digits. For example, in the floating-point representation to increase the amplitude value, with the effective digit number equal to that of the current frame. When the amount of information lost by a register overflow due to the high-order shift is large, the accuracy of the amplitude value of the sample of the immediately preceding frame is impaired, so that the sample with the degradation is not used or the sample of the current frame need not always be corrected.

As indicated by the broken lines in FIG. 16, when such a correction of the effective digit number is necessary for the analysis in step S2, the above-described correction of the effective digit number is made (S2') prior to step S2. When it is necessary for the inverse filtering in step S4, the effective digit number is corrected (S4') prior to step S4. In case of the synthesis filtering in step S6, the effective digit number is corrected (S6') prior to step S6. In FIG. 17, when the spectral envelope calculating part 432, the inverse filter 434 and the synthesis filter 435 require the sample of the preceding frame, the reconstructed effective digit number Fe is also provided to any of them from the auxiliary information decoding part 450 as indicated by the broken lines so that they perform their processing after making the effective digit number of the sample of the preceding frame equal to the effective digit number of the current frame.

The broken lines in FIGS. 16 and 17 show a modification of the above procedure. After the provisional waveform is flattened in step S4, the flattened waveform (flattened signal) is applied to the synthesis filter 435 to obtain a spectral-envelope-corrected reconstructed sample sequence (waveform) (S5'), and the spectral-envelope-corrected waveform is amplitude-corrected in the power correcting part 501' (S6'), after which the procedure goes to step S7. In this instance, the average power of the spectral-envelope-corrected waveform from the synthesis filter 435 is calculated in the power calculating part 438', and in the amount-of-correction calculating part 439' an amount of correction is calculated from the calculated average power and the decoded power of the auxiliary information (from the auxiliary information decoding part 450), and in the power correcting part 501' the amount of correction obtained is used to correct the amplitude of the output from the synthesis filter 435. When the processing by the synthesis filter 435 in step S5' spans the immediately preceding and the current frame, the effective digit number is corrected in advance as indicated by step S5''.

Figure 18:
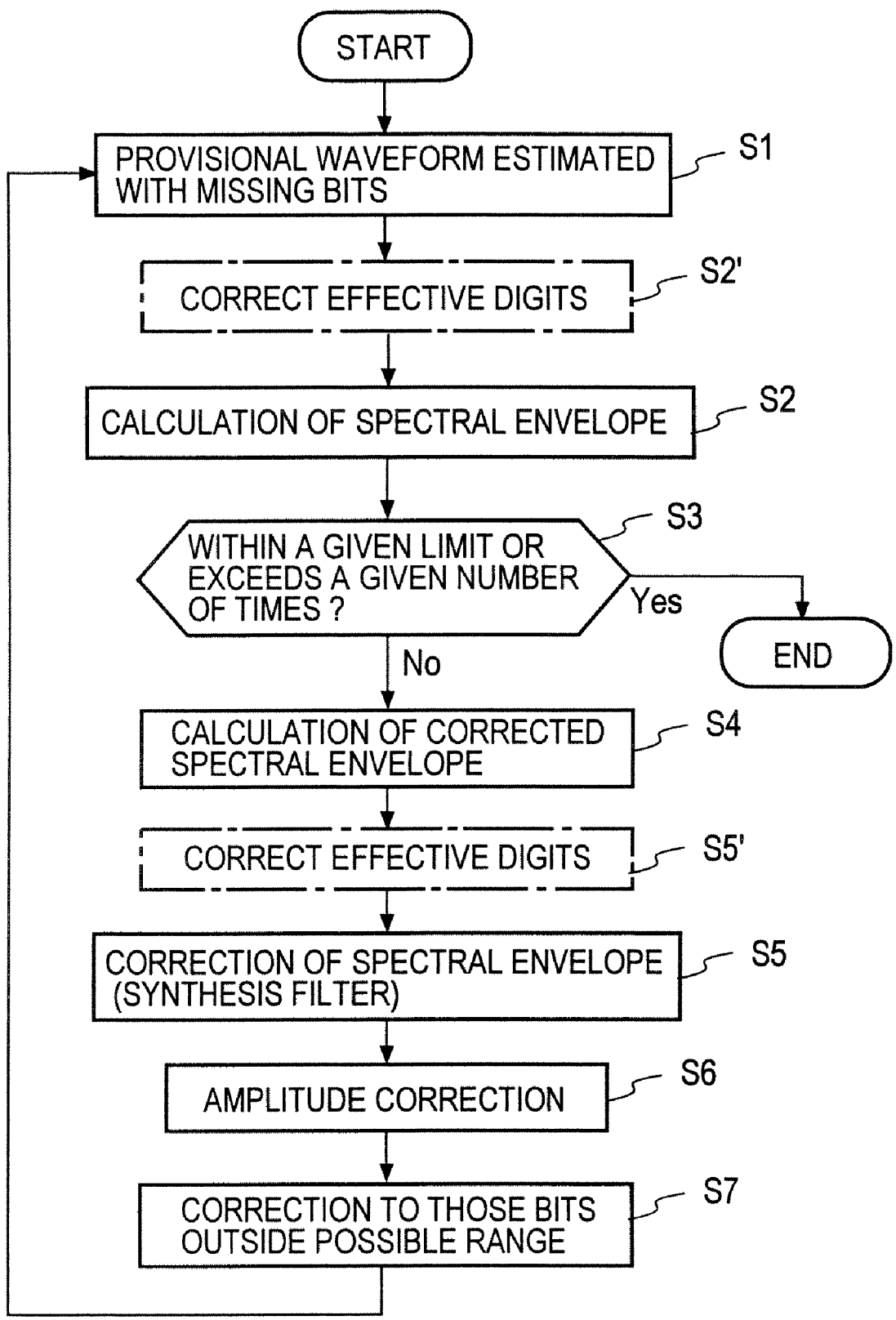
FIG. 18 is a flowchart showing another example of the procedure by the missing information compensating part 430 in the case of using auxiliary information.

Turning next to FIG. 18, a description will be given of another example of the missing information compensating procedure using compensating information. This missing information compensating processing is based on the same principles as those using the composite spectral envelope calculating part 437 and the synthesis filter part 435' in FIG. 8.

Steps S1 to S3 and S6 are identical with those S1 to S3 and S7 in FIG. 16. In this example, the filter coefficients of the synthesis filter part 438, which is an assembly of the inverse filters 434 using the spectral envelope parameter estimated in step S2 and the synthesis filter 435 using the spectral envelope parameter of the auxiliary information, are calculated in step S4 in FIG. 16. In step S5 the provisional waveform is applied to the synthesis filter 438 to synthesize a waveform of a corrected spectral envelope. The waveform of the corrected spectral envelope is amplitude corrected in the broken-lined power correcting part 501' (S6). This amplitude correction is made by the power calculating part 438', the amount-of-correction calculating part 439' and the power correcting part 501'. The filter coefficients of the synthesis filter 501' are calculated, for example, by the scheme described previously with reference to FIG. 10.

The procedure shown in FIG. 18 necessitates the calculation of the filter coefficients of the synthesis filter part 435' by the composite spectral envelope calculating part 437 but involves only one filter operation for the provisional waveform. The correction processing depicted in FIGS. 16 and 18 may also be carried out in the frequency domain.

When a previous sample is needed for the spectral envelope calculation in step S2 or for the spectral envelope correction in step S5 in FIG. 18, the afore-mentioned effective digit number correction is made prior to step S2 or S5 as indicated by the broken lines (S2' or S5').

In the loop in each of the flowcharts of FIGS. 16 and 18, the spectral envelope correction based on LPC decoded from the auxiliary information in step S6 (or S5') and S5 is intended to reduce spectrum distortion, and the correction in step S7 is to reduce waveform distortion of the reconstructed signal relative to the original sound. The repetition of this operation by the loop does not guarantee convergence of the waveform, but as described previously with respect to FIGS. 7B and 9, it prevents divergence of the reconstructed waveform through multiplication of linear prediction coefficients $\alpha_k$ of the inverse filter 434 and linear prediction coefficients $\beta_k$ and $\beta_k'$ of the synthesis filters 435 and 438 by the constant $\gamma^k$, where $\gamma$ is $0<\gamma<1$ and k is the order of the parameter.

In the example of FIG. 10 all of the linear prediction cepstrum coefficients Ca and Cb need only to be multiplied by a constant equal to or smaller than 1. In the repeating process in FIGS. 16 and 18, too, it is also possible to set the constant $\gamma$ to a value close to 1 at the beginning of the repetition and gradually reduce the value of the constant $\gamma$ as convergence proceeds, thereby decreasing the estimation error.

In FIGS. 16 and 18, step S3 may be omitted, in which case steps S1, S2, S4, S5 (S5'), S6 (S6') and S7 are performed only once or repeated a predetermined number of times to output the corrected waveform (sample sequence). Further, as shown, when the number of times step S3 is carried out exceeds a predetermined value, the corrected waveform obtained finally at that time may be output from the missing information compensating part 430.

The digit adjusting part 460 may be placed immediately behind the rearrangement part 220 as indicated by the broken line in FIG. 14. In this case, the afore-mentioned adjustment of the effective digit number in the missing information compensating pat 430 is unnecessary. Moreover, in the missing information compensation shown in FIGS. 16 and 18, the amplitude correction in steps S5, S6' and S6 may be omitted. In this instance, the associated parts 438', 439' and 501' are left out. In some cases, the missing information compensation using the decoded spectral envelope may be omitted and replaced with a different compensating scheme such as the afore-mentioned one that uses a low-pass filter, or makes correction to put the spectral envelope coefficients of the current frame into agreement with that of the preceding frame. In such case, the generation of the auxiliary information about the spectral envelope or the average power is omitted, and the configuration of the missing information compensating part 430 in the decoder 20 will be different from the FIG. 17 configuration.

Embodiment 5

Figure 19:
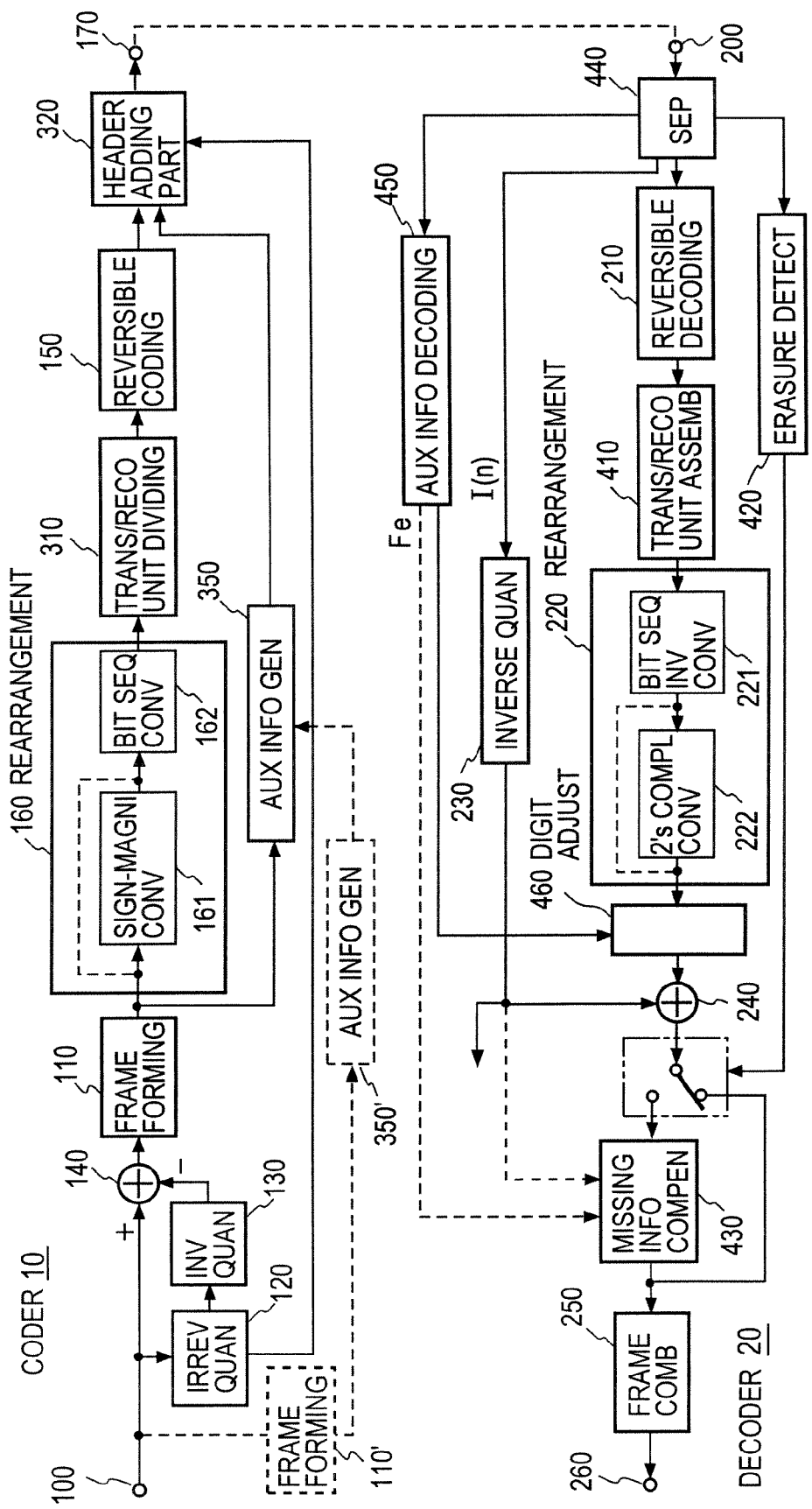
FIG. 19 is a block diagram illustrating a coder and a decoder according to Embodiment 5 of the present invention.

FIG. 19 illustrates in block form a fifth embodiment of the present invention in which the coding method, which rearranges the effective digits of the sample in each frame as described previously with reference to FIG. 14, is applied to the coding method that is a combination of the high-compression-ratio coding scheme described previously in respect of FIG. 1 and the scheme of reversible compression of the error signal between the reconstructed signal and the original signal. The coder 10 of this embodiment is identical in configuration with the coder 10 of the FIG. 11 embodiment except that the bit sequence conversion part 162 performs the rearrangement of the effective digits described in connection with FIG. 15A or 15B and that the auxiliary information generating part 350 is identical in construction with the auxiliary information generating part 350 in the FIG. 14 embodiment. The decoder 20 is also identical in configuration with the decoder 20 in the FIG. 11 embodiment except that the digit adjusting part 460 is provided at the output side of the rearrangement part 220 and the missing information compensating part 430 is that in the FIG. 14 embodiment and consequently in the FIG. 17 embodiment. Accordingly, no detailed description will be repeated.

Figure 20:
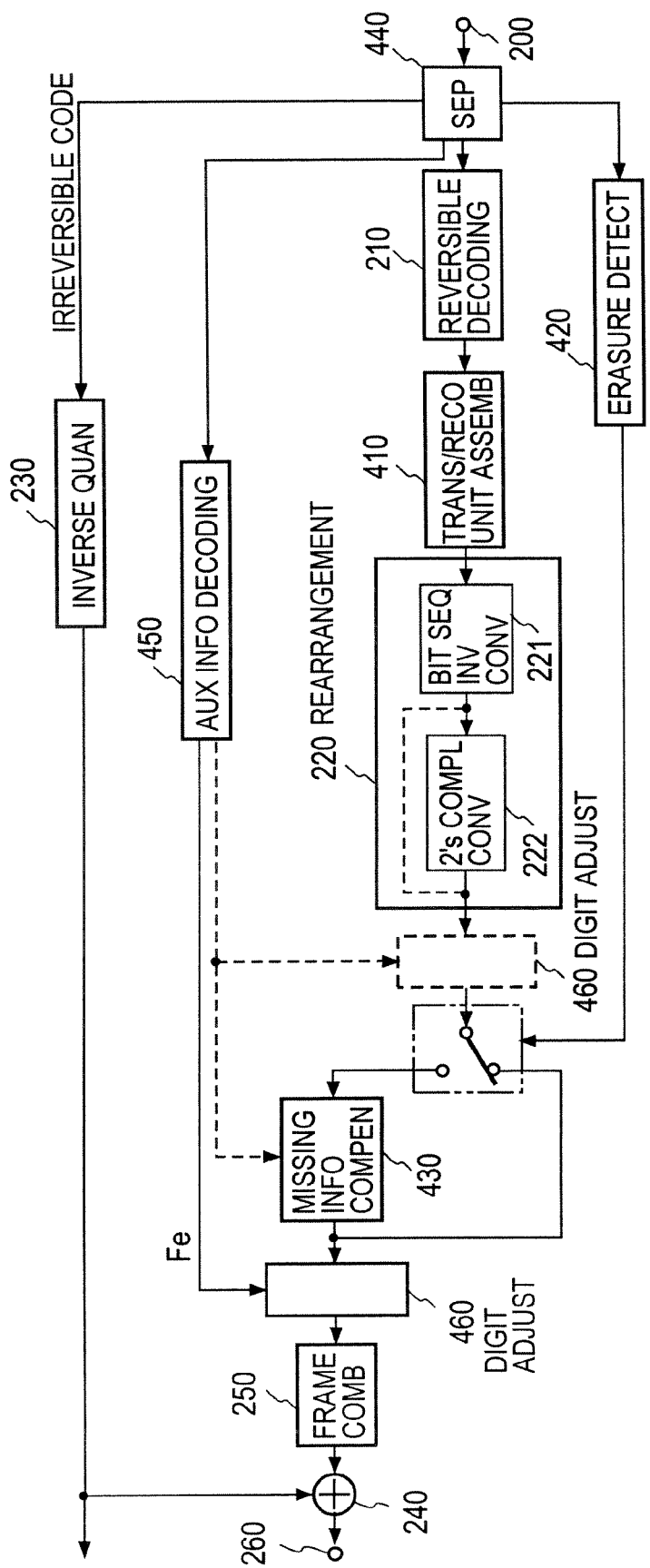
FIG. 20 is a block diagram illustrating a modified form of the decoder according to Embodiment 5.

As described above, in case of using the irreversibly quantized code and the error signal, the error signal prior to the synthesis of the original sound may be compensated for missing information in the decoder 20. That is, for example, as shown in FIG. 20, in the case of a packet erasure, the rearranged output from the rearrangement part 220 is provided to the missing information compensating part 430, wherein it is compensated for missing information, and the compensated output is applied to the digit adjusting part 460. When missing information is absent, the output from the rearrangement part 220 is provided directly to the digit adjusting part 460, and the digit-adjusted sample sequence is supplied to the frame combining part 250. For the compensation in the missing information compensating part 430 any one of the afore-mentioned schemes can be used. In the case of using the decoded spectral envelope of the auxiliary information or/and the decoded average power, the decoded output from the auxiliary information decoding part 450 is used; alternatively, the parameter LPC representing the corresponding spectral envelope, if available in the inverse quantization part 230, may also be used. The reconstructed error signal from the frame combining part 250 and the inversely quantized signal from the inverse quantization part 230 are added together in the addition part 240. As indicated by the broken lines in FIG. 20, the digit adjusting part 460 may be placed immediately after the rearrangement part 220.

The coder 10 sends out at least the effective digit number and the transmission/recording unit data for each frame and that the decoder 20 uses them to perform decoding.

Embodiment 6

Figure 21:
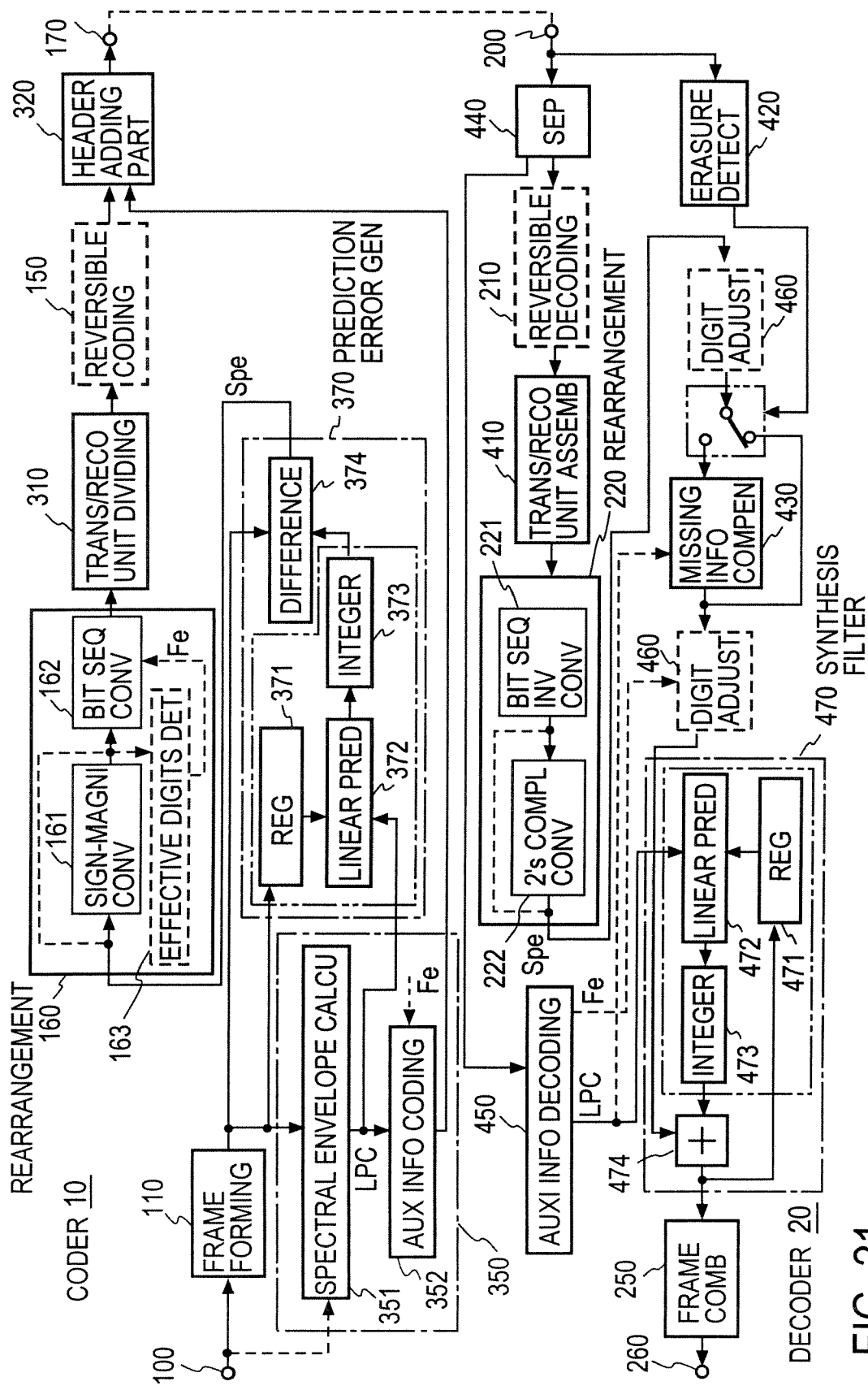
FIG. 21 is a block diagram illustrating a coder and a decoder according to Embodiment 6 of the present invention.

FIG. 21 illustrates in block form a coder 10 and a decoder 20 according to a sixth embodiment of the present invention. This embodiment sends out a prediction error of the input signal sample sequence after converting it to the equi-position bit sequence instead of converting the frame-separated input signal sample sequence to the equi-position bit sequence in the FIG. 6 embodiment.

The coder 10 differs from that 10 in FIG. 6 in the additional provision of a prediction error generating part 370 comprised of a sample register 371, an integer part 373 and a difference circuit 374. The decoder 20 also differs from that 20 in FIG. 6 in the additional provision of a synthesis filter 470 comprised of a sample register 471, a linear prediction part 472, an integer part 473 and an addition part 474. The input signal sample sequence is provided for each frame from the frame forming part 110 to the spectral envelope calculating part 351 of the auxiliary information generating part 350 and the difference circuit 374 of the prediction error generating part 370. The input signal sample sequence is subjected for each frame to, for example, linear predictive coding in the spectral envelope calculating part 351, from which is provided linear prediction coefficient LPCs as parameters representing the spectral envelope. The spectral envelope parameters LPC are encoded in the auxiliary information coding part 352.

For example, a predetermined number of samples of the immediately preceding frame from the frame forming part 110 is supplied from the register 371 to the linear prediction part 372, wherein these sample sequences are multiplied by or added with linear prediction coefficients based on the spectral envelope parameters LPC from the spectral envelope calculating part 351, by which is calculated linear prediction for each input sample. The linear prediction value is converted in the integer part 373 to an integer value. The difference between the prediction value in an integer form and the current sample from the frame forming part 110 is calculated as a prediction error signal sample Spe in the difference circuit 374.

The obtained prediction error signal Spe for each input sample is applied to the rearrangement part 160, wherein corresponding bits (digits) of the prediction error signal samples Spe (amplitude bit sequences) for the respective input samples are arranged in a temporal order for each frame as described previously with reference to FIG. 4A. The equi-position bit sequences from the rearrangement part 160 are separated by the transmission/recording unit separation part 310 to transmission unit or recording unit data. These separated pieces of transmission/recording unit data are subjected to reversible compression coding, if necessary, in the reversible coding part 150, and in the header adding part 320 the separated pieces of transmission/recording unit data are added with the header so that they can be reconstructed as one frame when decoded, thereafter being provided as a packet to the output terminal 170.

The coding information (auxiliary information) for the spectral envelope parameters LPC from the auxiliary information coding part 350 is output as one packet from the header adding part 320 or output therefrom after being loaded in the packet of the highest priority level.

In the decoder 20, the packets from the input terminal 200 are each separated to the auxiliary information and the transmission/recording unit data (containing a sign bit sequence) in the separation part 440, the auxiliary information is provided to the auxiliary information decoding part 450. When reversibly compressed, the transmission/recording unit data is fed to the decoding part 210, wherein it is reversibly decoded, and each piece of transmission/recording unit data is provided to the transmission/recording unit assembling part 410, wherein based on the packet numbers, pieces of transmission/recording unit data of one frame are assembled from plural packets. The assembled data is provided to the rearrangement part 220, wherein bit sequences are converted signal samples of one frame, providing a prediction error waveform.

Incidentally, when the transmission/recording unit data is based on the equi-position bit sequence directly rearranged from the amplitude bit sequence in a format of the 2's complement, the amplitude bit sequence from the bit sequence conversion part 221 is provided intact as a decoded sample to the synthesis filter 470, bypassing the missing information compensating part 430 as indicated by the broken lines in FIG. 21. When no packet are erased occurs, exactly the same prediction error signal Spe as the prediction error signal samples Spe input to the rearrangement part 160 of the coder 10 is provided from the rearrangement part 220. The synthesis filter 470 performs processing inverse to the synthesis filter prediction error generating part 370 of the coder 10. That is, a predetermined number of immediately preceding samples are input from the register 471 to the linear prediction part 472, wherein the samples are each multiplied by the linear prediction coefficients LPC decoded in the auxiliary information decoding part 450, and the sum of the results of multiplication is provided as a prediction value of the current sample. This prediction value is rendered by the integer part 463 to an integer value, and the sum of this integer value and the current prediction error signal from the rearrangement part 220 is calculated in the addition part 474, and the sum if provided as the filter output from the synthesis filter 470 to the frame combining part 259 and the register 471 as well. Accordingly, digital signals are synthesized in the synthesis filter 470 and concatenated in the frame combining part 250, and the signal input to the input terminal 100 of the coder 10 is reconstructed and provided to the output terminal 260.

When a packet is erased occurs, the packet number of the input packet concerned is detected in the erasure detecting part 420, and the amplitude bit sequence from the rearrangement part 220 is not provided directly to the synthesis filter 470. Instead they are supplied to the missing information compensating part 430, wherein the amplitude bit sequence (the prediction error signal) is compensated for the missing information, and the compensated output is applied to the synthesis filter 470.

Compensation For Missing Information

A description will be given, with reference to FIGS. 22 and 23, of the procedure and configuration of the missing information compensating part 430 for obtaining the prediction error waveform compensated for missing information.

A prediction error waveform (the one-frame sample sequence output from the rearrangement part 220) is input to a provisional waveform generating part 431, which generates a provisional prediction error waveform in the frame using only determined bits (S1). At this time, missing bits are fixed to, for example, to zeros or an intermediate value in the range of all potential values.

Next, the spectral envelope of the provisional prediction error waveform is calculated in a spectral envelope calculating part 432 (S2). The spectral envelope can be estimated by subjecting the provisional prediction error waveform to, for example, all-pole-type linear predictive coding analysis that is used in speech analysis. Since the spectral envelope of the prediction error waveform generated in the prediction error waveform generating part 370 of the coder 10 becomes substantially flat, it is expected that the estimated spectral envelope is flat if the provisional prediction error waveform is identical with the waveform of the original prediction error signal obtained in the prediction error generating part 370 of the coder 10. However the spectral envelope does not become flat if the provisional prediction error waveform differs from the waveform of the original prediction error signal. It is checked in a flatness decision part 433F if the flatness is within a given limit (S3). If the flatness is within the limit, the provisional prediction error waveform is output intact to the synthesis filter 470.

The decision of the flatness uses, as the criterion therefore, a value obtained by dividing the arithmetic means of linear prediction coefficients $c_1, c_2, \ldots, c_M$ obtained as parameters of the spectral envelope in the spectral envelope calculating part 432 by the geometric mean of the coefficients. E.g., if the above-mentioned value is 0 dB, then it is decided that the spectral envelope is completely flat, and if the value is 3 dB or less, for instance, it is decided that the spectral envelope is substantially flat. Alternatively, LPC cepstrum coefficients are used as the spectral envelope parameters. For example if the sum of their squares is smaller than a certain value, it is decided that the spectral envelope is substantially flat.

When it is decided that the spectral envelope configuration greatly differs from the flat configuration, a first step is to introduce an inverse characteristics of an estimated spectral envelope to the provisional prediction error waveform (S4). Concretely, the provisional prediction error waveform is applied to, for example, an all-pole-type linear prediction inverse filter (all-zero) 434 to flatten the spectrum of the provisional prediction error waveform. The spectral envelope need not be completely flattened but with the bandwidth of the spectral envelope characteristic enlarged, consequently the steepness of the spectral envelope can be reduced.

Since there is a possibility that the flattened waveform is contradictory to determined amplitude bits obtained from normally received packets, it is corrected to a correct value in a correcting part 436 (S5). For example, when lower-order four bits of an amplitude value of 16-bit accuracy are missing, values possible for each amplitude bit sequence (prediction error signal) originally represents one of 16 uncertain values, but if the corrected spectrum waveform contains an amplitude bit sequence outside the range of the 16 values the waveform is corrected to a value closest to the amplitude within the range, in this example, 15 that is an amplitude bit sequence represented by the value of lowest-order four bits.

As a result, the determined bits of the amplitude value are all equal and the spectral envelope is reconstructed in a waveform close to that of the original prediction error signal. If necessary, the procedure returns to step S1, repeating the correction processing using the corrected waveform as the provisional prediction error.

Incidentally, it is presumed that the corrected prediction error (provisional prediction error) waveform is an integer value, but in a filter calculation it is handled as a real number; hence, it is necessary that the filter output value be put in an integer form. In the case of a synthesis filter, the result of conversion differs depending on the waveform is converted for each amplitude or for each frame, but the both methods can be used.

In the case of producing the candidates for the compensated sample sequence by use of all possible combinations of values for the missing bits, an increase in the number of missing bits causes a considerable increase in number of candidates for the compensated amplitude bit sequence (waveform), giving rise to a problem i.e., an impractical computational complexity. A description will be given below of the processing by the missing information compensating part 430 and its functional configuration that will solve such a problem.

Figure 24:
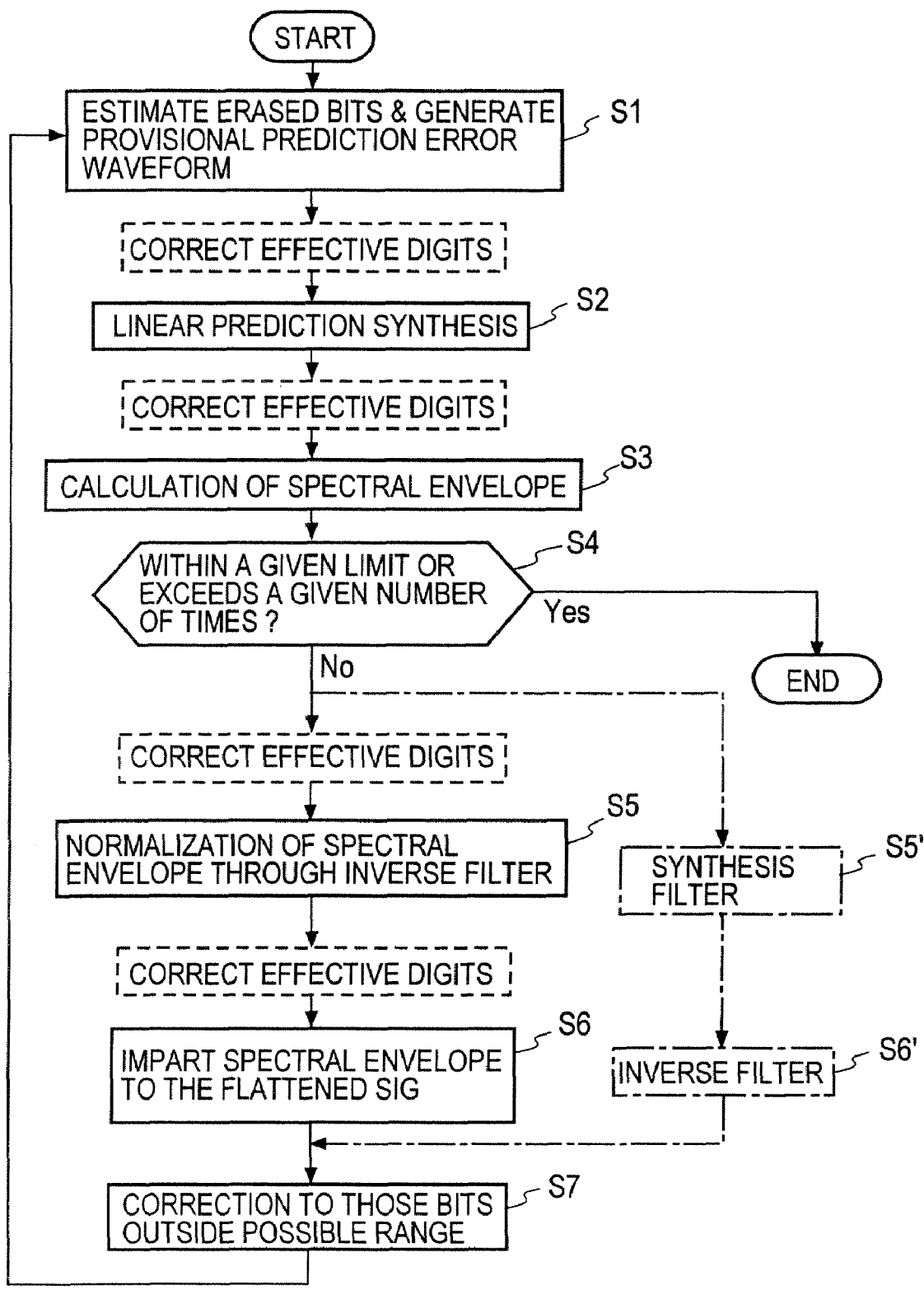
FIG. 24 is a flowchart showing another example of the procedure by the missing information compensating part 430 in the case of using auxiliary information.

FIG. 24 depicts an example of the procedure to be followed and FIG. 17 an example of the functional configuration of the missing information compensating part 430. In the first place, only determined bits input to the provisional waveform generating part 431 from the rearrangement part 220 are used to reconstruct a provisional prediction error waveform (a provisional amplitude bit sequence) in the frame (S1). The provisional prediction error waveform is reconstructed with the missing bits fixed to, for example, 0 or an intermediate value within a range of the possible values for the missing bits. For example, if lowest-order four bits are missing, any one of levels from 0 to 15 can be correct, provisionally, set to 8 or 7.

Next, the linear prediction coefficients LPC of the spectral envelope produced by decoding the received auxiliary information are set in the synthesis filter 435, and the provisional prediction error waveform is applied to the synthesis filter 435 to synthesize the original input signal waveform to the coder 10 by linear prediction (S2). The spectral envelope of the synthesized waveform is calculated in a spectral envelope calculating part 432 (S3). In an error calculating part 433 the calculated spectral envelope and the spectral envelope of the original sound (the original input signal) received as auxiliary information, are compared by calculating the spectral envelope decoded in the auxiliary information decoding part 450. If the error between the two spectral envelopes is within a given limit, the provisional prediction error waveform is output as a compensated prediction error waveform (compensated amplitude bit sequence) to the synthesis filter 470. (S4).

If the spectral envelope of the provisional prediction error waveform and the spectral envelope generated by decoding the auxiliary information greatly differ from each other in step S4, that is, if the provisional prediction error is incomplete, an inverse characteristics of the calculated spectral envelope is introduced to the provisional prediction error waveform (S5). Concretely, the provisional prediction error waveform is applied to, for example, an all-pole-type linear prediction inverse filter (all-zero) 434 to flatten the spectrum of the provisional prediction error waveform. The spectral envelope need not be completely flattened but with a bandwidth of the spectral envelope characteristic broadened, consequently the steepness of the spectral envelope can be reduced.

Next, the characteristic of the reconstructed spectral envelope is imparted to the flattened signal (S6). The output from the inverse filter is applied to an all-pole-type synthesis filter 435 having set therein the parameters LPC representing the spectral envelope generated by decoding auxiliary information to produce a prediction error waveform based on the provisional prediction error waveform. The resulting prediction error waveform can approximate the original prediction error waveform (signal).

Figure 22:
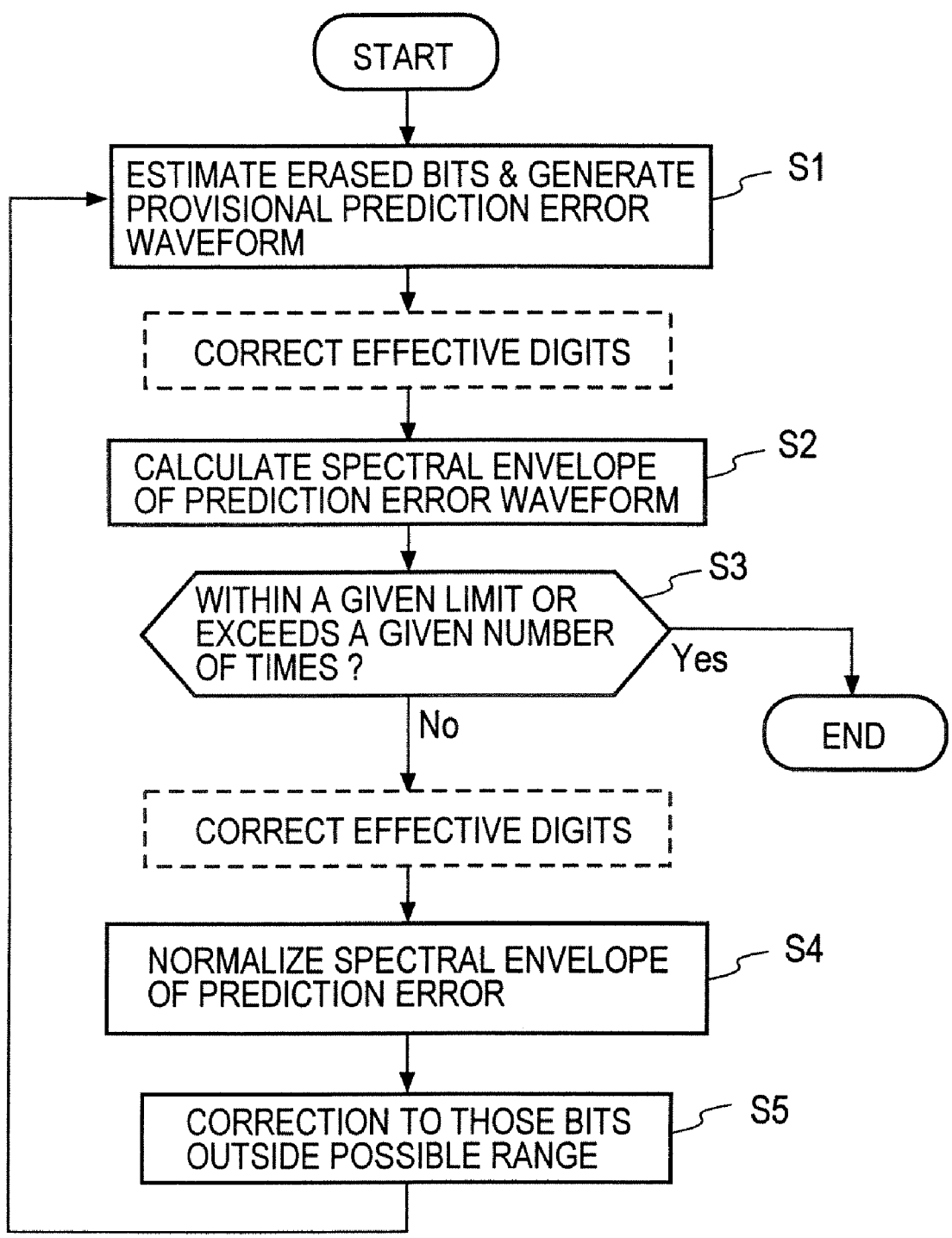
FIG. 22 is a flowchart showing another example of the procedure by the missing information compensating part 430 in the case of using no auxiliary information.
Figure 23:
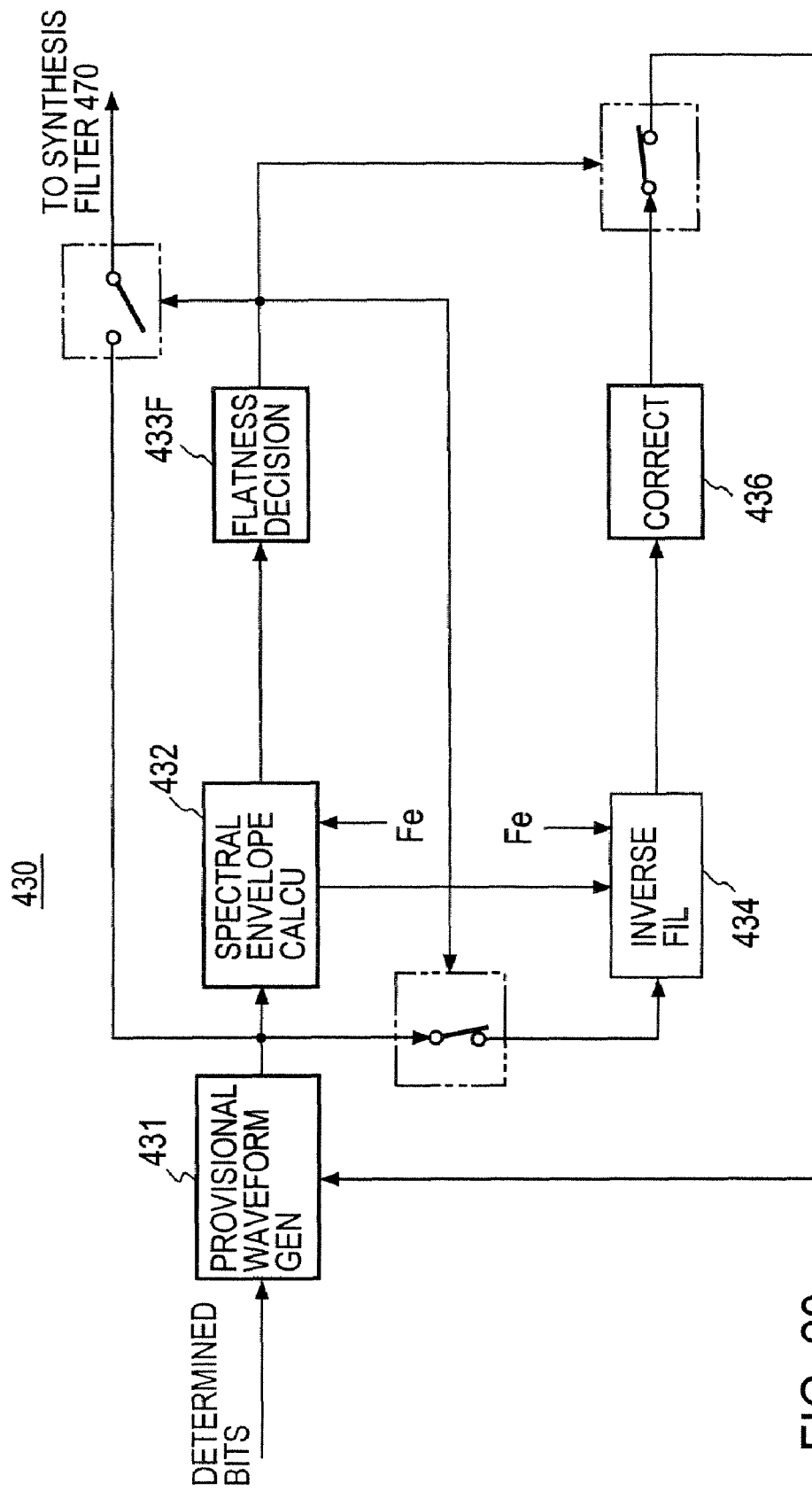
FIG. 23 is a block diagram corresponding to FIG. 22, illustrating the functional configuration of the missing information compensating part 430.

As is the case with FIG. 22, since there is a possibility that the corrected prediction error waveform contains a bit contradictory to a known amplitude bit, the prediction error waveform is corrected to a correct value in the correcting part 436 (S7).

Step S2 and the subsequent steps are repeated using the corrected prediction error waveform as the provisional prediction error waveform in step S1. As indicated by the broken lines in FIGS. 24 and 25, step S4 may also be followed by step S5' in which to synthesize the provisional prediction error waveform by use of the reconstructed spectral envelope parameter (by applying the provisional waveform to a synthesis filter 435') then by step S6' in which to introduce the inverse characteristic of the calculated spectral envelope to the synthesized waveform (by applying the waveform to an inverse filter 434'). In case of omitting coefficients with the broadened bandwidth, the waveform synthesized for obtaining the prediction coefficients, that is, the output waveform from the synthesis filter 502 may be supplied to the inverse filter 434.

Figure 26:
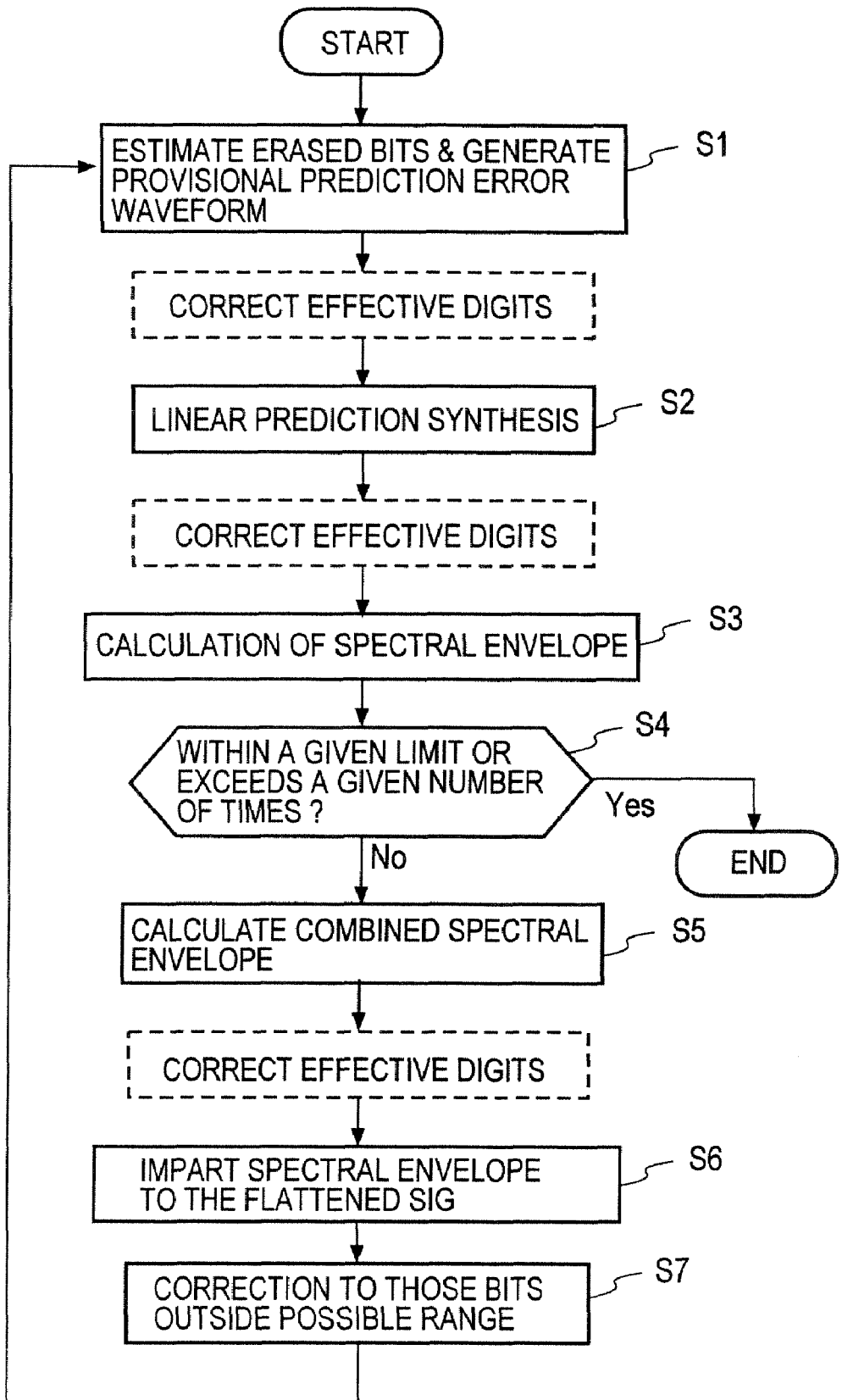
FIG. 26 is a flowchart showing another example of the procedure by the missing information compensating part 430 in the case of using auxiliary information.

Turning next to FIG. 26, a description will be given of another example of the missing information compensating procedure using the reconstructed spectral envelope.

Steps S1 to S4 and S7 are identical with those S1 to S4 and S7 in FIG. 24. In this example, after step S6, the filter coefficients of the synthesis filter part 438, which is an assembly of the inverse filter 434 using the spectral envelope coefficients estimated in step S2 and the synthesis filter 435 using the reconstracted spectral envelope parameters, are calculated (S5). In step S6 the provisional prediction error waveform is applied to the synthesis filter 438 to synthesize a corrected prediction error waveform.

Figure 25:
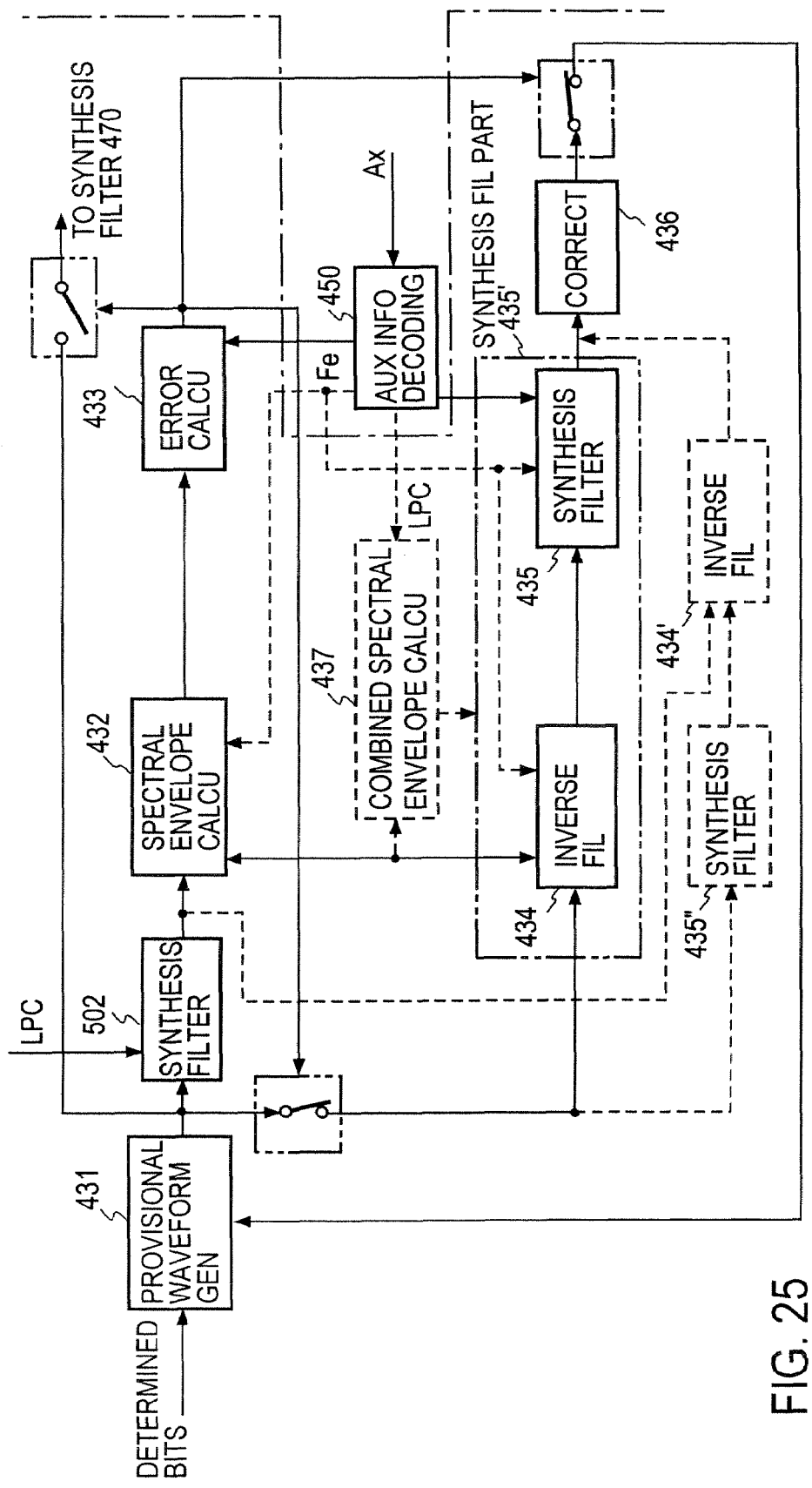
FIG. 25 is a block diagram corresponding to FIG. 24, illustrating an example of the functional configuration of the missing information compensating part 430.

The functional configuration for implementing the process shown in FIG. 26 is indicated by the broken lines in FIG. 25. The filter characteristics of the synthesis filter part 438, which is a combination of the inverse filter 434 and the synthesis filter 438, is calculated in the synthesis spectral envelope calculating part 437 from the decoded spectral envelope parameters LPCs from the auxiliary information decoding part 450 and estimated spectral envelope parameters $\alpha$ from the spectral envelope calculating part 432. Then the provisional prediction error waveform is applied to the synthesis filter part 438.

The calculation of the filter coefficients of the synthesis filter part 438 is conducted as described previously with reference to FIG. 10. That is, the linear prediction coefficients of the provisional error waveform are converted in the coefficient conversion part 437a to linear prediction cepstrum coefficients Ca, and the linear prediction coefficients of the reconstructed spectral envelope are converted in the coefficient conversion part 437b to the linear prediction cepstrum coefficients Cb. These coefficients Ca and Cb are provided to the subtraction part 437c to calculate the difference Cb–Ca, which is inversely converted in the inverse conversion part 437d to the linear prediction coefficients, which are used as the filter coefficients of the synthesis filter part 438.

To prevent divergence of the prediction error waveform by the repetitive processing in the flowchart of FIG. 22, the linear prediction coefficients $\alpha_k$ of the inverse filter 434 in the examples of FIGS. 22, 24 and 26 and the linear prediction coefficients $\beta_k$ and $\beta_k'$ of the synthesis filters 435 and 438 in the examples of FIGS. 24 and 26 are multiplied by the k-th power of the constant γ equal to or smaller than 1 (k being the order of the parameter). In the example of FIG. 10 the linear predictive cepstrum coefficients need only to be multiplied by a constant equal to or smaller than 1. In the repetitive process in FIGS. 22, 24 and 26, too, it is also possible to set the constant γ to a value close to a at the beginning of the repetition and gradually reduce the value of the constant γ as convergence proceeds, thereby decreasing the estimation error.

Steps S3 in FIG. 22 and S4 in FIGS. 24 and 26 may be omitted, and steps S1, S2, S4 and S5 in FIG. 22 and S1, S2, S5, S6 and S7 in FIGS. 24 and 26 may be performed only once or repeatedly a predetermined number of times to output the corrected prediction error waveform (amplitude bit sequences). When the repetition counts of steps S3 in FIG. 22 and S4 in FIGS. 24 and 26 exceed a prescribed value, the corrected prediction error waveform finally available may be output. The processing in FIGS. 22, 24 and 26 may also be carried out in the frequency domain. In this case, for example, inverse filtering becomes a normalization process.

The amplitude of the prediction error signal Spe frequently becomes smaller. When the prediction error signal Spe is represented by a binary number consisting of a sign and absolute value, high-order digits of each prediction error signal Spe (amplitude bit sequence) become "0s" throughout the frame in many case as referred to previously with respect to FIGS. 15A and 15B. Accordingly, the number of digits representing the maximum value of the absolute value in one frame is calculated as the effective digit number, that is the maximum number of digits including "1" is detected as the effective digit number Fe in an effective digit number detecting part 163 of the coder in FIG. 21. The effective digit number Fe is also encoded in the auxiliary information coding part 352, from which it is output together with the spectral envelope parameters LPC, and only bits in an range 41 of the effective digit number Fe and the sign bit are converted to an equi-position bit sequence in the rearrangement part 160, from which it is output to the transmission/recording unit separation part 310.

In the decoder 20, the reconstructed prediction error waveform formed by the amplitude bit sequences from the rearrangement part 220 or the corrected amplitude bit sequences is digit-adjusted in the digit adjusting part 460 using the effective digit number Fe reconstructed in the auxiliary information decoding part 430. For example, when the reconstructed prediction error waveform (amplitude bit sequences) input to the digit adjusting part 460 is like the amplitude bit sequences of the digit number Fe on the right side of FIG. 15B, those of the amplitude bit sequences (in a format of the 2's complement) whose sign bits are positive ("0") as shown on the left side of FIG. 15B are each added at high-order places with "0s" equal in number to the difference m–Fe between the bit width m of each amplitude bit sequence (the bit width of the prediction error signal Spe input to the rearrangement part 160 in the coder 10) and the effective digit number Fe. And the amplitude bit sequences of negative sign bits ("1") are added at high-order place with "1s" of the same number as m–Fe.

The reconstructed prediction error waveform thus digit adjusted is provided to the synthesis filter 470. The addition of the effective digit number to the auxiliary information enhance the coding efficiency. Incidentally, the prediction error signal (amplitude bit sequences) need not always be converted to that in the binary format consisting of the sign bit and the absolute value in the rearrangement part 160 of the coder 10, instead the effective digit number Fe can be output as auxiliary information for the amplitude bit sequences in a format of the 2's complement, too. Also in this instance, the number of digits lowest-order than those highest-order digits which are "0" or "1" in common to all the amplitude bit sequences, as depicted on the left side of FIG. 15B are the effective digit number Fe, and the least significant bits of the effective digit number Fe can be used as the sign bit.

In case of using the effective digit number Fe, when a reconstructed prediction error signal of the immediately preceding frame is required for the analysis processing and filtering in the spectral envelope calculating part 432, the inverse filter 434, the synthesis filter 435, the synthesis filter 502 and the synthesis filer 435' in the missing information compensating part 430 of the decoder 20 (FIG. 25), prior to the processing the effective digit numbers Fe of the immediately preceding frame should equal the current frame. For example, when the effective digit number of the current frame is larger than the effective digit number of the immediately preceding frame by M bits (digits), the amplitude bits sequences of the immediately preceding frame, for instance, are each download shifted by M bits to reduce the amplitude value of the amplitude bit sequence of the previous frame to meet the effective number of digits of the immediately preceding frame with the effective number of digits of the current frame. When the effective digit number of the current frame is smaller than that of the immediately preceding frame by N bits (digits), the amplitude bit sequence of the immediately preceding frame is temporarily upward shifted by M digits. For example, in the floating-point representation to increase the amplitude value of the amplitude bit sequence of the immediately preceding frame, the effective digit number equal to that of the current frame. Alternatively, the processing is carried out by using the other preceding frame, rather than the immediately preceding frame.

In case of making the effective digit numbers of the current and immediately preceding frames equal to each other, the amplitude bit sequence of the immediately preceding frame is subjected to the above adjustment in the effective digit number immediately prior to steps S2 and S4 in FIG. 22, S2, S3, S5 and S6 in FIG. 24 and S2, S3 and S6 in FIG. 26 as indicated by the broken lines. In the missing information compensating part 430 in FIGS. 23 and 25, the amplitude bit sequence of the immediately preceding frame needs only to be subjected to above adjustment to its effective digit number. As shown in the decoder 20 in FIG. 21, the amplitude bit sequence from the rearrangement part 220 may also be digit-adjusted in the digit adjusting part 460, in which case there is no need for the above-mentioned correction of the effective digit number.

Embodiment 7

It is customary in the prior art that the high-compression-ratio coding of an acoustic signal is designed to minimize perceptual distortion in view of the perceptual characteristics. This is a coding scheme that utilizes perceptual optimization, and is intended to minimize a perceptual quantization distortion by use of frequency masking. To minimize the energy of quantization distortion independently of the perception, the quantization distortion is dispersed or distributed independently of the magnitude of the spectrum of the original sound.

In a perceptual optimization, since the quantization distortion around a major spectrum component of the original sound is masked by the component of the original sound and is not perceived, the amount of distortion is made near the major spectrum component of the original sound but small near its small spectrum component.

Figure 27:
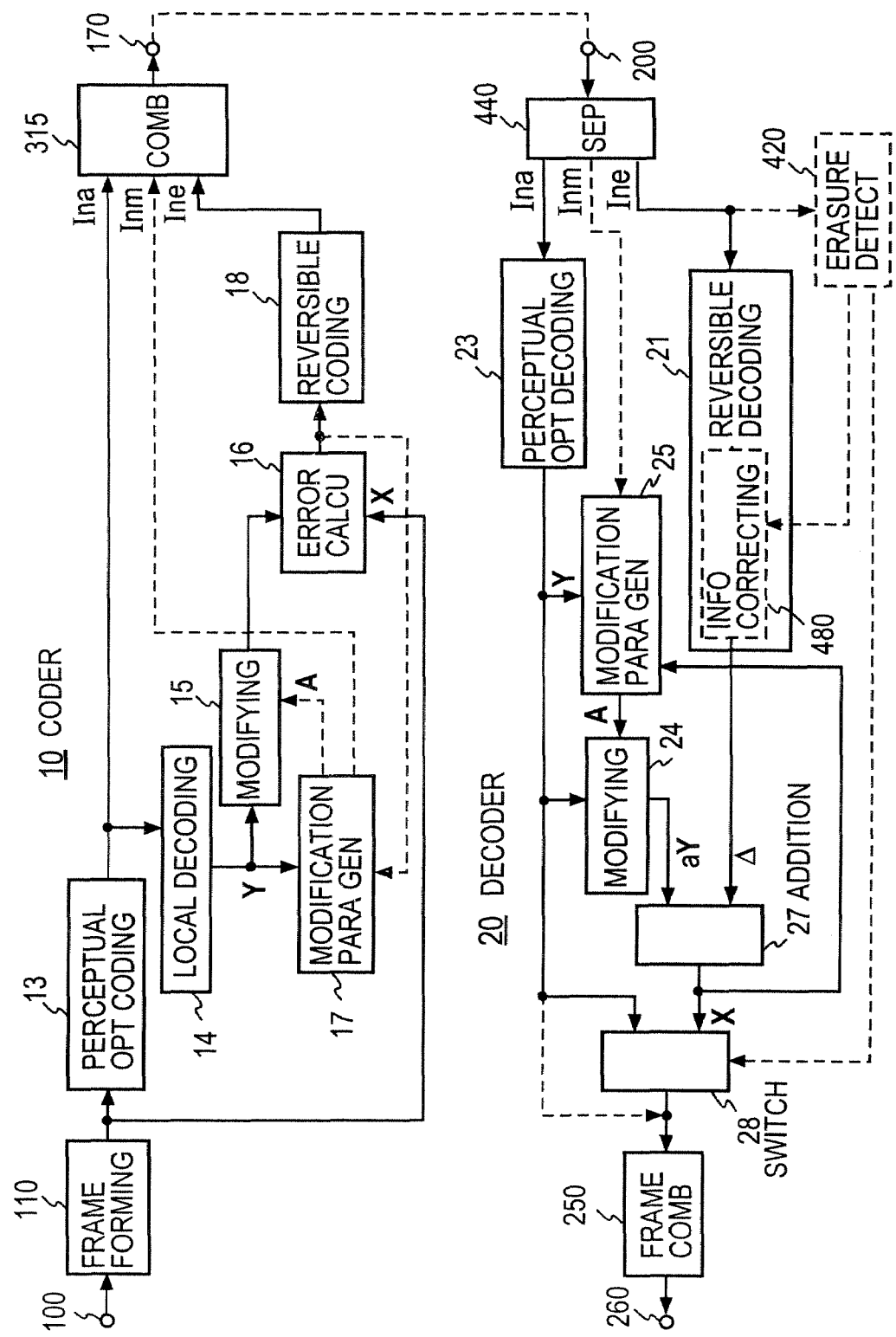
FIG. 27 is a block diagram illustrating an example of the functional configuration of Embodiment 7 of the present invention.

For example, in the combination of high-compression-ratio irreversible coding and coding as in the FIG. 11 embodiment, if the perceptual characteristics is considered in the irreversible coding, the waveform of the locally reconstructed signal (the output from the inverse quantization part 130 in FIG. 11) is seriously distorted particularly in a relatively large spectrum component. Consequently, the error signal between the locally reconstructed signal and the original input acoustic signal is relatively large in its amplitude variation; hence, even the reversible compression coding by the afore-mentioned rearrangement does not sufficiently increase the coding efficiency. FIG. 27 illustrates in block form a seventh embodiment of the present invention intended to overcome the above-mentioned problem.

In the coder 10 an acoustic signal sample sequence input to the input terminal 100 is separated by the frame forming part 110 into frames each consisting of, for example, 1024 samples. The acoustic signal of each frame is applied to a perceptual optimization coding part 13, wherein it is subjected to irreversible compression coding taking the perceptual characteristics into account. The perceptual optimization coding is compression coding of the acoustic signal so as to minimize perceptual distortion; for example a coding scheme specified in MPEG can be used. The perceptual optimization coding part 13 outputs a perceptually optimized code Ina that is an irreversible code.

The perceptually optimized code Ina is locally reconstructed in a local decoding part 14 to provide a locally recommended signal. The locally reconstructed signal for the code Ina can be obtained in the perceptual optimization coding part 13 due to its analysis-by-synthesis coding scheme. The locally reconstructed signal is fed to a modification part 15, wherein it is modified so that the difference or error between it and the output acoustic signal from the frame forming part 110 is small. That is, the error between the locally reconstructed signal modified in the modification part 15 (a modified local signal) and the acoustic signal from the frame forming part 110 is calculated in an error calculating part 16. The locally reconstructed signal is modified in the modification part 15 so that the energy of the error signal may preferably be minimized.

This modification is carried out by multiplying the locally reconstructed signal by a modification parameter generated in a modification parameter generating part 17, or by weighted addition of plural samples to the locally reconstructed signal. The modification parameter is generated, for example, in the manner described below.

Set a p-order modification parameter A(1×p), an input acoustic signal X(1×n) consisting of n samples and a locally reconstructed signal matrix Y(p×n) as follows:

$$A = (a_0, a_1, \ldots, a_{p-1})^T \quad (1)$$

$$X = (x_0, x_1, \ldots, x_{(n-1)})^T$$

$$Y = \begin{pmatrix} y_0 & y_1 & \cdots & y_{p-1} \\ y_1 & y_2 & \cdots & y_p \\ \vdots & \vdots & \ddots & \vdots \\ y_{n-1} & 0 & \cdots & 0 \end{pmatrix}$$

where $(\ )^T$ represents transposition of the matrix.

The energy d of the error signal is as follows:

$$d = (X-YA)^T(X-YA) \quad (2)$$

The modified parameter A that minimizes d is as follows:

$$A = (Y^TY)^{-1}Y^TX \quad (3)$$

$(Y^TY)$ is an auto-correlation matrix, $Y^TX$ can approximates a cross correlation energy, and the modified parameter $a_0$ when p=1 is a normalization of the cross correlation coefficient between X and Y by the energy of Y.

Further, the correlation coefficient b between U(=X−Y) and Y is calculated and the following Z can be used as the error signal.

$$Z = X - Y - bY \quad (4)$$

That is, $Z=X-(1+b)Y \equiv X-a_0Y$.

Figure 28A:
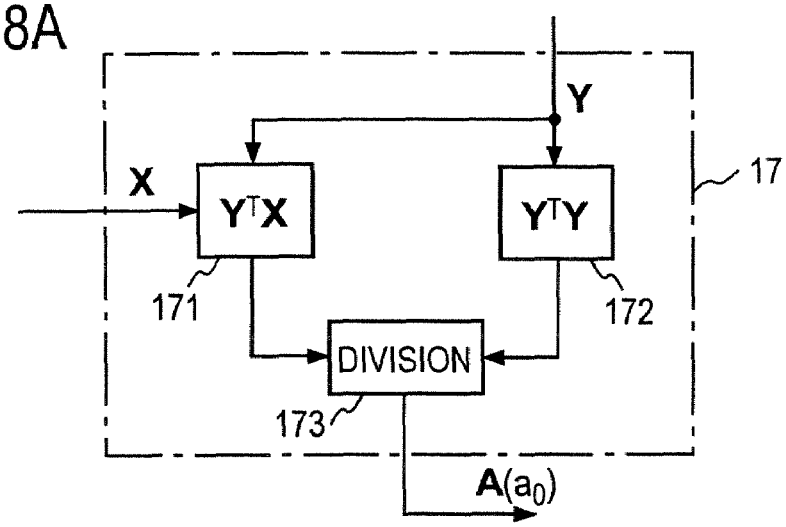
FIG. 28A is block diagram depicting a concrete example of a modified parameter generating part 17.

In the modified parameter generating part 17, as shown in FIG. 28A, the cross correlation vector between the input acoustic signal X and a transposed matrix of the locally reconstructed signal Y is calculated in a multiplication part 171, the auto correlation matrix $Y^TY$ is calculated in a multiplication part 172 and the result of calculation in the multiplication part 171 is divided by the result of calculation in the multiplication part 172 in a division part 173 to generate the modified parameter A. Alternatively, the modified parameter $a_0$ may be obtained by calculating the cross correlation coefficient between X and Y in the multiplication part 171 and the energy of Y in the multiplication part 172, and dividing the cross correlation coefficient by the energy of Y in the division part 173.

Figure 28B:
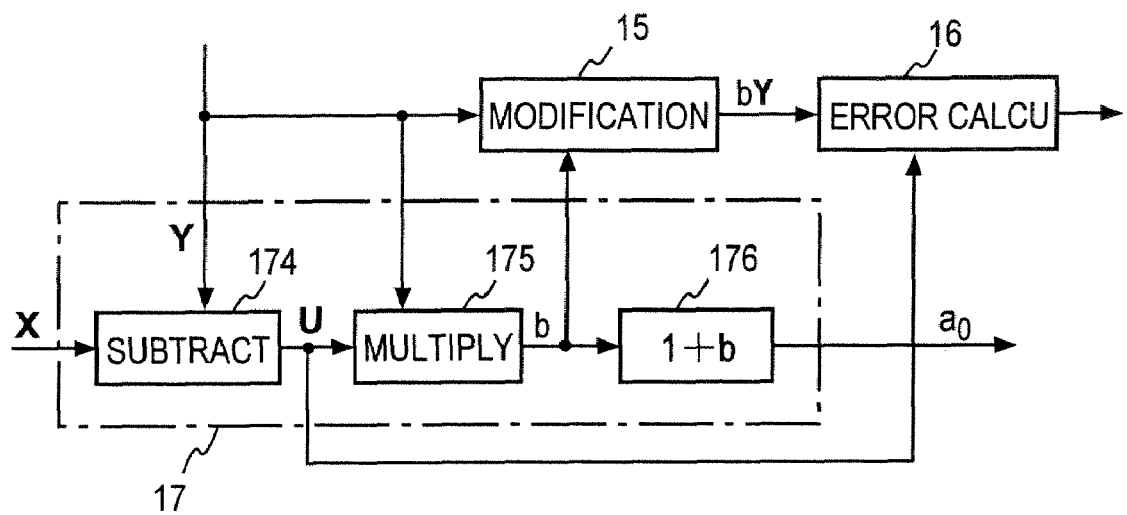
FIG. 28B is a block diagram depicting another concrete example of the modified parameter generating part 17.

The modified parameter $a_0$ may also be obtained, as depicted in FIG. 28B, by calculating X−Y=U in a subtraction part 174 and the cross correlation coefficient b between U and Y in a multiplication part 175 and adding 1 to b in an addition part 176.

The modified parameter A, $a_0$, or b are encoded and output as a modified parameter code Inm from the modified parameter generating part 171. Thus, the modified parameter contains the cross correlation component between the acoustic signal X and the locally reconstructed signal Y, and in the modifying part 15 the locally reconstructed signal Y is multiplied by the modified parameter or a weighted addition or convolution of the locally reconstructed signal by the modified parameters A.

Incidentally, if the energy of the error signal between the acoustic signal and the locally reconstructed signal is minimized, the error signal has no correlation to the acoustic signal and the locally reconstructed signal. If the energy of the error signal is not minimized, there is correlation between the error signal and the acoustic signal and the locally reconstructed signal. This correlation component is calculated; the locally reconstructed signal Y is modified by Eq. (3) in accordance with the correlation component and the modified parameters A of Eq. (2) is determined which minimizes the energy of the error signal.

The generation of the modified parameters A may also be performed by setting a proper value at first and sequentially correcting it for each frame so that the amplitude or energy of the error signal U may decrease. In this instance, the modified parameter code Inm need not be output.

Figure 2:
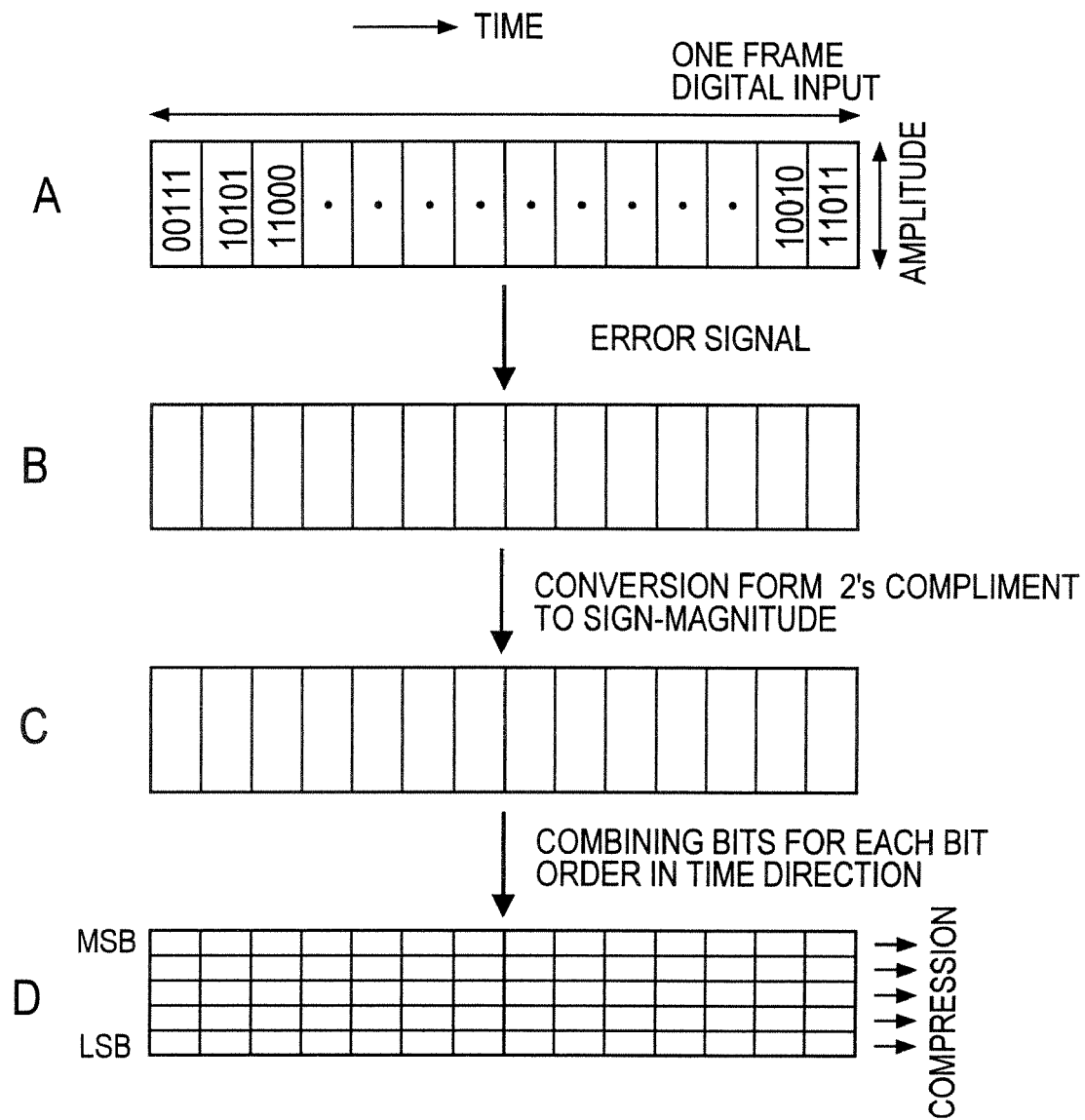
FIGS. 2A to 2D are diagrams for explaining processing of a rearrangement part 160 in FIG. 1.

The error signal from the error calculating part 16 is reversibly encoded in a reversible coding part 18, from which it is output as a reversibly encoded code Pne. The reversible coding can be done by a combination of the bit rearrangement with Huffman coding, arithmetic coding, or similar entropy coding as described in Japanese Patent Application Laid-Open Gazette No. 2001-44847 referred to previously with reference to FIGS. 1 and 2.

Since the locally reconstructed signal is modified in the modifying part 15 so that the error between it and the acoustic signal becomes small, the number of "0" bits in the error signal is larger than in the error signal between the unmodified locally reconstructed signal and the acoustic signal; hence, the modification of the locally reconstructed signal provides increased efficiency in the reversible coding of the error signal.

The perceptually optimized code Ina, the reversibly encoded code Ine and, if necessary, the modified parameter code Inm are combined in a combining part 320. Incidentally, it is also possible to adopt a scheme that, as depicted in FIG. 28B, multiplies the locally reconstructed signal Y by a modified parameter b in the modifying part 15 to obtain a modified locally reconstructed signal bY, calculates an error U−bY between the modified locally reconstructed signal bY and U=X−Y in the error calculating part 16 to obtain an error signal and reversibly encodes it. Since this error signal is essentially identical with the error signal $\Delta = X - a_0 Y$, the calculation of the error signal between the acoustic signal and the modified locally reconstructed signal means the both schemes and a scheme equivalent thereto.

In the decoder 20, the set of codes for each frame input to the input terminal 200 is separated by the separation part 440 to the perceptually optimized code Ina, the reversibly encoded code Ine and, if necessary, the modified parameter code Inm. The perceptually optimized code Ina is irreversibly decoded in an perceptually optimized code decoding part 23 to generate a decoded signal. The scheme for this decoding is identical with the scheme used in the local decoding part 14 of the coder 10. The decoded signal is modified in a modifying part 24 through multiplication by a constant or plural-sample weighted addition. This modification is also identical with that in the modifying part 15 of the coder 10. When the modified parameter code Inm is input thereto, a modification parameter generating part 25 decodes it to generate the modification parameters A or $a_0$ or b. When the modified parameter code Inm is not input thereto, the modified parameter generating part 25 uses the decoded signal Y and the reconstructed acoustic signal X to calculate the modified parameters A by sequential correction using the scheme identical with that used by the modification parameter generating part 17 of the coder 10.

The reversibly encoded code Ine is reversibly decoded in a reversible decoding part 21 to reconstruct the error signal $\Delta$. The error signal $\Delta$ and the modified decoded signal aY are added together in an addition part 27 to reconstruct the acoustic signal. The reconstructed acoustic signal is applied via a switching part 28 to the frame combining part 250, wherein reconstructed acoustic signals of respective frames are sequentially concatenated, thereafter being output therefrom. Upon detection of a correctable or compensable packet erasure by the erasure detecting part 420, such a compensation as described previously in respect of FIG. 23, for instance, is carried out by the information compensating part 480.

When the reversibly encoded code Ine is not input, or when the error signal $\Delta$ of satisfactory quality cannot be obtained due to a erasure of some amount of information, it is detected by the erasure detecting part 420, and the detected output is used to control the switching part 28, through which the decoded signal from the perceptually optimized code decoding part 23 is applied to the frame combining part 250. For ultimate reversible coding, the smaller the energy of the quantized error is, the higher the compression efficiency is; but when information about only the perceptually optimized code Ina is available, the use of the quantization result which minimizes perceptual distortion improves the signal quality despite 1 bit rate. In a decoder without the reversible decoding part 26 and so on, too, the perceptually optimized code Ina can be decoded into a reconstructed digital signal.

Embodiment 8

Figure 29:
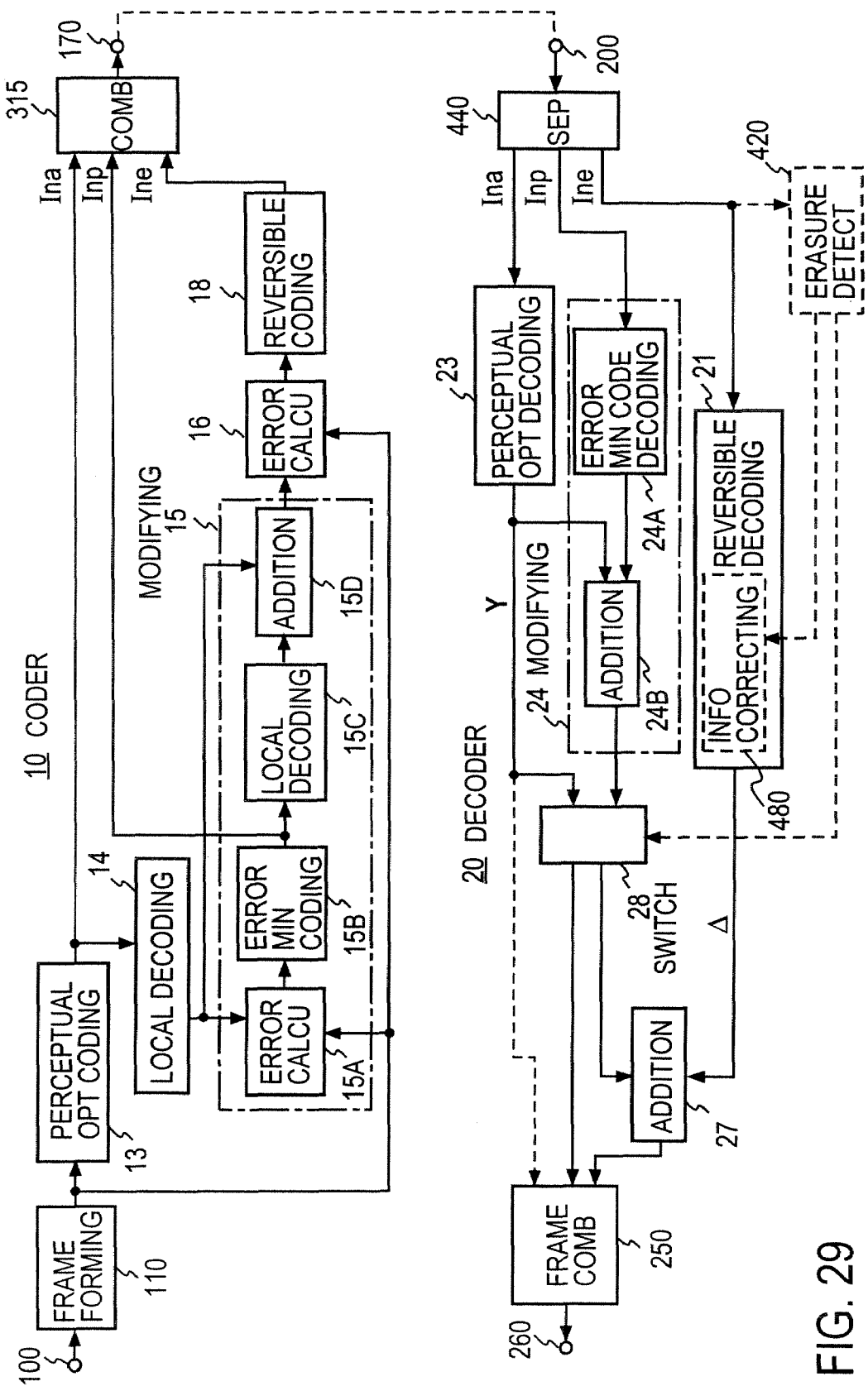
FIG. 29 is a block diagram illustrating an example of the functional configuration of Embodiment 8 of the present invention.

FIG. 29 illustrates in block form an eighth embodiment of the present invention, in which the parts corresponding to those in FIG. 27 are identified by the same reference numerals. The coder 10 differs from the counterpart 10 of the FIG. 27 in the construction of the modifying part 15. That is, in this embodiment the error signal between the locally reconstructed signal Y from the local decoding part 14 and the acoustic signal X is calculated in an error calculating part 15A. The error signal is subjected to irreversible compression coding in an error minimization coding part 15B so that the energy of quantized error becomes minimum, and an error minimized code Inp is provided as the irreversibly encoded code.

The error minimized code Inp is locally decoded in a local decoding part 15C, and the locally reconstructed signal and that from the local decoding part 14 are added in adding part 15D. The error between the added locally reconstructed signal and the acoustic signal is calculated in the error calculating part 16, from which an error signal is provided to the reversible coding part 18. Since the acoustic signal is encoded twice in the perceptual optimization coding part 13 and the error minimization coding 15B as described above, the locally reconstructed signal, that is, the added locally reconstructed signal from the adding part 15D is close to the acoustic signal accordingly, and the number of "0" bits in the error signal from the error calculating part 16 increases correspondingly. The combining part 320 combines the perceptually optimized code Ina, the error minimized code Inp and the reversibly encoded code Ine.

In the decoder 20 the error minimized code Inp is irreversibly decoded in an error minimized code decoding part 24A, and the reconstructed signal from the decoding part 24A and the reconstructed signal from the perceptually optimized code decoding part 23 are added together in an adding part 24B. The added signal is applied via the switching part 28 to the adding part 27, wherein it is added to the reconstructed error signal from the reversible decoding part 26. When the reversibly encoded code Ine is not input or when sufficient information for reconstructing the error signal is not available, switching part 28 applies the decoded signal of the perceptually optimized code Ina as the reconstructed acoustic signal to the frame combining part 29 in place of the added decoded signal from the adding part 24B. The error minimized code decoding part 45 and the adding part 24B constitute the modifying part 24.

Embodiment 9

Figure 30:
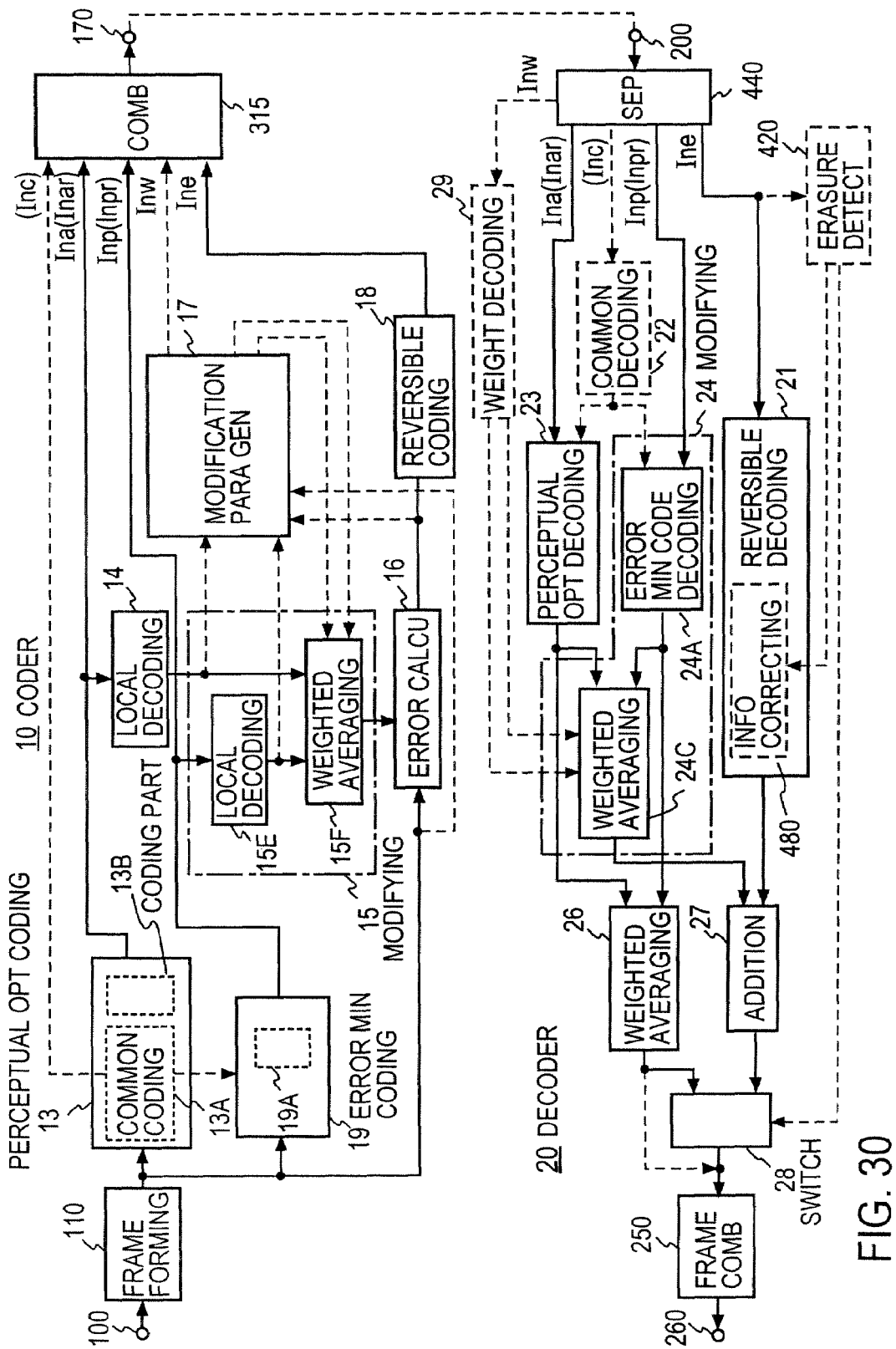
FIG. 30 is a is a block diagram illustrating an example of the functional configuration of Embodiment 9 of the present invention.

FIG. 30 illustrates in block form a ninth embodiment of the present invention. This embodiment differs from the FIG. 27 embodiment in the construction of the modifying part 15 of the coder 10 and in the provision of an error minimization coding part 19 and in the corresponding modifications of the decoder 20.

In the coder 10 the acoustic signal for each frame is subjected to irreversible compression coding in the error minimization coding part 19 in such a manner as to minimize the energy of quantized error, and the error minimized code Inp is output as the irreversibly encoded code. The error minimized code Inp is locally decoded in a local decoding part 15E, and the locally reconstructed signal and that from the local decoding part 14 are applied to a weighted averaging part 15F, which obtains a weighted average of them placing emphasis on the former. An error between the weighted mean locally reconstructed signal and the acoustic signal is calculated in the error calculating part 16, and the error signal is applied to the reversible coding part 18.

The weight in the weighted averaging part 15F is a statistically pre-calculated value such that the error signal from the error calculating part 16 becomes small; it is set to, for example, approximately 0.8 to 0.9 for the locally reconstructed signal of the error minimized code, and around 0.1 to 0.2 for the locally reconstructed signal for the perceptually optimized code. Alternatively, the both locally reconstructed signals and the acoustic signal are input to the modified parameter generating part 17, wherein both weights are determined by solving simultaneous equations so that the error signal from the error calculating part 16 becomes minimum. In this case, the both weights are encoded and a weight code Inw is output. The local decoding part 15E and the weighted averaging part 15F constitute the modifying part 15.

The combining part 320 combines the perceptually optimized code Ina, the error minimized code Inp and the reversibly encoded code Ine, and output a combined output. In case of using the modified parameter generating part 17, the combining part 320 combines the weighted code Inw as well as the above-mentioned codes. The perceptual optimization coding part 13 and the error minimization coding part 19 may sometimes share such parameters as the spectral envelope and power. In such case, as indicated by the broken lines, a common coding part 13A for encoding a parameter common to both of them is placed in the one coding part, in the illustrated example, in the perceptual optimization coding part 13, and the common coding part 13A outputs the parameter as a common code Inc and provides, as required, the extracted common parameter to the other coding part, that is, in the error minimization coding part 19 in this case. Moreover, a coding part 13B placed in the perceptual optimization coding part 13 encodes, for example, waveform information of the input acoustic signal by vector quantization taking the perceptual characteristics into account, and outputs a code Inar. Further, a coding part 19A in the error minimization coding part 19 similarly encodes the waveform information of the acoustic signal as by vector quantization so as to minimize the energy of the quantized error and outputs a code Inpr.

In the decoder 20 the error minimized code Inp separated in the separation part 440 is irreversibly decoded in the error minimized code decoding part 24A, and the decoded signal and the decoded signal from the perceptual optimization coding part 23 are applied to a weighted averaging part 24C, which conducts a weighted addition biased toward the former. The weighted signal is provided to the adding part 27, wherein it is added to the reconstructed error signal from the reversible decoding part 21, and the added signal is applied via the switching part 28 to the frame combining part 250. The weight in the weighted averaging part 24C is set to the same weight as that in the weighted averaging part 15F of the coder 10. When the weight is determined in the modified parameter generating part 17 of the coder 10, the weight code Inw separated in the separation part 440 is decoded in a weight decoding part 29, and the reconstructed weight is supplied to the weighted averaging part 24C. The reconstructed signal of the perceptually optimized code Ina and the reconstructed signal of the error minimized code Inp are applied to another weighted averaging part 26 as well, which obtains a weighted average biased toward the former (Ina decoded signal). The weight for this weighted averaging is fixedly set to about 0.8 to 0.9 for the Ina decoded signal and about 0.2 to 0.9 for the Inp decoded signal. Alternatively, the weight reconstructed in the weight decoding part 29 may be provided to the weighted averaging part 26 in a relation inverse to the weighting in the weighted averaging part 24C.

When the reversibly encoded code Ine is not input or when sufficient information for reconstructing the error signal in the reversible decoding part 21 is not available, the averaged decoded signal from the weighted averaging part 26 is provided as a reconstructed acoustic signal via the switching part 28 to the frame combining part 250. When the common code Inw is separated in the separation part 440, it is decoded in a common decoding part 22. A common reconstructed signal is applied to the perceptual optimization decoding part 23 and the error minimized code decoding part 24A. These decoding parts 23 and 24A are supplied with the codes Inar and Inpr, respectively, and provide desired decoded signals. The error minimized code decoding part 24A and the weighted averaging part 24C constitute the modifying part 24.

Embodiment 10

Figure 31:
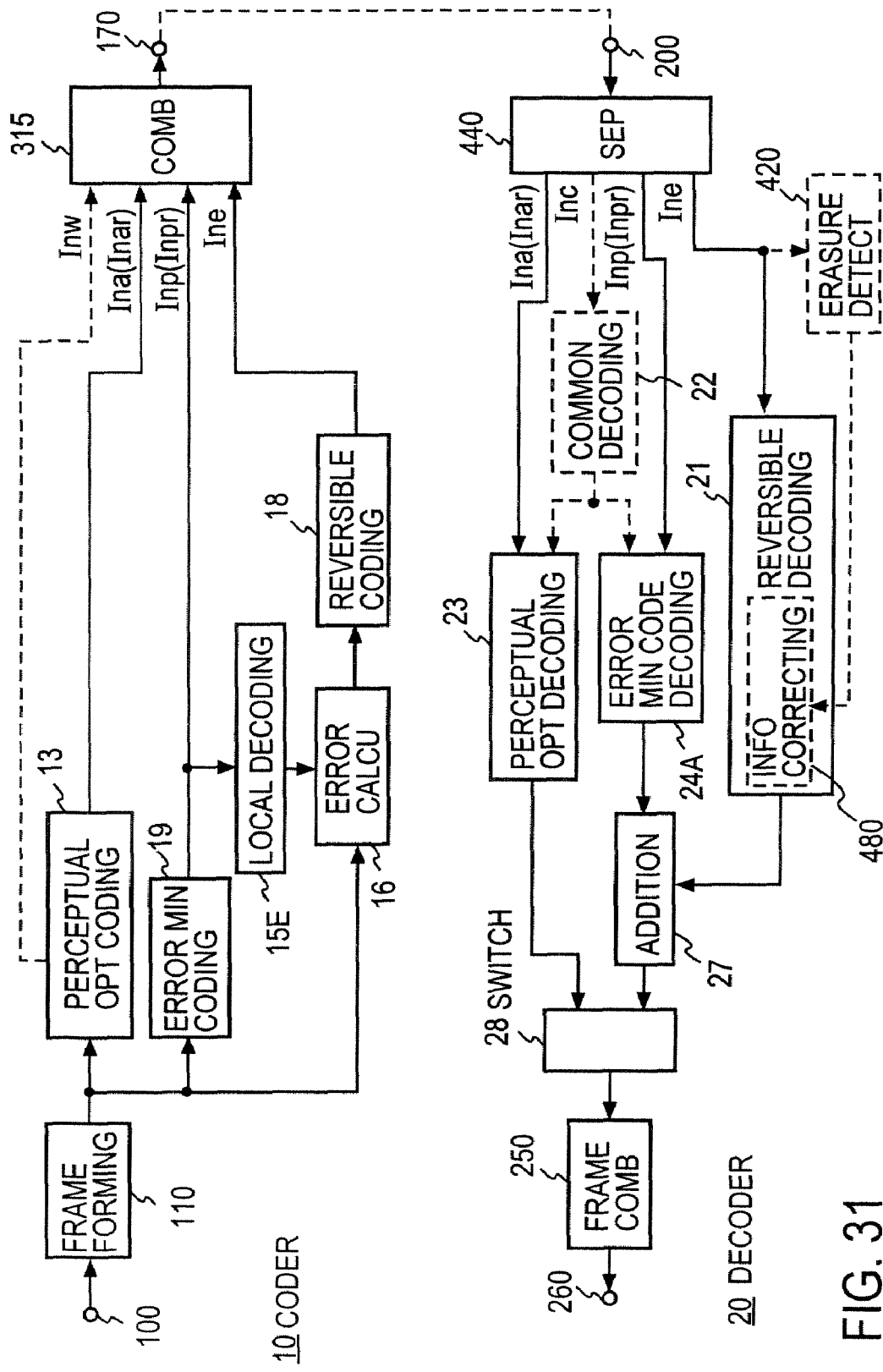
FIG. 31 is a block diagram illustrating an example of the functional configuration of Embodiment 10 of the present invention.

FIG. 31 illustrates in block form a tenth embodiment of the present invention, in which the parts corresponding to those in FIG. 30 are identified by the same reference numerals. In the coder 10 of this embodiment, the locally reconstructed signal for the error minimized code Imp is applied directly to the error calculating part 16 from the local decoding part 15E. Accordingly, the perceptually optimized code Ina is not locally decoded, but instead the result of local decoding of the error minimized code Inp is used for the error calculation in the error calculating part 16. As the case with Embodiment 9, this embodiment may also be adapted so that one of the perceptual optimization coding part 13 and the error minimization coding part 19 extracts parameters common to both of them for their coding and that they output the common code Inw and the codes Inar and Inpr of their own.

In the decoder 20 the decoded signal from the error minimized code decoding part 24A is applied directly to the adding part 27, wherein it is added to the reconstructed error signal from the reversible decoding part 21. The switching part 28 switches between the perceptually optimized code decoding part 23 and the adding part 27 and applies the reconstructed signal from the former or the added signal from the later as the reconstructed acoustic signal to the frame combining part 250. The operation in the case of the common code Inc being separated in the separation part 440 is the same as described previously with reference to FIG. 30.

Embodiment 11

Figure 32:
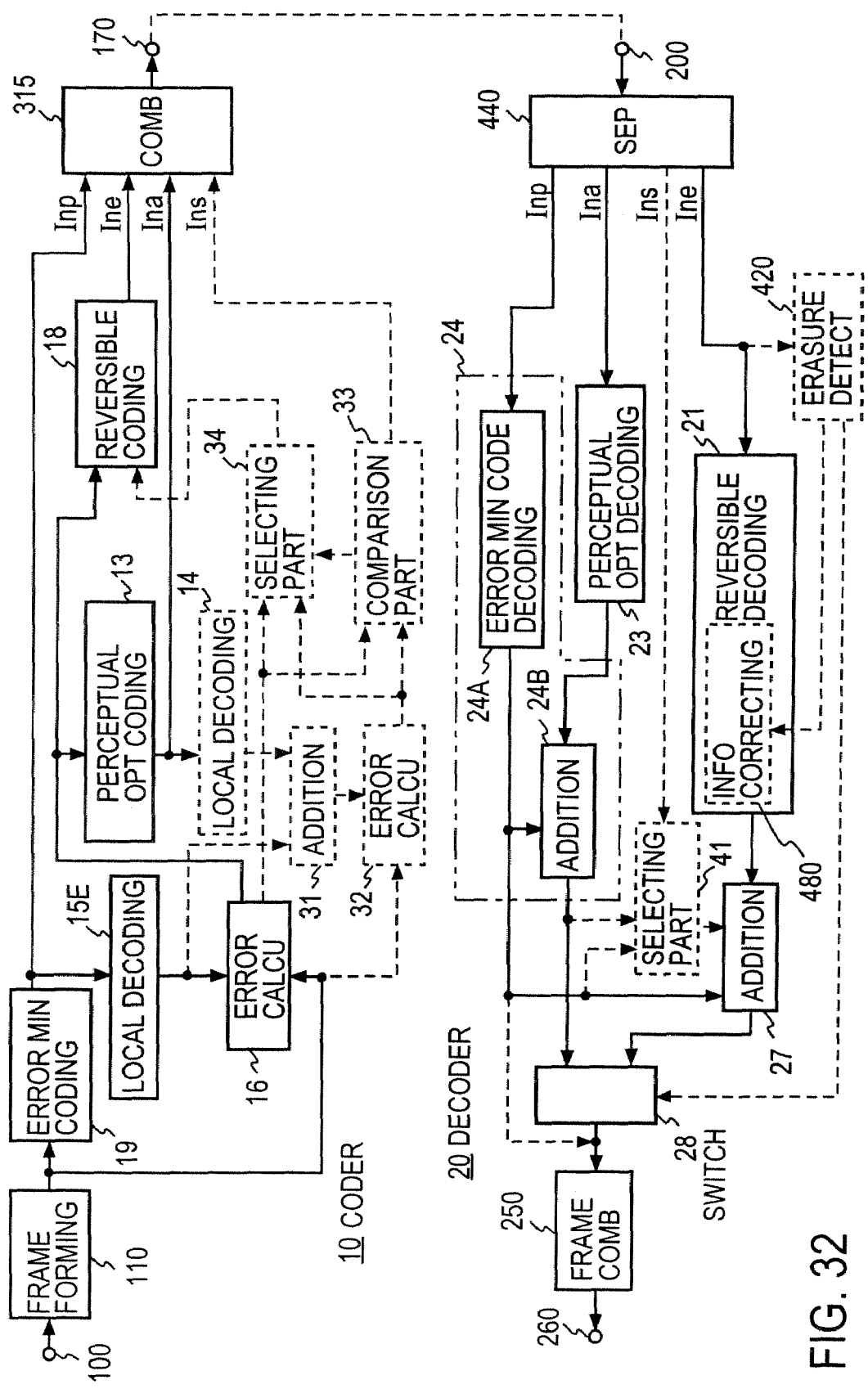
FIG. 32 is a block diagram illustrating an example of the functional configuration of Embodiment 11 of the present invention.

FIG. 32 illustrates in block form an eleventh embodiment of the present invention, in which the parts corresponding to those in FIG. 30 are identified by the same reference numerals. In the coder 10 of this embodiment: the perceptual optimization coding part 13 in the FIG. 30 embodiment is connected to the output side of the error calculating part 16;

the error between the locally reconstructed signal of the error minimized code Inp from the local decoding part 15E and the acoustic signal is calculated in the error calculating part 16; the error signal is subjected to lossy compression coding in the perceptual optimization coding part 13 in a manner to minimize perceptual distortion; and this lossy code is output as the perceptually optimized code Ina. In the combining part 320 the error minimized code Inp, the perceptually optimized code Ina and the lossless code Ine are combined, and the combined output is provided.

In the decoder 20 the separated perceptually optimized code Ina is subjected to lossy decoding in the perceptual optimization decoding part 23, and this lossy decoded signal and the reconstructed signal of the error minimized code Inp by the error minimized code decoding part 24A are added in an adding part 24B. The reconstructed signal of the error minimized code Inp and the lossless reconstructed signal of the lossless code Ine, that is, the reconstructed error signal, are added together in the adding part 27, from which the added signal is applied as a reconstructed acoustic signal to the frame combining part 250 via the switching part 28. When no error signal is reconstructed in the lossless decoding part 21, the added reconstructed signal from the adding part 24B is supplied as the reconstructed acoustic signal to the frame combining part 250 via the switching part 28.

This embodiment is also common to the eighth to tenth embodiments in that the lossless coding part 18 uses, for the lossless compression coding, a quantization sequence which minimizes the energy of the quantized error and that when only information for the lossy compression coding is available, use is made of the result of quantization which minimizes perceptual distortion. In this embodiment, however, the quantization for minimizing perceptual distortion is further carried out in the perceptual optimization coding part 13, that is, multi-stage quantization is performed. This increases the number of coded bits as a whole but achieves improvement in terms of auditory sensation and provides increased efficiency in the optimization of distortion energy, too, as compared with the use of the locally reconstructed signal at the first stage, that is, the locally reconstructed signal of the error minimized code Inp from the local decoding part 15E. For optimization of distortion energy, it is advisable to use the more efficient scheme.

The scheme in this case will be described below in respect of the broken-lined configuration in FIG. 32. The code Ina from the perceptual optimization coding part 13 is locally decoded in the local decoding part 14, and the locally reconstructed signal is applied to an adding part 31, wherein it is added to the code Inp from the local decoding part 15E. The error between the added locally reconstructed signal and the acoustic signal is calculated in an error calculating part 32. The error signal and the error signal from the error calculating part 16 are compared in a comparison part 33, and the smaller one of them is selected in the select part 34 and supplied to the reversible coding part 18. At this time, a select code Ins is output which indicates which of the error signals has been selected.

In the decoder 20 a select part 41 is controlled by a select signal Ins separated in the separation part 440. When the error signal from the error calculating part 16 is selected in the coder 10, the reconstructed signal from the error minimized code decoding part 24A is selected and applied to the adding part 27. When the error signal from the error calculating part 32 is selected in the coder 10, the added reconstructed signal from the adding part 24B is selected and applied to the adding part 27.

Figure 33:
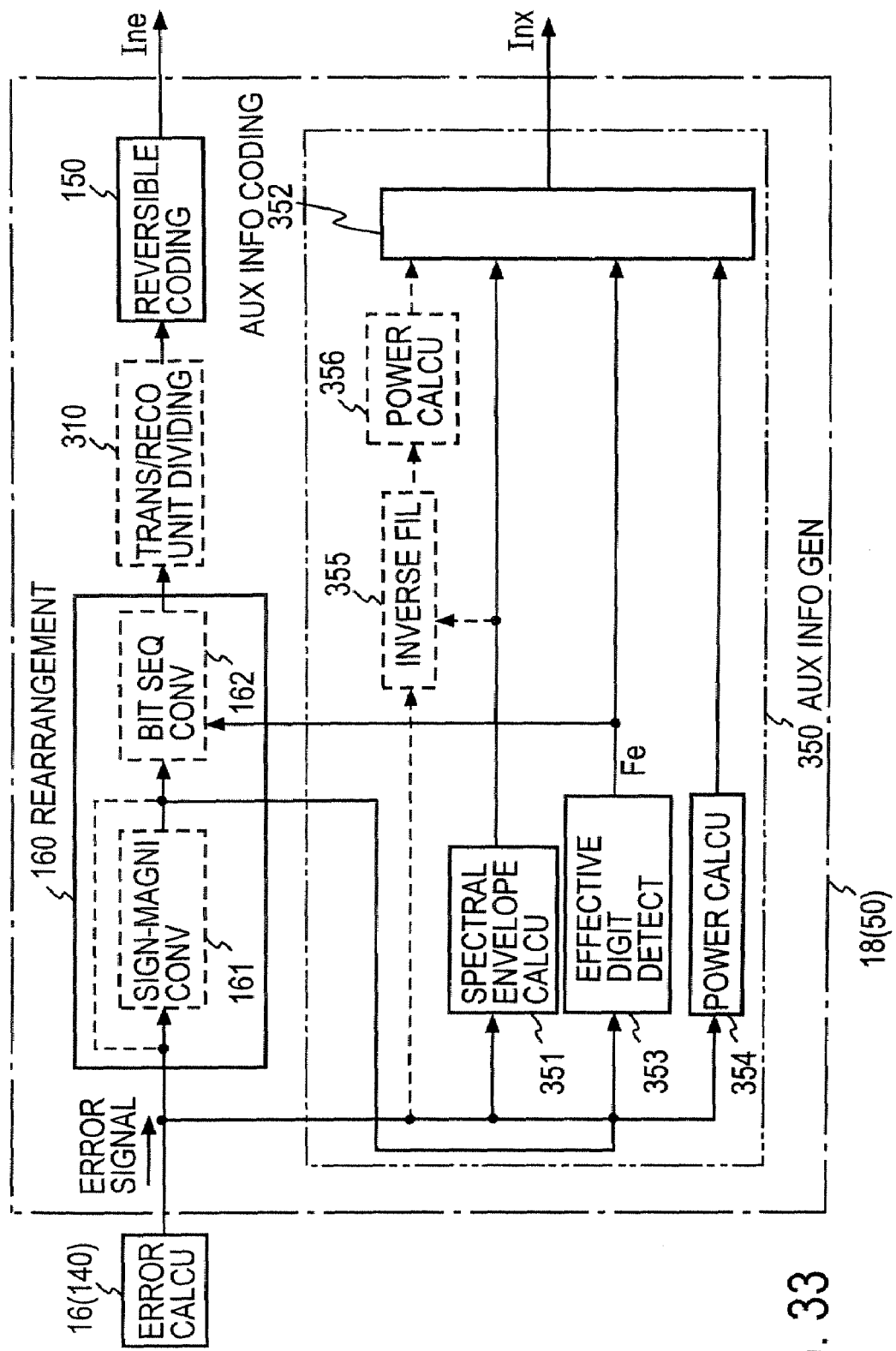
FIG. 33 is a block diagram depicting an example of the functional configuration of a reversible coding part 18 in FIG. 32.

FIG. 33 illustrates in block form a concrete example of the reversible coding part 18 used in FIGS. 27 to 32. The illustrated configuration is substantially the same as that shown in FIG. 14 which is composed of the rearrangement part 160, the transmission/recording unit separation part 310, the lossless coding part 150 and the auxiliary information generating part 350. The error signal from the error calculating part 16 is applied to the rearrangement part 160 and the auxiliary information generating part 350. In the effective digit number detecting part 353 of the auxiliary information generating part 35 the digit number, which represents the maximum value of the absolute value of the error signal for each frame, is detected as the effective digit number Fe. As described previously with reference to FIGS. 15A and 15B, bits of respective samples (amplitude bit sequences) of the error signal at the bit positions common thereto, only in the portion or range defined by the effective digit number, are concatenated across the frame to form equi-position bit sequences.

The equi-position bit sequences from the rearrangement part 169 are separated by the transmission/recording unit separating part 310 to pieces of transmission unit or recording unit data. Each of the separated pieces of transmission/ recording unit data is, if necessary, subjected to lossless compression coding in the lossless coding part 150, from which it is output as the error code Ine.

On the other hand, the effective digit number Fe detected in the effective digit number detecting part 353 is provided to the auxiliary information coding part 352. In this embodiment, the error signal sample sequence is provided to the spectral envelope calculating part 351, wherein it is subjected to, for example, linear prediction coding analysis for each frame, and the spectral envelope parameters LPC are obtained as linear prediction coefficients. And the average power of the error signal for each frame is calculated in the power calculating part 354. Alternatively, the error signal is input to the inverse filter 355 formed based on the linear prediction coefficients calculated in the spectral envelope calculating part 354, by which the spectral envelope of the error signal is flattened, and the average power of the flattened signal is calculated in the power calculating part 356. These effective digit number Fe, linear prediction coefficients LPC and average power are encoded with low bits, for example, approximately 30 to 50 bits in the auxiliary information coding part 352, from which auxiliary information Inx is provided. The auxiliary information Inx encoded from the effective digit number, the spectral envelope parameters and the average power is fed to the combining part 420 (FIGS. 27 and 29 to 32), wherein it is added to a representative packet of each frame or added in a packet having loaded therein the transmission/recording unit data containing the sign bit and from which it is output as such or as an independent packet.

Figure 34:
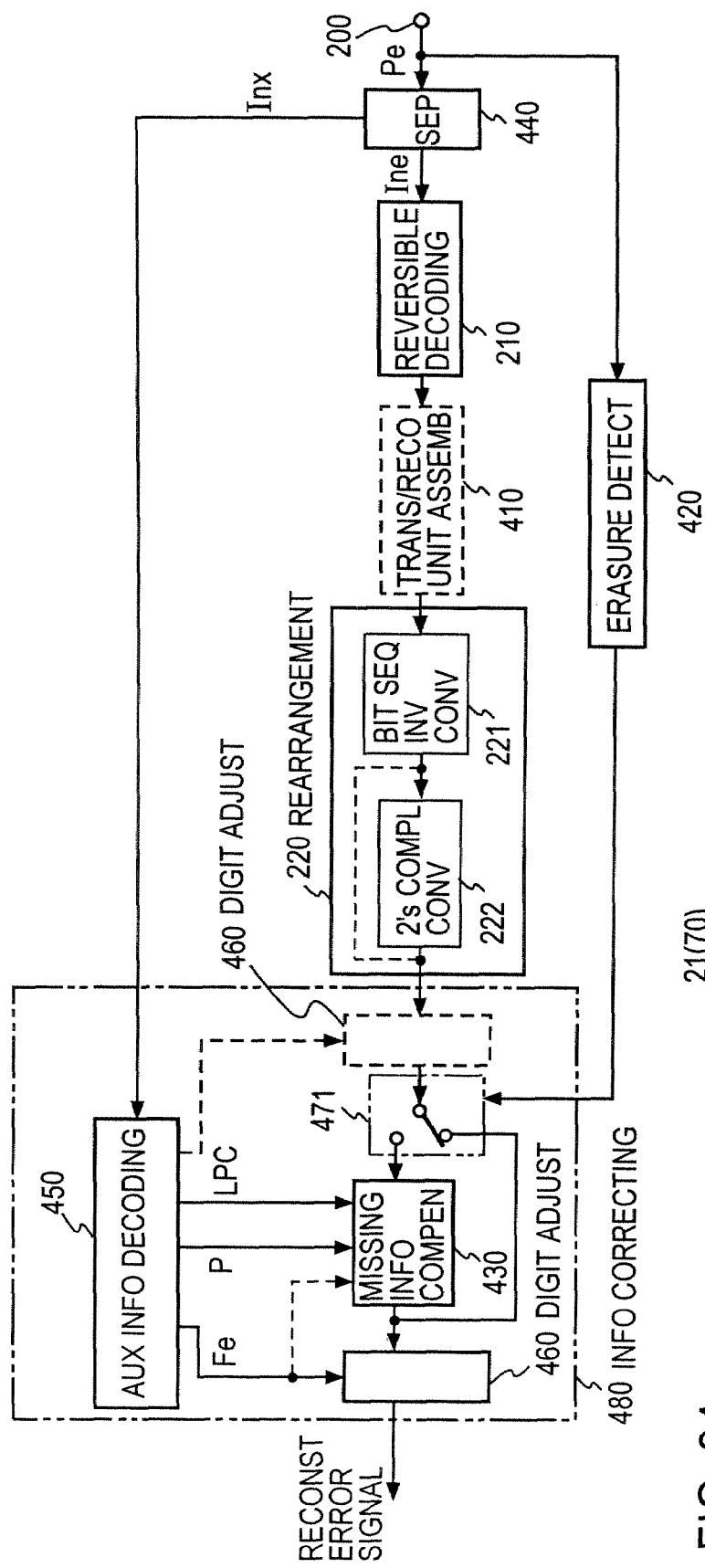
FIG. 34 is a block diagram depicting an example of the functional configuration of a reversible decoding part 21.

FIG. 34 illustrates in block form a concrete example of the lossless decoding part 21 of the decoder 20, together with the information correcting part 480. In the separating part 440 the auxiliary information Inx and the error code Ine are separated from the input packet Pe. The error code Ine is provided to the lossless decoding part 210, and the auxiliary information Inx is provided to the auxiliary information decoding part 450. The auxiliary information decoding part 45 decodes the effective digit number Fe, the spectral envelope coefficients LPC and the average power of the frame concerned, and provides the effective digit number Fe to the digit adjusting part 460 and the spectral envelope parameters and the average power to the missing information compensating part 430. Since the operations of these respective parts have already been described with reference to the FIG. 14 embodiment, no description will be repeated.

Figure 35A:
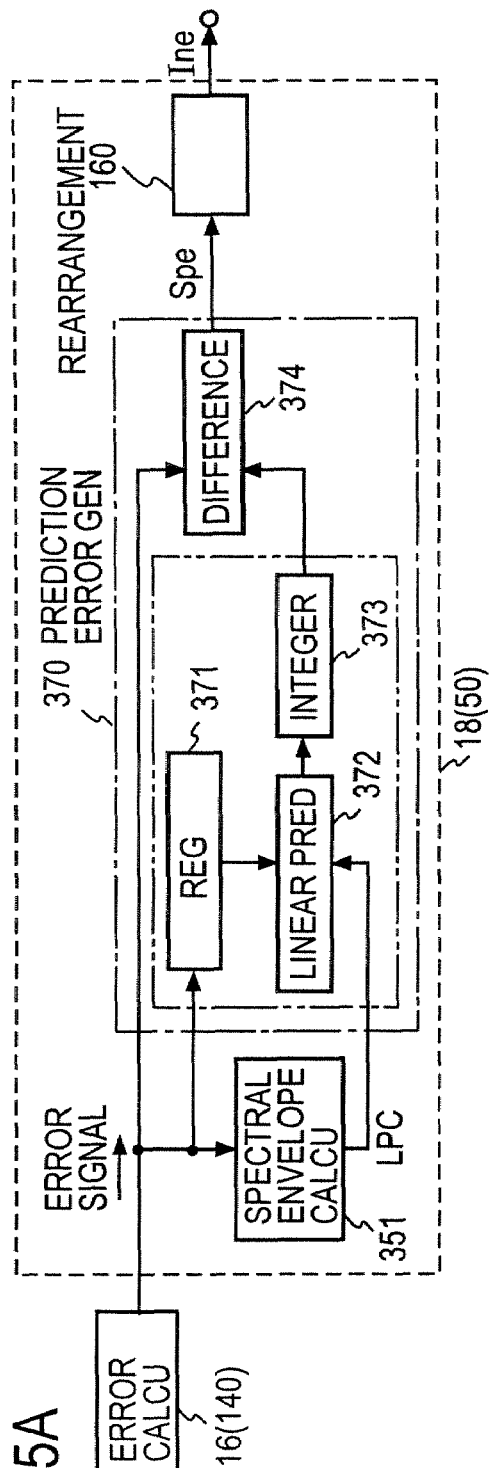
FIG. 35A is a block diagram depicting an other example of the functional configuration of a reversible coding part 18.

The lossless coding part 18 of the coder 10 in the embodiments of FIGS. 27 to 32 may also be adapted to further perform prediction processing for the error signal. An example of its configuration is shown in FIG. 35A. The error signal is applied to the spectral envelope calculating part 351, which calculates the linear prediction coefficients LPC representing the spectral envelope of the error signal. On the other hand, the error signal is applied to the prediction error generating part 370, from which the prediction error signal Spe if provided. For example, a plurality of immediately preceding error signal samples from the error calculating part 16 are supplied from the register 371 to the linear prediction part 372, wherein they are multiplied by the linear prediction coefficients LPC representing the spectral envelope from the spectral envelope calculating part 351 to obtain a linear prediction value. The linear prediction value is fed to the integer part 373, wherein it is put to an integral value. The difference between the integral prediction value and the current sample of the error signal from the error calculating part 16 is calculated in the difference circuit 374 to obtain the prediction error signal Spe. The prediction error signal Spe is input to the rearrangement part 160.

Figure 35B:
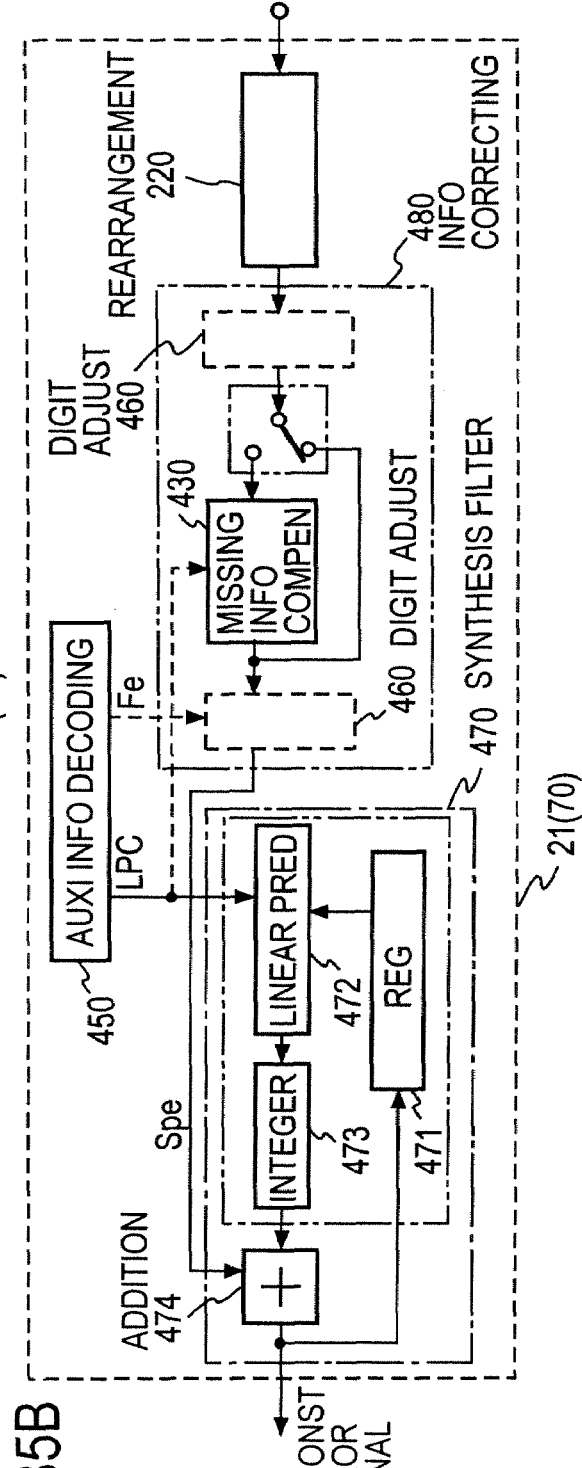
FIG. 35B is a block diagram depicting an other example of the functional configuration of a reversible decoding part 21.

FIG. 35B depicts an example of the configuration of the lossless decoding part 21 of the decoder 20 in the case of applying the FIG. 35A configuration to the lossless coding part 18 of the coder 10. The illustrated configuration identical with that composed of the rearrangement part 220, the missing information compensating part 430, the auxiliary information decoding part 450 and the synthesis filter 470 in the decoder 20 shown in FIG. 21. The reconstructed prediction error signal Spe from the information correcting part 480 is applied to the synthesis filter 470, wherein it is subjected to processing inverse to that in the prediction error generating part 370 of the lossless coding part 18 in FIG. 35A. That is, a predetermined constant number of immediately preceding reconstructed samples are input from the register 471 to the linear prediction part 472, wherein they are respectively multiplied by weights based on the linear prediction coefficients LPC decoded in the auxiliary information decoding part 450, and the sum of the results of multiplication is obtained as a predicted value of the current decoded sample. The predicted value is put to an integral value in the integer part 473. The integral predicted value and the current prediction error signal from the information correcting part 480 are added together in the adding part 474, whose output is used as the output fro the synthesis filter 470, that is, as the reconstructed error signal.

Embodiment 12

While the embodiments described above are directed to the coder and the decoder for the one-channel digital input signal, the embodiment are applicable as well to multi channel signals. There have been developed several compression coding schemes for multi-channel signals, such as AC-3 (Audio Coding by Dolby, Inc. etc.) and AAC (Advanced Audio Coding by Dolby, Inc. etc.) With these conventional schemes, perceptual distortion can be reduced substantially but the waveform appreciably differs from that of the original waveform. When multi-channel signals are transmitted intact in a PCM (Pulse Code Modulation) form, the original sound can completely be reconstructed, but a large amount of information is necessary. Further, no sound can be reconstructed by some part of its code sequence, and on this account, in the case of packet transmission of the PCM signal, a packet erasure seriously contributes the deterioration of the sound quality.

It is possible to enhance the coding efficiency by mixing multi-channels signals to reduce the number of channels for coding. In this case, however, the original multi-channel signals cannot be reconstructed correctly.

This embodiment offers multi-channel signal coding and decoding methods and a coder and a decoder therefor, which: mix digital signals of plural channels and encode them into digital signals of a smaller number of channels; increases the coding efficiency, enables original digital signals of plural channels to be reconstructed with high fidelity; permit selection of the bit rate over a wide range; and allow selection of the number of channels over a wide range.

Figure 36:
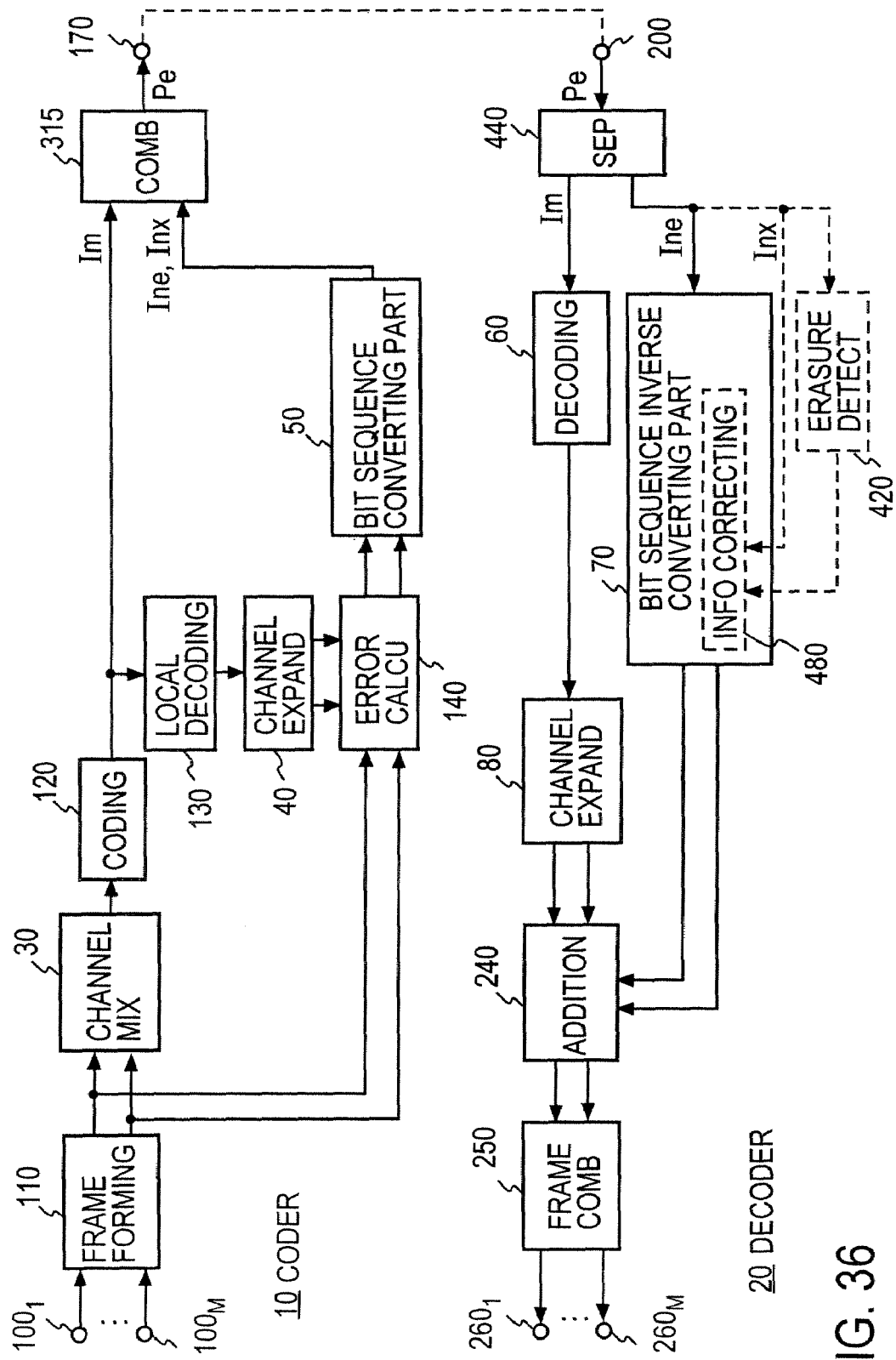
FIG. 36 is a block diagram illustrating an example of the functional configuration of Embodiment 12 of the present invention.

FIG. 36 illustrates in block form a coder and a decoder according to this embodiment. In the coder 10, digital signals of M (M being an integer equal to or greater than 2) channels are input to the frame forming part 110 via terminals $100_1$ to $100_M$, wherein they are separated for each frame, for example, every 1024 samples. The digital signals separated are applied to a signal mixing part 30, wherein they are mixed with digital signals of M channels smaller in number than M. N is an integer equal to or greater than 1, and N<M. The mixed N-channel signals are subjected to lossy or lossless compression coding in a coding part 120, from which a main code Im is output. This coding may preferably be high-compression-ratio coding. The main code Im is decoded in a local decoding part 130, from which a locally reconstructed signal is provided. This locally reconstructed signal is applied to a channel expansion part 40, wherein it is converted to locally reconstructed signals of the original M channels. This locally reconstructed signals for the code Im can be obtained in the coding part 120 due to its analysis-by-synthesis coding scheme.

In the signal mixing part 30 an average signal of those of first four of, for example, eight channels may be used as a left-channel signal and an average signal of those of the other four channels may be used as a right-channel signal. Alternatively, an average signal of two-channel signals is used as a one-channel monaural signal.

In the channel expansion part 40 the locally reconstructed signal is converted to signals of the original channels. The locally reconstructed signals of the increased number of channels have some information of the input digital signals lost due to reduction in the number of channels in the mixing part 30. The missing signals are calculated as error signals in an error calculating part 134 which is supplied with the M-channel digital signals branched from the frame forming part 110 and the M-channel locally reconstructed signal. The error signals are applied to a bit sequence converting part 50, wherein they are subjected to bit sequence rearrangement and compression coding, and from which an error code Ine and an auxiliary information code Inx are output. Although a concrete configuration and processing of the bit sequence converting part 50 will be described, it is equipped with at least the rearrangement part 160 for conversion to equiposition bit sequences as described previously with reference to FIG. 4A and FIGS. 15A and 15B. The error code Ine and the auxiliary information Inx from the bit sequence converting part 50 and the main code Im from the coding part 120 are combined in the combining part 320, from which the combined output is provided. When the combined output is sent out as a packet Pe, it is added with the header 31 referred to previously in connection with FIG. 4B.

In the decoder 20 the input packet P2 is separated by the separating part 440 to the main code Im, the error code Ine and the auxiliary information Inx in this case. The main code Im is decoded in a decoding part 60 by a decoding scheme corresponding to the coding scheme of the coding part 120 in the coder 10. The decoded signals from the decoding part 120 are provided to a channel expansion part 80, wherein they are converted from the N-channel decoded signals to M-channel decoded signals.

The error code Ine is processed in a bit sequence inverse conversion part 70 to reconstruct the M-channel error signals. Although the configuration and operation of the bit sequence inverse conversion part 70 will be concretely described, it is equipped with at least the rearrangement part 220 referred to previously with reference to FIGS. 4A, 15A and 15B, and reconstructs error signals each composed of amplitude bit sequences. The auxiliary information Inx is decoded in the information correcting part 440, and when a packet erasure is detected in the erasure detecting part 420, the reconstructed error signal is corrected in the information correcting part 480 based on the auxiliary information.

The reconstructed M-channel error signals and the reconstructed signals of increased M channels are added for channel in the adding part 240, from which the added outputs are provided as reconstructed digital signals of M channels to the frame combining part 250, from which frame-concatenated digital signals of the respective channels are output.

With the above-described configuration, when the main code Im, the error code Ine and the auxiliary information Inx are input to the decoder 20 with erasure of a number small enough to obtain the reconstructed signal and the reconstructed error signal, the original M-channel digital signals can be reconstructed with high fidelity. The coding efficiency can be changed, as required, by selecting the number of channels to be decreased in the signal mixing part 30. When no packet is input or when no sufficient amount of information for reconstructing the error signal is available, it is possible to obtain signals of appreciable quality by applying the M-channel reconstructed signals as reconstructed digital signals to the frame combining part 250 from the channel expansion part 80.

In the FIG. 36 embodiment the mixing operation in the signal mixing part 30 may be performed in a plurality of stages. An example will be described below with reference to FIG. 37, in which the parts corresponding to those in FIG. 36 are identified by the same reference numerals. In this example, signal mixing takes place in two stage, that is, in signal mixing parts 30 and 41. For instance, original M=8 channel stereo digital signals are mixed with N=2 channel or N=4 channel stereo digital signals, and the thus mixed stereo digital signals are mixed with L=1 channel monaural digital signals. The mixed signal from the signal mixing part 41 is encoded in the coding part 120, from which the main code Im is output.

The main code Im is reconstructed in the local decoding part 130, and the locally reconstructed signal is provided to the channel increasing part 42, wherein it is converted from L to N channels. The error signal between the N-channel locally reconstructed signals and the N-channel digital signals from the signal mixing part 30 are calculated in an error calculating part 120. The error signals are subjected to lossy or lossless, preferably, high-compression-ratio coding in a coding part 44, from which they are output as a sub-code Ie.

The sub-code Ie is decoded in a local decoding part 45 into N-channel locally reconstructed signals, which are added to the N-channel locally reconstructed signals from the signal mixing part 42 in an adding part 46. The added N-channel locally reconstructed signals are converted to M-channel added locally reconstructed signals in the channel expansion part 40. Error signals between the M-channel added locally reconstructed signals and the M-channel digital signals from the frame forming part 110 are calculated in the error calculating part 140, from which the error signals are provided to the bit sequence converting part 50. The error code Ine and the auxiliary information Inx from the bit sequence converting part 50, the main code Im from the coding part 120 and the sub-code Ie from the coding part 44 are combined in the combining part 320, from which they are output as a packet.

In the decoder 20 the main code Im and the sub-code Ie separated by the separating part 440 are reconstructed in decoding parts 60 and 61, respectively, and the error code Ine is fed to the bit sequence inverse conversion part 70, wherein it is inversely rearranged to reconstruct the error signals. The L-channel reconstructed signal from the decoding part 60 is converted to N-channel reconstructed signals in the channel expansion part 80. The N-channel reconstructed signals and the N-channel reconstructed signals from the decoding part 61 are added together in an adding part 62. The N-channel added reconstructed signals are converted to M-channel reconstructed signals in a channel increasing part 63, and the N-channel reconstructed signals and the M-channel error signals are added together in the adding part 240, from which reconstructed digital signals are applied to the frame combining part 250.

In this instance, the bit rate can be chosen over an approximately 60-fold range from 8 kbit/s to 5 Mbit/s.

Figure 37:
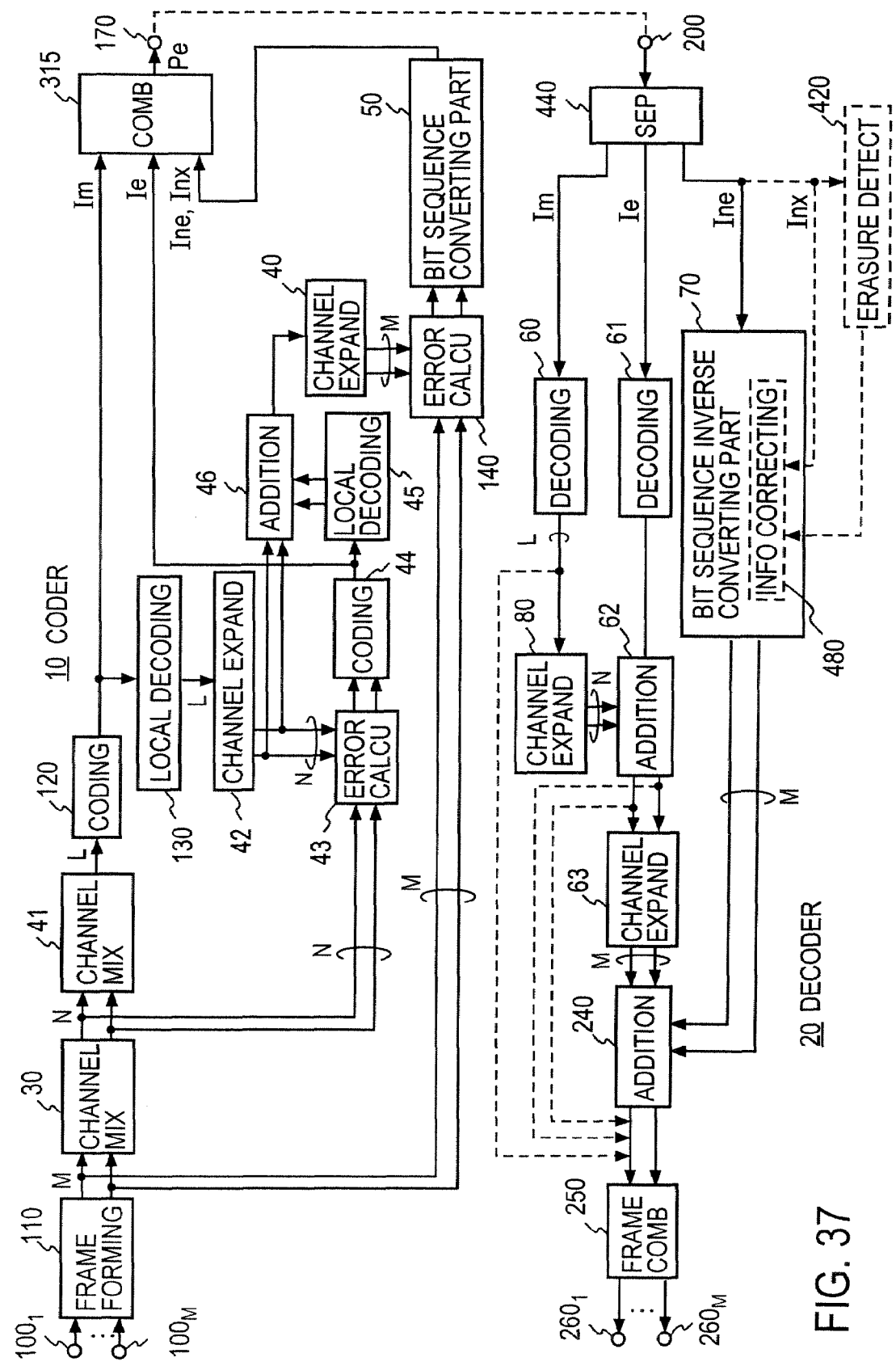
FIG. 37 is a block diagram illustrating a modified form of Embodiment 12.

In FIGS. 36 and 37, in the case of generating the packet Pe in the combining part 320, it is preferable that the highest priority level be given to the packet containing the main code Im. The packet containing sub-code Ie is assigned the highest priority level next to the packet containing the main code Im.

The lossless coding part 18 described previously with reference to FIG. 33, for instance, can be used intact as the bit sequence converting part 50 in the coder 10. In such a case, the bit sequence inverse conversion part 70 in the decoder 20 may be identical in construction with the lossless decoding part 21 described previously in respect of FIG. 34, for example.

Alternatively, the lossless coding part 18 in FIG. 35A may be used as the bit sequence converting part 50. In this instance, the bit sequence inverse conversion part 70 in the decoder 20 may be identical in construction with the lossless decoding part 21 in FIG. 25B, for instance.

Embodiment 13

When multi-channel signals are transmitted intact in PCM (Pulse Code Modulation) form, the original sound can completely be reconstructed, but a large amount of information is necessary. Further, no sound can be reconstructed by some part of its code sequence, and on this account, in the case of packet transmission of the PCM signal, a packet erasure contributes serious degradation of sound quality.

This embodiment is intended to offer coding and decoding methods, a coder and a decoder that make multi-channel digital signals insusceptible to the influence of information erasure and make it possible to select the degree of information compression over a relatively wide range.

Figure 38:
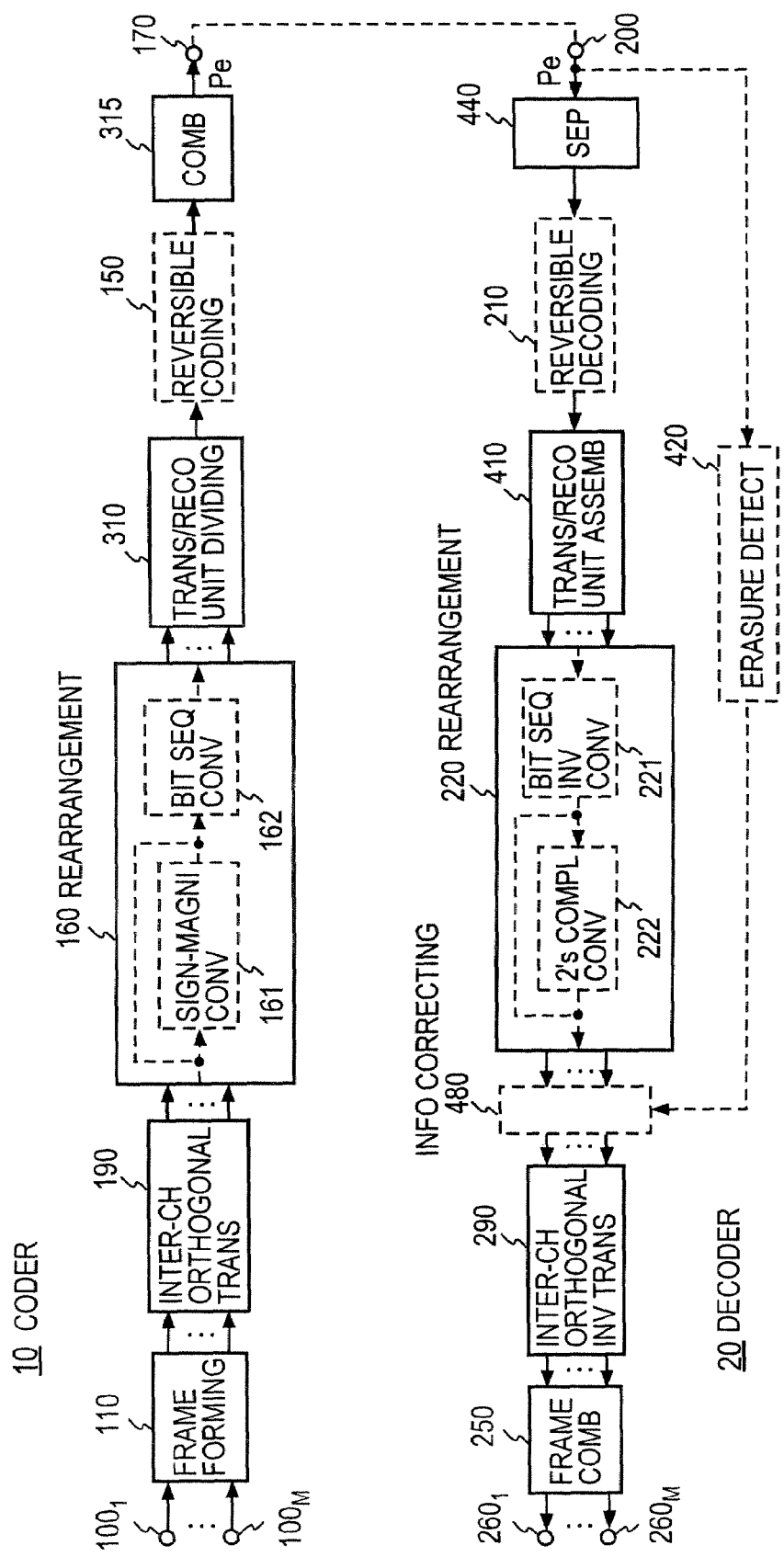
FIG. 38 is a block diagram illustrating an example of the functional configuration of Embodiment 13 of the present invention.

Turning to FIG. 38, a description will be given of the coder 10 and decoder 20 according to this embodiment.

In the coder 10, M (where M is an integer equal to or greater than 2) digital signals are input via input terminals $100_1$ to $100_M$ to the frame forming part 110, wherein they are separated for each frame, for example, every 1024 samples.

These digital signals of every M frames are subjected to inter-channel orthogonal transformation in an inter-channel orthogonal transform part 190, from which orthogonal-transformed signals are provided. That is, samples of M digital signals at the same point in time are orthogonally transformed. When lossless transformation using an integral value is applied to the inter-channel orthogonal transformation, it is possible to achieve lossless coding as a whole.

The orthogonal-transformed signals are input to the rearrangement part 160. In the rearrangement part 160 the same bit positions (digits) of respective samples of each frame are arranged in a temporal order for each component (for example, L+R and L−R) of the orthogonal-transformed signals throughout the frame to form equi-position bit sequences).

The equi-position bit sequences from the rearrangement part 160 are separated into pieces of transmission unit or recording unit data in the transmission/recording unit separating part 310. These separated piece of transmission/recording unit data are, if necessary, subjected to lossless coding in the lossless coding part 150, and in the combining part 320 they are added with a header so that during decoding the separated pieces of transmission/recording unit data can be reconstructed as one frame, and they are provided as packets Pe to the output terminal 170. Incidentally, the coding in the lossless coding part 150 is the same as the lossless coding in the prior art. In the case of giving priorities to the packets Pe, they are assigned priorities in descending order of the energy of the component of the orthogonal-transformed signal; for example, the packet containing the component L+R is given the highest priority and the packets containing the sign bit and the corresponding transmission/recording unit data on the MSB side are higher priorities.

In the decoder 20, the packets Pe input thereto via the input terminal 200, if containing auxiliary information, are each separated by the separating part 440 to the auxiliary information, and the transmission/recording unit data (containing the sign bit sequence). The transmission/recording unit data, if lossless-encoded, is provided to the lossless decoding part 210, where it is lossless-decoded, thereafter being a transmission/recording unit assembling part 410. In the transmission/recording unit assembling part 410, the pieces of transmission/recording unit data of one frame are assembled from one or more packets based on their packet numbers; they are assembled for each component of the orthogonal-transformed signals. The assembled data is provided to the rearrangement part 220, wherein equi-position bit sequences are converted to amplitude bit sequences of one frame, that is, sample sequences (waveform) of one component of the orthogonal-transformed signals. No description will be given of the operations of the rearrangement parts 160 and 220 since they have been described previously in detail with reference to FIGS. 4A, 15A and 15B. In the absence of a packet erasure, the rearrangement part 220 outputs orthogonal-transformed signals exactly identical with those input to the rearrangement part 160 of the coder 10.

In an inter-channel inverse orthogonal transform part 290, each component of the input reconstructed orthogonal-transformed signals is subjected to transformation inverse to the orthogonal transformation in the inter-channel orthogonal transform part 190, thereby reconstructing the M-channel digital signals. The M-channel digital signals reconstructed for each frame are successively outputted for each channel from the frame combining part 250, to output terminals $260_1$ to $260_M$, respectively.

In this way, the M-channel digital signals can be transmitted or recorded by their inter-channel orthogonal transformation. It is possible to obtain reconstructed signals of relatively high quality by: packetizing in terms of transmission/recording unit; increasing priority as the energy becomes larger or as MSB is approached; and using packets of high priority when the channel capacity or storage capacity is small. Further, as described later on, compensation for information lost by a packet erasure permits reconstruction of multi-channel digital signals of better quality.

In the above, the lossless coding part 150 and the lossless decoding part 210 may be omitted.

Embodiment 14

When such a transform scheme as DFT or DCT is used for the inter-channel orthogonal transform, the reconstructed digital signals differ from the original digital signal even if orthogonal-transformed signals are subjected to the inter-channel inverse orthogonal transform. Further, only part of orthogonal transform coefficient, that is, only a component of large energy, for example, only L+R, may sometimes be required to output as a packet. This embodiment is intended to deal with these problems.

Figure 39:
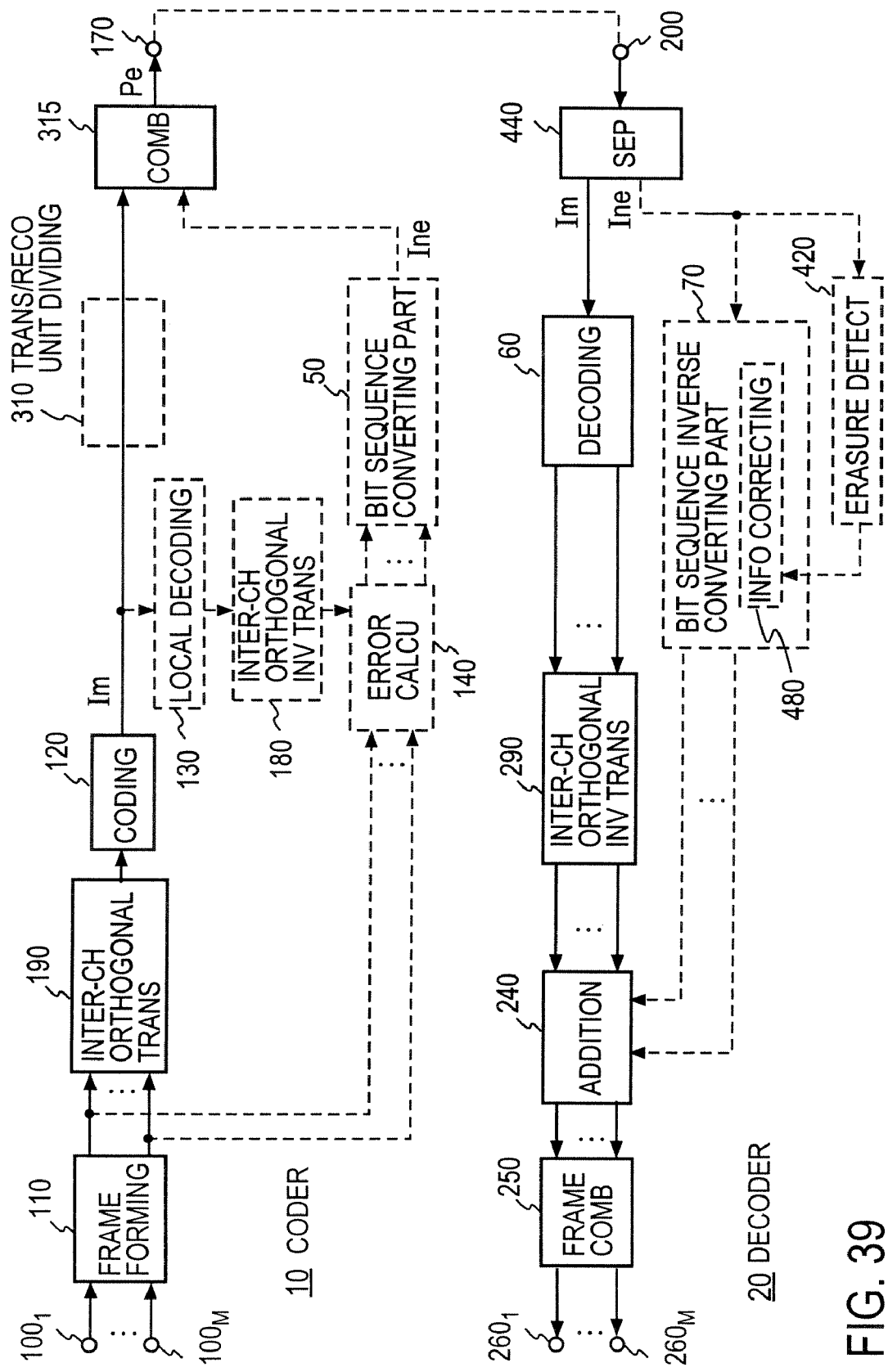
FIG. 39 is a block diagram illustrating an example of the functional configuration of Embodiment 14 of the present invention.

FIG. 39 illustrates in block form a fourteenth embodiment of the invention. This embodiment differs from the FIG. 39 embodiment in that all or some components of the orthogonal-transformed signal from the inter-channel orthogonal transform part 190, that is, components of large power, are subjected to lossless coding in the coding part 120, from which the main code Im is output. The code from the coding part 120 is decoded in a local decoding part 130 to generate a locally reconstructed signal. The locally reconstructed signal for the code Im can be obtained in the coding part 120 due to its analysis-by-synthesis coding scheme. In an inter-channel orthogonal inverse transform part 180 the locally reconstructed signal is transformed inversely to that in the inter-channel orthogonal transform part 190, by which digital locally reconstructed signals of a plurality of channels are produced. Error signals between the locally reconstructed signals of the respective channels and the digital signals of the corresponding channels, which are provided from the frame forming part 110, are calculated in the error calculating part 140. In a bit sequence converting part 50 the calculated error signals are subjected to processing of the rearrangement part 160, the transmission/recording unit separating part 310 and the lossless coding part 150.

The main code Im from the coding part 120 is separated by the transmission/recording unit separating part 310 to transmission/recording unit, and in the combining part 250 the transmission/recording unit and the error code Ine from the bit sequence converting part 50 are combined, and the combined output provided as the packet Pe as required. Incidentally, the bit sequence converting part 50 needs only to be provided with at least the rearrangement part 160 in FIG. 38 and needs not to perform the processing of the transmission/recording unit separating part 310 and the lossless coding part 150. In this case, the main code Im is not subjected to the processing of the transmission/recording unit separating part 310. When the main code Im and the error code Ine are output as packets from the combining part 320, the highest priority level is given to the packet containing the main code Im.

In the decoder 20, the main code Im and the error code Ine are separated in the separating part 440. The main code Im is subjected to lossless decoding in the decoding part 60, and the reconstructed signals are subjected to inter-channel orthogonal inverse transformation in the inter-channel orthogonal inverse transform part 290 through the same processing as in that the inter-channel orthogonal inverse transform part 180 of the coder 10.

On the other hand, the error code Ine is input to the bit sequence inverse conversion part 70, which performs the processing of the lossless decoding part 210, the transmission/recording unit assembling part 410 of the decoder 20 in FIG. 38, reconstructing the error signal sample sequences. In this instance, however, it is sufficient only to perform at least the processing in the rearrangement part 220, and it is not always necessary to perform the processing of the lossless decoding 210 and the transmission/recording unit assembling part 410 in correspondence to the associated operations on the part of the coder 10.

These reconstructed error signals and the inversely transformed signals from the inter-channel orthogonal inverse transform part 290 are added for each channel in the adding part 240 to obtain reconstructed digital signals of the respective channels, which are applied to the frame combining part 250.

Even if part of the components to be orthogonally transformed is omitted to reduce the number of coded bits with a view to implementing efficient coding, this embodiment permits reconstruction of the original digital signals. Further, when no error signal components are supplied or even if no sufficient information for signal reconstruction is available, it is possible to obtain reconstructed signals of certain quality by using the inversely transformed signals from the inter-channel orthogonal inverse transform part 290 as digital reconstructed digital signals. Various kinds of processing can be omitted in the bit sequence converting part 50, and the corresponding processing in the bit sequence inverse conversion part 70 can also be omitted. Moreover, the coding part 120 is not limited specifically to lossless coding but may also be adapted for lossy high-compression-ratio coding. In such a case, the decoding part 60 in the decoder 20 is also adapted for lossy decoding. The high-compression-ratio coding can be done using such methods as mentioned previously with reference to the prior art.

Embodiment 15

Figure 40:
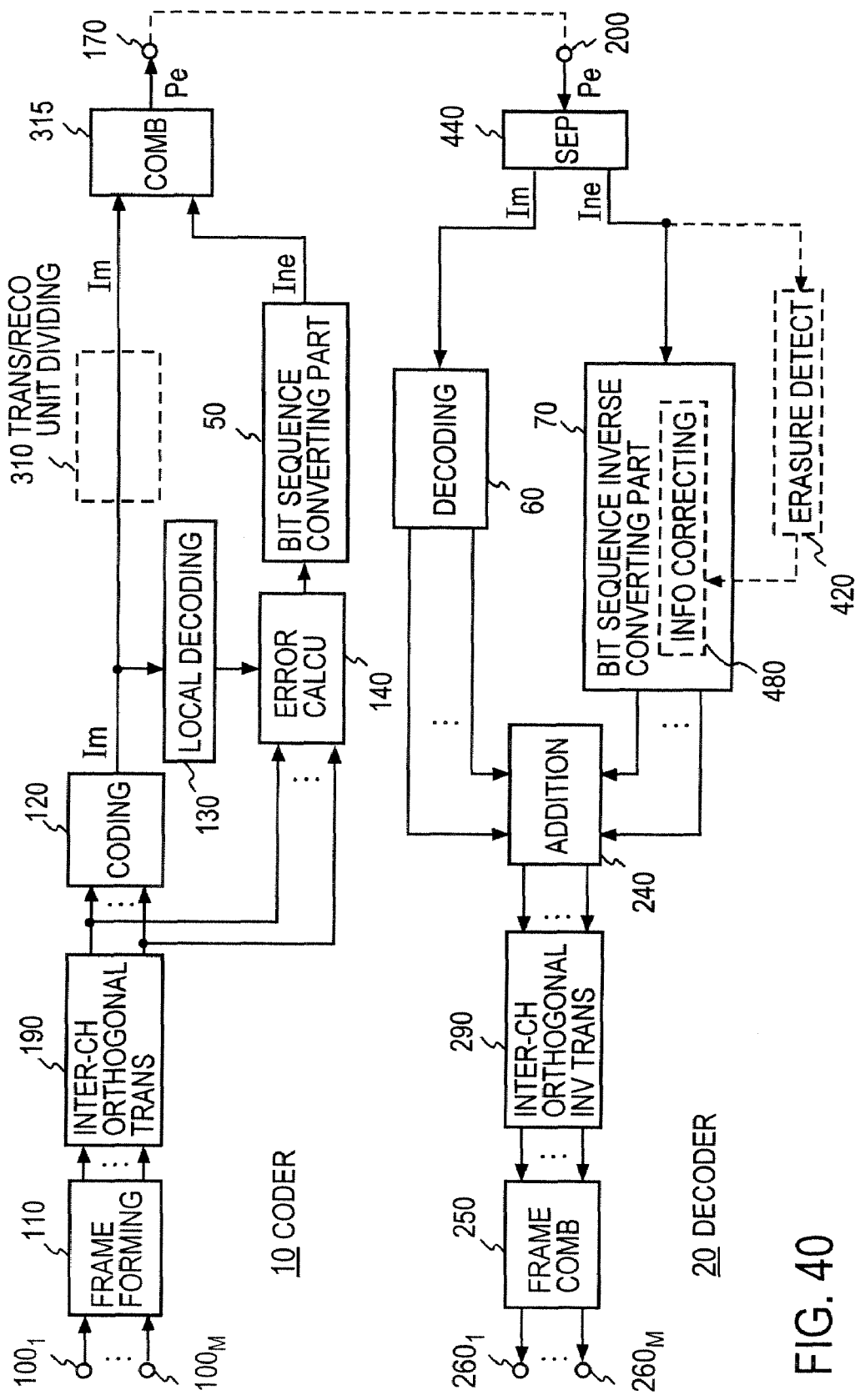
FIG. 40 is a block diagram illustrating an example of the functional configuration of Embodiment 15 of the present invention.

FIG. 40 illustrates in block form a fifteenth embodiment of the present invention, in which the parts corresponding to those in FIG. 39 are identified by the same reference numerals. The following description will be given of differences between the both embodiments.

In the coder 10, signals from the inter-channel orthogonal transform part 190, wherein M-channel digital signals are subjected to inter-channel orthogonal transformation, are encoded in the coding part 120, from which they are output as the main code Im. The main code Im is locally decoded in the local decoding part 130. The locally reconstructed signal for the code Im can be obtained in the coding part 120 due to its analysis-by-synthesis coding scheme. In this embodiment the locally reconstructed signal is not subjected to inter-channel orthogonal inverse transformation. Instead, it is applied to the error calculating part 140, which calculates an error between each of the orthogonal-transformed signals from the inter-channel orthogonal transform part 190 and the component of the main code Im corresponding to each transformed signal. The error signal is provided to the bit sequence converting part 50. Thereafter, the same processing as in the coder of the FIG. 39 embodiment is carried out.

In the decoder 20, the main code Im reconstructed in the decoding part 60 is provided to the adding part 240, wherein its main signals and the error signals reconstructed in the bit sequence inverse conversion part 70 are added. In the inter-channel orthogonal inverse transform part 290 these added component signals are inversely transformed correspondingly to the in the inter-channel orthogonal transform part 190, from which reconstructed digital signals of respective channels are provided to the frame combining part 250.

In this instance, too, correct reconstruction of the error signals permits faithfully reproduction of the multi-channel digital signals. As the case with Embodiment 14, this embodiment permits enhancement of the coding efficiency by encoding in the coding part 120 only a large-power component selected from the inter-channel orthogonal-transformed signals or predetermined therein on average. The coding in the coding part 120 may be either lossy high-compression-ratio coding or lossless coding.

The bit sequence converting part 50 in FIGS. 39 and 40 may be identical in construction with the lossless coding part 18 in FIG. 33, for instance. The bit sequence inverse conversion part 70 corresponding to the bit sequence converting part 50 may be identical in construction with the lossless decoding part 21.

Alternatively, the lossless coding part 18 in FIG. 35A may be used as the bit sequence converting part 50, and the lossless decoding part 21 in FIG. 38B may be used as the bit sequence inverse conversion part 70.

Embodiment 16

With the above-described coding/decoding method intended for lossless coding by use of a lossy compressed code and a lossless code of its error signal, the reconstructed signal of the lossy compressed code may sometimes contain a very small error according to the environment of a decoder or computer for reconstructing the lossy compressed code. In such a case, even if the reconstructed signal for the lossy compressed code and the lossless code are combined with the reconstructed error signal in the decoder, the reconstructed digital signal will not completely match the original digital signal.

This embodiment is intended to provide coding and decoding methods, a coder and a decoder which utilize lossy compression coding and lossless coding of its error signal and allow generation of a reconstructed digital signal which theoretically completely matches the original digital signal regardless of the use environment of the decoder or computer as will be described below with reference to FIG. 41.

In the coder 10 a digital signal from the input terminal 100 is separated on a frame-by-frame, for example, every 1024 samples in the frame forming part 110, and the digital signal is encoded for each frame in the lossy coding part 120, from which it is output as the main Im. The main code Im is reconstructed in the local decoding part 14, from which is provided a locally reconstructed signal, which is applied to a varying maximum digit number detecting part 55 and a truncating part 56. The locally reconstructed signal for the code Im can be obtained in the lossy coding part 120 due to its analysis-by-synthesis coding scheme. The varying maximum digit number detecting part 55 detects, over one frame or one or more sub-frames in the fame, the digit number that assures the accuracy of the reconstructed signal of the main code Im, that is, the maximum of the digit number which varies with the decoding accuracy of the decoder.

For example, in a decoder based on a coding scheme adapted in MPEG-4 audio standard, it is guaranteed independently of its use environment that each sample value of the reconstructed signal falls within the range of ±1 relative to a reference reconstructed signal. Accordingly, taking the local decoding part 14 into account, here is a possibility that the amplitudes of reconstructed signal by various decoder contains an error of ±2. The amplitude value of the locally reconstructed signal in binary number format may sometimes vary up to a high-order digit number due to the above-mentioned ±1 error.

For example, when the amplitude of the locally reconstructed signal is 8192 (0010000000000000 in binary number), it is considered that the reference decoded value is 8191 (0001111111111111 in binary number). Accordingly, in a different decoder, it is considered that the amplitude value varies from 8190 (0001111111111110 in binary number) to 8194 (0010000000000010 in binary number). In this case, the decoded value is guaranteed only at highest-order two digits even if the use environment is changed.

The maximum value of variable digit number herein mentioned refers to the digit number over which the binary representation of the amplitude of a reconstructed waveform agrees with the waveform of the original signal up to a specified digit number in one frame or one or more sub-frames. When the above-said number 8192 is contained, the maximum digit number is 14. In the above numerical example, the minimum value of accuracy is highest-order two digits. In case of a negative number, the same processing as mentioned above is performed for the absolute value. When the reconstructed amplitude is any one of −2, −1, 0, 1 and 2, it is predetermined that all digits are 0s so as to prevent polarity inversion. The varying maximum digit number detecting part 55 calculates the accuracy that is guaranteed for each sample of each locally reconstructed signal every frame or one or more sub-frames, that is, calculates the amplitude value guaranteed to be reconstructed and obtains the minimum value of accuracy that is guaranteed every frame or one or more sub-frames, that is, the maximum value of the variable digit number as shown in FIG. 4.

The varying maximum digit number detecting part 55 calculates, for each sample of the locally reconstructed signal, the digit number variable according to environment as mentioned above, detects the maximum value of the variable digit number every frame of one or more frames, and outputs it as a digit number code Ig, while at the same time the truncating part 56 truncates the values equal to or smaller than the maximum value of the varying digit number, generating an accuracy-guaranteed locally reconstructed signal. The accuracy-guaranteed locally reconstructed signal is such as indicated by the line 11 defining the lower edge of the hatched portion in FIG. 42.

An error signal between the accuracy-guaranteed locally reconstructed signal and the digital signal from the frame forming part 110 is calculated in an error calculating part 16. The error signal becomes the signal of that portion of the digital signal from the frame forming part 110 which underlies the accuracy-guaranteed locally reconstructed signal line 11 in FIG. 42. The error signal is subjected to lossless coding in a lossless coding part 18, from which it is output as the error code Ine. The main code I, the error code Ine and the digit number code Ig are combined in the combining part 320, whose combined output is provided to the output terminals 170.

In the decoder 20 the input code is separated for each frame by the separating part 440 to the main code Im, the digit number code Ig and the error code Ine. The main code Im is subjected to lossy decoding in the lossy decoding part 60, from which the reconstructed signal is provided. The digit number code Ig is reconstructed in a digit number decoding part 81, from which the varying maximum digit number is obtained. A truncating part 82 truncates those value of the decoded signal from the lossy decoding part 60 which are equal to or smaller than the value of the varying maximum digit number and, outputs an accuracy-guaranteed reconstructed signal.

The error signal Ine is lossless-reconstructed in the lossless decoding part 21, by which the error signal is reconstructed. The error signal and the accuracy-guaranteed reconstructed signal from the truncating part 82 are added together in the adding part 240, and the added signal is applied as the reconstructed digital signal to the frame combining part 250, which sequentially combines the reconstructed signals of the respective frame and provides the combined output to the output terminal 260.

As described above, the accuracy-guaranteed local signal produced in the coder 10 is kept unaffected by the worst total value of errors that occur in the local decoding part 14 and the decoder 20, and the accuracy-guaranteed reconstructed signal produced in the decoder is theoretically in perfect agreement with the accuracy-guaranteed locally reconstructed signal of the decoder. Accordingly, if the error signal is correctly reconstructed, it is possible to obtain a reconstructed digital signal that is ideally in perfect agreement with the original digital signal. In this embodiment the digit number code Ig may also be an encoded version of the minimum value of accuracy.

Embodiment 17

The varying maximum digit number, which is detected in the varying maximum digit number detecting part 55, frequently becomes about 3 or 4 bits when one sample is represented by 16 bits, for instance. With a sample of decoding accuracy at only high-order two digits as in the afore-mentioned numeric example, the minimum value of accuracy, that is the varying maximum digit number increases and the amplitude of the error signal increases accordingly, and the number of bits of the error code Ine from the lossless coding part 18 increases, impairing the coding efficiency. However, this occurs in the case where the sample value of the locally reconstructed signal is 1 only at one of high-order digits and 0 at all the other digits as in the afore-mentioned numeric example—the possibility of occurrence of such a phenomenon is remote. That is, excepting such exceptional samples, the minimum value of accuracy is about 12 or 13 bits as shown in FIG. 43A, for instance.

This embodiment is intended to produce such an accuracy-guaranteed locally reconstructed signal as depicted in FIG. 43A by encoding, every frame or one or more sub-frames: the minimum value of accuracy excepting exceptional samples, that is, the variable maximum digit number; information about the positions (in the frame or sub-frame) of the exceptional samples; and their accuracy, that is, the varying maximum digit number.

Figure 41:
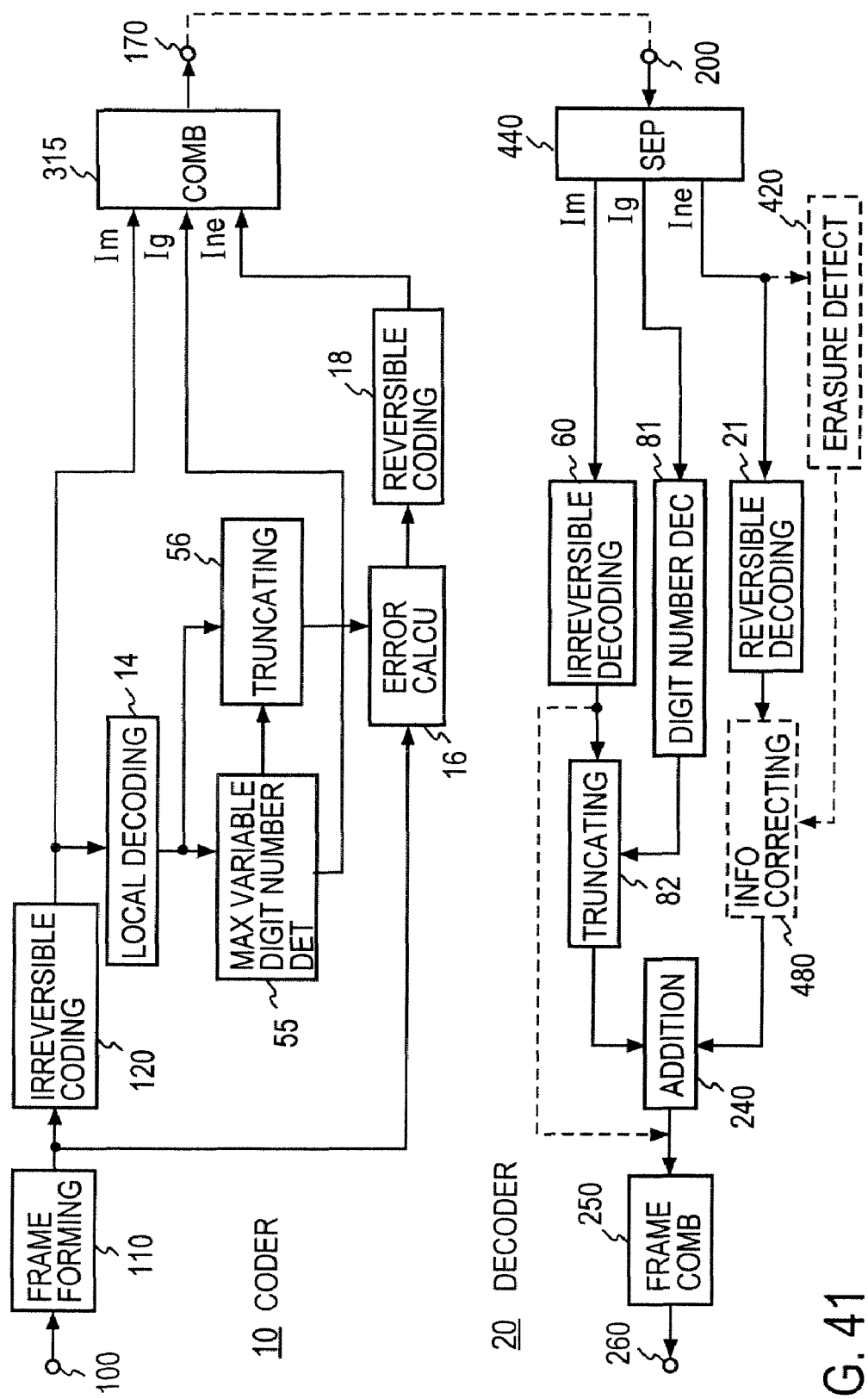
FIG. 41 is a block diagram illustrating an example of the functional configuration of Embodiment 16 of the present invention.
Figure 44:
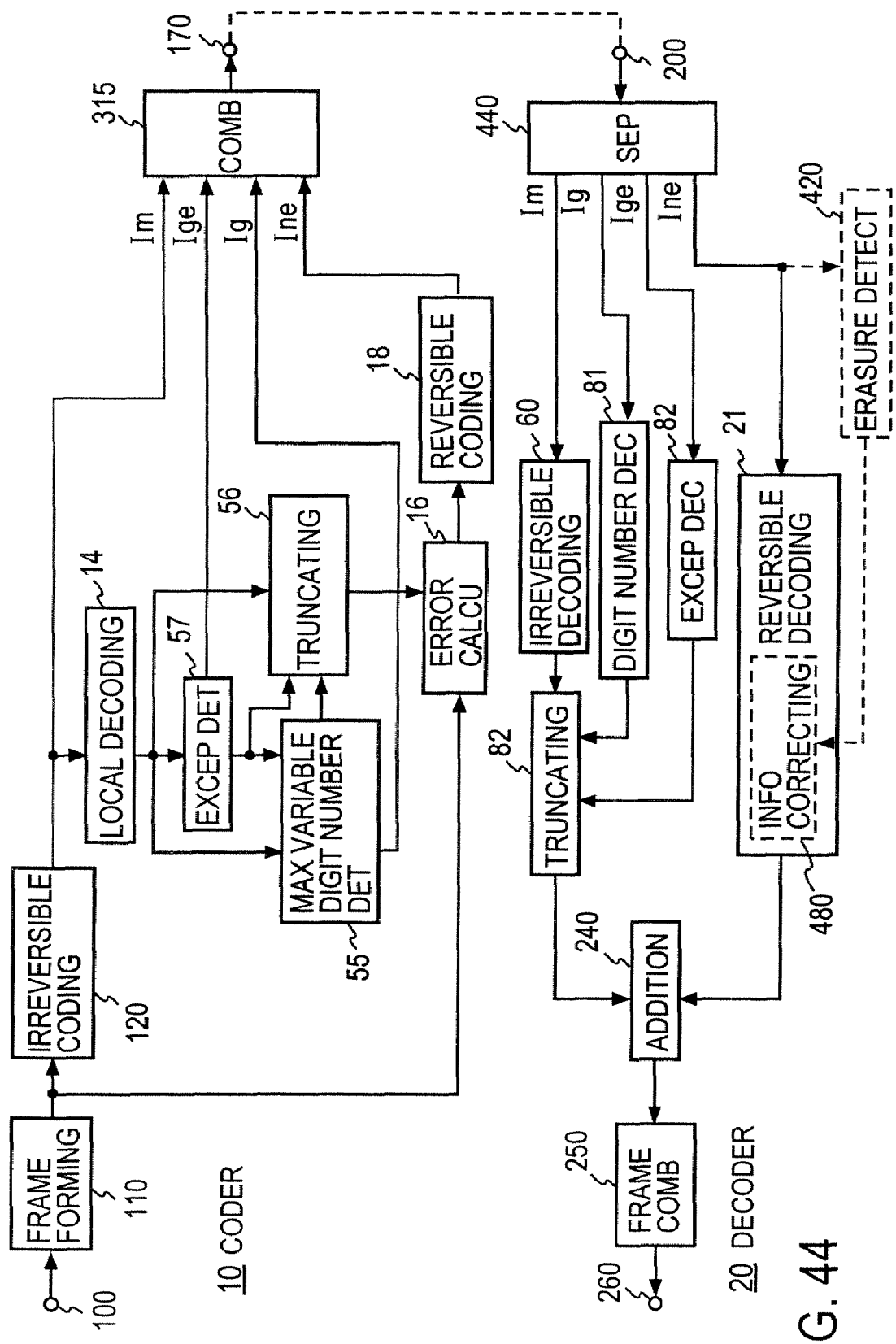
FIG. 44 is a block diagram illustrating an example of the functional configuration of Embodiment 17 of the present invention.

For example, as shown in FIG. 44 in which the parts corresponding to those in FIG. 41 are identified by the same reference numerals, in the coder the locally reconstructed signal from the local decoding part 14 is applied to an exception detecting part 57, which detects an exceptionally greatly varying digit number (exceptionally low accuracy) and provides the digit number (or accuracy) and the sample position information to the varying maximum digit number detecting part 55 and the truncating part 56, while at the same time encodes the variable digit number (or accuracy) and the sample position information and outputs them as an exception code Ige.

The varying maximum digit number detecting part 55 removes the exceptional samples from the locally reconstructed signal, then detects the varying maximum digit number (or accuracy minimum value) of the removed locally reconstructed signal, and applies it to the truncating part 56, while at the same time encoding and outputting it as the digit number code Ig. The truncating part 56 truncates from the locally reconstructed signal, for the exceptional sample, the value equal to or smaller than the numerical value of its varying digit number and for the other portions the value equal to or smaller than the numerical value of its varying maximum digit number, thereby providing the locally reconstructed signal as an accuracy-guaranteed locally reconstructed signal. The accuracy-guaranteed locally reconstructed signal is applied to the error calculating part 16. The combining part 320 combines the main code Im, the error code Ine, the digit number code Ig and the exception code Ige as well and outputs the combined output. This embodiment is identical with the FIG. 41 embodiment except the above.

The exceptional samples are those samples in which is low in the accuracy of the value of only a predetermined number of bits (large in the variable digit number); alternatively, samples are selected in an ascending order of accuracy of the values to a predetermined number of bits (in ascending order of the variable digit number). In the combining part 320, as shown in FIG. 43B, for instance, a code indicating the number of exceptional sample, position information the exceptional samples and the exception code Ige representing the varying digit number (accuracy) are arranged in this order for each frame (or sub-frame) and the digit number code Ig is added to the end of the arrangement, and they are output as one block for each frame or sub-frame.

In the decoder 20 the separated exception code Ige is decoded in an exception decoding part 83, from which sample position information and the variable digit number are obtained. The reconstructed signal from the lossy decoding part 60 is applied to a truncating part 82, which truncates values of the of sample indicated by the sample position information from the exception decoding part 83, which is equal to or smaller than the value equal to or smaller than the bit value of the varying maximum digit number of the sample. As for the other samples, the values equal to or smaller than the bit values of the variable maximum digit numbers indicated by the exception codes Ige decoded in the exception decoding part 81 are truncated in the truncating part 82. As a result, an accuracy-guaranteed local signal is generated. This embodiment is identical with the FIG. 41 embodiment except the above.

This embodiment reduces the amount of information of the error signal in the coder 10, and hence enhances coding efficiency in the lossless coding part 18.

The lossless coding part 18 in FIGS. 41 and 44 may be of the same construction as that of the lossless coding part 18 in FIG. 33, for instance. In this case, the lossless decoding part 21 in the decoder 20 may be of the same construction as that of the lossless decoding part 21 in FIG. 34. Alternatively, the lossless coding part 18 in FIG. 35A may be used intact as the lossless coding part 18, in which case the lossless decoding part 21 may use the configuration shown in FIG. 35B.

The coding and decoding method according to the above-described embodiments of the present invention can be implemented by describing computer-executable programs on recording media and, as required, reading and executing them on a computer.

EFFECT OF THE INVENTION

As described above, according to the coding and decoding methods of the first aspect of the present invention, corresponding bits of a sequence of samples are successively obtained for each frame to generate equi-position bit sequences, which are output in a packet form, so that even if a packet is erased during transmission, the erasure of corresponding bits of the sample sequence of the decoded frame does not seriously degrades the signal quality.

According to the coding and decoding methods of the second aspect of the present invention, the maximum digit number which varies based on the accuracy of the decoder used is detected for each frame or sub-frame in accordance with the accuracy of the reconstructed signal guaranteed by the decoder, and the values in a locally reconstructed signal which are equal to or smaller than the bit value of its varying maximum digit value are truncated, by which an accuracy-guaranteed local signal is provided, and an error signal between the local signal and the original digital signal is lossless-encoded. Accordingly, during decoding it is possible to obtain an accuracy-guaranteed reconstructed signal which is theoretically in agreement with the accuracy-guaranteed digital signal from the coder, by truncating from the reconstructed signal of the lossless-code the values equal to or smaller than the bit value of the reconstructed varying maximum digit number.

As described above, the present invention can be recognized as the following aspects:

1st aspect: A coding method for encoding a digital signal for each frame comprising a plurality of samples, comprising the steps of:

(a) generating multiple sets of data either consisting of multiple sets of lossless data of bits over said samples at each one of bit positions of said digital signal in said frame or consisting of lossy data and lossless data of an error signal due to said lossy data; and (b) outputting said multiple sets of data.

2nd aspect: The coding method of 1st aspect, wherein said step (a) includes a step of converting an amplitude of each of said samples to a binary format consisting of a sign bit and an absolute value prior to said lossless coding.

3rd aspect: The coding method of 1st aspect, wherein said step (b) includes a step of forming a packet including said lossless code with said header information, and outputting said packet.

4th aspect: The coding method of 1st aspect, wherein said step (b) includes a step of assigning priorities to said bitstream in a descending order of significance of a sign bit and an absolute value.

5th aspect: The coding method of 1st aspect, wherein said step (a) includes the step of:

(a-1) lossy coding of an original sound to generate lossy compression information and locally reconstructed signal; and (a-2) performing said lossless coding of an error signal between said locally reconstructed signal and said original signal as said digital signal; and said step (b) outputs said lossy compression information together with said lossless code.

6th aspect: The coding method of 1st aspect, further comprising a step of calculating parameters representing a spectral envelope of said digital signal, encoding said parameters and outputting a code for said parameters as auxiliary information together with said lossless code.

7th aspect: The coding method of 1st aspect, wherein said step (a) comprises the steps of:

(a-1) determining, as a number of effective digits, a number of digits representing a maximum value of an absolute value of the amplitude of said digital signal in each frame; and (a-2) forming at least one bitstream comprising bits of samples of each frame at least every one bit position within said number of digits in a temporal order in said each frame as a pieces of transmission/recording unit data as a part of said lossless code; and said step (b) includes a step of outputting said number of effective digits together with said lossless code.

8th aspect: The coding method of 7th aspect, wherein said step (b) includes a step of outputting said number of effective digits as auxiliary information, or said number of effective digits in any one of packets for said frame.

9th aspect: The method of 6th aspect, wherein said step (a) is characterized by:

(a-1) calculating linear prediction coefficients as said parameters, and a current predicted value based on the preceding digital signal; and (a-2) subtracting said predicted value from the current sample to obtain a prediction error as said digital signal; and said step (b) includes a step of outputting said linear prediction coefficients as auxiliary information together with said lossless code.

10th aspect: The coding method of 1st aspect, further comprising the steps of:

(0-1) lossy coding of an input signal for each frame, with respect to a perceptual characteristics to a lossy compressed code and forming a locally reconstructed signal;

(0-2) generating a modified locally reconstructed signal by modifying said locally reconstructed signal so as to reduce an error between said locally reconstructed signal and said input signal; and (0-3) generating an error signal between said input signal and said modified locally reconstructed signal as said digital signal.

11th aspect: The coding method of 10th aspect, wherein said step (0-2) includes:

calculating modified parameters including a cross-correlation component between said digital signal and said locally reconstructed signal, and outputting a modified parameter code for said modified parameters; and multiplying or convoluting said locally reconstructed signal by said modified parameter to generate said modified locally reconstructed signal.

12th aspect: The coding method of 10th aspect, wherein said step (0-2) includes the steps of:

multiplying said locally reconstructed signal by a modified parameter or combining a plurality of samples with modified parameters to generate said modified locally reconstructed signal; and generating said modified parameter for each frame so that the energy of said error signal is reduced.

13th aspect: The coding method of 10th aspect, wherein said step (0-2) includes the steps of:

(0-2-1) calculating an error between said locally reconstructed signal and said digital signal to generate an error signal;

(0-2-2) encoding said error signal, which minimizes a quantization error to an error minimized code, and generating a second locally reconstructed signal for said error minimized code; and (0-2-3) adding said second locally reconstructed signal and said locally reconstructed signal to obtain said modified local signal.

14th aspect: The coding method of 10th aspect, wherein said step (0-2) includes the steps of:

(0-2-1) encoding said digital signal, which minimizes a quantization error to an error minimized code to obtain a second locally reconstructed signal for said error minimized code; and (0-2-2) obtaining a linear combination of said locally reconstructed signal and said second locally reconstructed signal with larger coefficients for said locally reconstructed signal to calculate said modified local signal.

15th aspect: The coding method of 1st aspect further comprising the steps of:

(0-1) lossy coding of an input signal for each frame, with respect to a perceptual characteristics, and a first lossy compressed code;

(0-2) lossy coding of said digital signal to a second lossy compressed code and a local signal for said second lossy compressed code; and (0-3) generating, as said digital signal, an error signal between said local signal and said digital signal.

16th aspect: The coding method of 1st aspect, further comprising the steps of:

(0-1) performing lossy compression coding of an input signal for each frame to minimize a quantization error, and outputting an error minimized code and generating for said error minimized code a first locally reconstructed signal;

(0-2) generating, as said digital signal, an error signal between said first local signal and said input signal; and (0-3) performing lossy coding of said error signal, with respect to a perceptual characteristics, and outputting a lossy compressed code.

17th aspect: The coding method of 1st aspect, further comprising the steps of:

(0-1) mixing M-channel input signals into N-channel signals, said M being an integer equal to or greater than 2 and said N being an integer equal to or than 1 and equal to or smaller than said M;

(0-2) encoding said N-channel signals to generate a main code and N-channel locally reconstructed signals for said main code;

(0-3) transforming said N-channel locally reconstructed signals into M-channel locally reconstructed signals; and (0-4) obtaining, as said digital signal, error signals between each of said M-channel locally reconstructed signals and corresponding one of said M-channel input signals; and said step (b) is a step of outputting said main code together with said lossless code.

18th aspect: The coding method of 16th aspect, further comprising the steps of:

(0-1) mixing said N-channel mixed signals into L-channel mixed signals, said L being an integer equal to or greater than 1 and equal to or smaller than said N;

(0-2) encoding said L-channel mixed signals to generate said main code and said L-channel locally reconstructed signals for said main code;

(0-3) said L-channel locally reconstructed signals into N-channel locally reconstructed signals;

(0-4) calculating errors between said N-channel locally reconstructed signals and said N-channel mixed signals as first error signals;

(0-5) encoding said first error signals to generate a sub-code and N-channel locally reconstructed error signals for said sub-code;

(0-6) adding said N-channel locally reconstructed signals and said N-channel locally reconstructed error signals to generate N-channel added locally reconstructed signals;

(0-7) transforming said N-channel added locally reconstructed signals into said M-channel locally reconstructed signal; and (0-8) generating, as said digital signal, second error signals between each of said M-channel locally reconstructed signals and corresponding one of said M-channel digital signals;

said step (b) includes a step of outputting said main code and said sub-code together with said lossless code and said main code.

19th aspect: The coding method of 1st aspect, further comprising a step of inter-channel orthogonal transforming M-channel input signals into orthogonal transform signals as said digital signal, said M being an integer equal to or greater than 2, and said steps (a) and (b) being performed for each of said M channels.

20th aspect: The coding method of 1st aspect, further comprising the steps of:

(0-1) inter-channel orthogonal transforming M-channel input signals into orthogonal transform signals, M being an integer equal to or greater than 2;

(0-2) encoding at least one part of said orthogonal transform signals to generate a main code and locally reconstructed signals for said main code;

(0-3) inter-channel inverse orthogonal transforming said locally reconstructed signals to M-channel locally reconstructed signals; and (0-4) producing, as said digital signal to be lossless coded, an error signal between each of said M-channel locally reconstructed signals and corresponding one of said M-channel digital signals;

said step (b) includes a step of outputting said main code together with said lossless code.

21st aspect: The coding method of 1st aspect, further comprising the steps of:

(0-1) inter-channel orthogonal transforming M-channel input signals to orthogonal transform signals, M being an integer equal to or greater than 2;

(0-2) encoding at least one part of said orthogonal transform signals to generate a main code and locally reconstructed signals for said main code; and (0-3) producing, as said digital signal to be lossless coded, an error signal between each of said locally reconstructed signals and corresponding one of said orthogonal transform signals; and said step (b) includes a step of outputting said main code together with said lossless code.

22nd aspect: The coding method of 1st aspect, wherein said step (a) comprises the steps of:

(a-1) generating a lossy code and producing a locally reconstructed signal by lossy coding of said digital signal;

(a-2) obtaining a maximum digit code for a maximum number of variable digits for each frame or subframe from said locally reconstructed signal;

(a-3) generating an accuracy-guaranteed signal by omitting or rounding components equal to or less than said maximum number of variable digits from said locally reconstructed signal;

(a-4) generating an error signal between said accuracy-guaranteed locally reconstructed signal and said digital signal; and (a-5) lossless coding said error signal to said lossless code.

23rd aspect: A decoding method which reconstructs a sequence of samples of a digital signal for each frame, comprising the steps of:

(a) decoding input codes to produce multiple sets of data either consisting of multiple sets of lossless data of bits over said samples at each one of bit positions of said digital signal in said frame or consisting of lossy data and lossless data of an error signal due to the lossy data; and (b) reconstructing a digital signal based on said multiple sets of data.

24th aspect: The decoding method of 23rd aspect, wherein said step (b) includes a step of converting said sample sequences from a binary format consisting of a sign bit and an absolute value to a 2's complement format.

25th aspect: The decoding method of 23rd aspect, wherein said step (b) includes a step of correcting said digital signal by smoothing said digital signal.

26th aspect: The decoding method of 23rd aspect, wherein said step (b) includes a step of reconstructing the spectral envelope by decoding an auxiliary information, and correcting said digital signal so that a spectral envelope of said digital signal approximates said reconstructed spectral envelope.

27th aspect: The decoding method of 26th aspect, wherein said step (b) includes the steps of:

(b-1) substituting a provisional samples for missing or error bits;

(b-2) calculating a spectral envelope of said provisional samples;

(b-3) normalizing the spectral envelope of said provisional samples by characteristics of said reconstructed spectral envelope or its modified spectral envelope; and (b-4) producing restored samples by using said reconstructed spectral envelope or said modified spectral envelope and said flattened spectral envelope.

28th aspect: The decoding method of 26th aspect:, wherein said step (b) includes the steps of:

(b-1) substituting a provisional samples for missing or error bits;

(b-2) calculating a spectral envelope of said provisional samples;

(b-3) calculating one spectral envelope by normalizing said spectral envelope by said reconstructed spectral envelope or its modified spectral envelope; and (b-4) restoring said provisional samples by use of said one spectral envelope.

29th aspect: The decoding method of 27th aspect, wherein said step (b-3) includes steps of converting said calculated spectral envelope to linear prediction cepstrum coefficients Ca, converting said reconstructed spectral envelope to a linear prediction cepstrum coefficients Cb or using reconstructed spectral envelope for said auxiliary information, and calculating differences Cb−Ca between said linear prediction cepstrum coefficients Ca and Cb to obtain said one spectral envelope. 30th aspect: The decoding method of any one of 27th, 28th and 29th aspects, further comprising the step of:

(b-5) checking whether a distortion between the spectral envelope of said provisional samples and said reconstructed spectral envelope is within a predetermined value;

setting said provisional samples as restored samples; and if not within said predetermined value, repeating said steps (b-2), (b-3) and (b-4).

31st aspect: The decoding method of 23rd aspect, wherein said step (a) includes a step of lossy-decoding lossy codes to locally reconstructed signal, adding said locally reconstructed signal and said digital signal.

32nd aspect: The decoding method of 23rd aspect, wherein said step (a) includes a step of decoding a piece of transmission/recording unit data of said lossless code to at least one reconstructed bitstream at least one bit position in said one frame based on said header information; and said step (b) includes a step of detecting an erasure or an error for said transmission/recording unit data and a step of adjusting digits of said samples of said one frame in accordance with an input number of effective digits.

33rd aspect: The decoding method of 32nd aspect, wherein said step (b) includes a step;

if the number of effective digits for a current frame is larger than the number of effective digits for the one of preceding frames, downward shifting the samples in the preceding frames so that the number of effective digits for the preceding frame equals to the number of effective digits for the current frame, and if the number of effective digits for a current frame is smaller than the number of effective digits for the one of preceding frames, upward shifting the samples in the preceding frame so that the number of effective digits for preceding frame equals to the number of effective digits for the current frame.

34th aspect: The decoding method of 23rd aspect, wherein said samples are those of a prediction error signal, said method including the steps of:

(c) correcting the prediction error signal for an error or a missing unit data based on the spectral envelope of the prediction error signal;

(d) decoding input auxiliary information to linear prediction coefficients; and (e) synthesizing, based on linear prediction, a reconstructed original signal from said prediction error signal and preceding samples of said reconstructed original signal.

35th aspect: The decoding method of 34th aspect, wherein said step (c) includes the steps of:

(c-1) substituting provisional samples for missing or error bits;

(c-2) calculating a spectral envelope of said provisional samples;

(c-3) calculating a flatness of said spectral envelope, and if said flatness is within a predetermined value, setting said provisional samples as said prediction error signal;

(c-4) if said flatness is not within said predetermined value, normalizing said provisional samples by said spectral envelope or its modified spectral envelope waveform to obtain a normalized signal; and (c-5) repeating said steps (c-1) to (c-4) using said normalized signal as said provisional samples.

36th aspect: The decoding method of 34th aspect, wherein said step (c) includes the steps of:

(c-1) substituting provisional samples for missing or error bits;

(c-2) filtering said provisional samples by use of said reconstructed linear prediction coefficients to generate a synthesized signal;

(c-3) calculating a spectral envelope of said synthesized signal;

(c-4) normalizing said provisional error signal by use of said spectral envelope or its modified spectral envelope to obtain a spectrum flattened signal; and (c-5) filtering said spectrum flattened signal by use of said reconstructed linear prediction coefficients to reconstruct a prediction error waveform.

37th aspect: The decoding method of 34th aspect, wherein said step (c) includes the steps of:

(c-1) substituting provisional samples for missing or error bits;

(c-2) filtering said provisional samples by use of said reconstructed linear prediction coefficients to generate a synthesized signal;

(c-3) calculating linear prediction coefficients of said synthesized signal;

(c-4) calculating linear prediction coefficients being a combination of an inverse characteristics of said calculated linear prediction coefficients or their band-enlarged linear prediction coefficients, and said reconstructed linear prediction coefficients or their band-enlarged linear prediction coefficients; and (c-5) filtering said provisional samples by use of said combined linear prediction coefficients to produce the prediction error signal.

38th aspect: The decoding method of 36th or 37th aspect, further comprising the step of:

(f) checking whether a distortion between said calculated linear prediction coefficients and said reconstructed linear prediction coefficients is within a predetermined value;

if within said predetermined value, setting the provisional samples as restored prediction error signal; and if not within said predetermined value, repeating said steps (c-2) to (c-5) applying to said synthesized signal as said provisional samples.

39th aspect: The decoding method of 31st aspect, further comprising the steps of:

(c) modifying said locally reconstructed signal by reducing an error between said locally reconstructed signal and said digital signal, thereby generating a modified signal; and (d) combining said modified decoded signal and said error signal to renew said reconstructed signal.

40th aspect: The decoding method of 39th aspect, wherein said step (c) comprises the steps of:

(c-1) decoding a modified parameter code to a modified parameter; and (c-2) multiplying or convoluting said locally reconstructed signal by said modified parameter to obtain said modified signal.

41st aspect: The decoding method of 39th aspect, wherein said step (c) comprises the steps of:

(c-1) multiplying or convolving said locally reconstructed signal by a modified parameter with at least one modified parameter to generate said modified signal; and (c-2) generating said modified parameter so that the energy of an error signal between said modified signal and said reconstructed signal reduces.

42nd aspect: The decoding method of 23rd aspect, further comprising the steps of:

(c) lossy decoding an error minimized code to reconstruct a first locally reconstructed signal;

(d) adding said digital signal and said first locally reconstructed signal to reconstruct a first digital signal;

(e) lossy decoding with respect to a perceptual characteristics a second lossy code to reconstruct a second locally reconstructed signal; and (f) outputting said first digital signal or said second digital signal.

43rd aspect: The decoding method of 39th aspect, wherein said step (c) includes the steps of:

(c-1) decoding an error minimized code to a second locally reconstructed signal; and (c-2) adding said second locally reconstructed signal to said locally reconstructed signal to said modified signal.

44th aspect: The decoding method of 39th aspect, wherein said step (c) includes the steps of:

(c-1) decoding an error minimized code to obtain a second locally reconstructed signal; and (c-2) weighted averaging of said second locally reconstructed signal and said locally reconstructed signal with a larger weighting coefficient for said second locally reconstructed signal than a weighting coefficient for said locally reconstructed signal.

45th aspect: The decoding method of 23rd aspect, wherein said samples are M-channel error signals, said M being an integer equal to or greater than 2, said decoding method further comprising the steps of:

(c) decoding an input main code to N-channel reconstructed signals, said N being an integer equal to or smaller than said M and equal to or greater than 1;

(d) transforming said N-channel reconstructed signals into M-channel reconstructed signals; and (e) adding said M-channel error signals and said M-channel reconstructed signals to reconstruct M-channel digital signals.

46th aspect: The decoding method of 23rd aspect, wherein said samples are M-channel error signals, said M being an integer equal to or greater than 2, said decoding method further comprising the steps of:

(c) decoding an input main code to L-channel reconstructed signals, said L being an integer equal to or greater than 1;

(d) transforming said L-channel reconstructed signals into N-channel reconstructed main signals, said N being an integer equal or larger than said L and equal to or smaller than said M;

(e) decoding a sub-code to N-channel reconstructed sub-signal;

(f) adding said N-channel reconstructed main signal and said N-channel reconstructed sub-signals to generate N-channel added signals;

(g) transforming said N-channel added decoded signals to M-channel added signals; and (h) adding said M-channel error signals and said M-channel added signals to reconstruct M-channel digital signals.

47th aspect: The decoding method of 23rd aspect, wherein said samples are multi-channel samples, said decoding method further comprising the step of:

(c) inter-channel orthogonal inverse transforming said multi-channel samples to multi-channel digital signals.

48th aspect: The decoding method of 23rd aspect, wherein said samples are M-channel error signals, said M being an integer equal to or greater than 2, said decoding method further comprising the steps of:

(c) decoding an input main code to locally reconstructed signals;

(d) inter-channel orthogonal inverse transforming said locally reconstructed signals to M-channel reconstructed signals; and (e) adding said M-channel reconstructed signals and said M-channel error signals to reconstruct M-channel digital signals.

49th aspect: The decoding method of 23rd aspect, wherein said samples are M-channel error signals, said M being an integer equal to or greater than 2, said decoding method further comprising the steps of:

(c) decoding an input main code to obtain M-channel locally reconstructed signals;

(d) adding said M-channel locally reconstructed signals and said M-channel error signals to reconstruct M-channel added signals; and (e) inter-channel orthogonal inverse transforming said M-channel added signals to reconstruct M-channel digital signals.

50th aspect: The decoding method of 23rd aspect, further comprising the steps of:

(c) decoding a lossy code to produce a locally reconstructed signal;

(d) decoding a maximum digit code to obtain a maximum number of variable digits;

(e) generating an accuracy-guaranteed signal by omitting or rounding components for equal to or less than said maximum number of variable digits from said locally reconstructed signal; and (f) reconstructing a reconstructed signal by adding said digital signal and said accuracy-guaranteed signal.

51st aspect: The decoding method of 50th aspect, wherein said step (d) includes a step of decoding an exceptional code to exceptional values and their sample positions allocating said exceptional values of their sample positions of said accuracy-guaranteed signal.

52nd aspect: A coder for coding a digital signal for each frame, comprising:

means for generating multiple sets of data either consisting of multiple sets of lossless data of bits over said samples at each one of bit positions of said digital signal in said frame or consisting of lossy data and lossless data of an error signal due to said lossy; and output means for outputting said multiple sets of data to produce codes.

53rd aspect: The coder of 52nd aspect, further comprising:

a sign bit/absolute value converting part for converting an amplitude of each of samples to a binary format consisting of a sign bit and an absolute value, and for providing said converted sample to said lossless coding means.

54th aspect: The coder of 53rd aspect, wherein said output means assigns priorities to said bitstream in a descending order of significance of a sign bit and an absolute value.

55th aspect: The coder of 52nd or 53rd aspect, further comprising:

a lossy coder for lossy-coding an original signal to produce lossy compression information and locally reconstructed signal; and an error calculating means for producing an error signal between said locally reconstructed signal and said original signal as said digital signal;

wherein said output means outputs said lossy code together with said lossless code.

56th aspect: The coder of 52nd, 53rd or 54th aspect, further comprising an auxiliary information generating part for encoding parameters representing a spectral envelope of said digital signal, for encoding said parameters and for outputting a code for said parameter as auxiliary information together with said lossless code.

57th aspect: The coder of 52nd aspect, which further comprises auxiliary information generating part for obtaining and outputting, as an effective digit number, a number of digits representing a maximum value of an absolute value of the amplitude of said digital signal of each frame, and wherein said lossless coding means generates, for said each frame, said lossless code corresponding to the bitstream within said effective digits.

58th aspect: The coder of 52nd aspect, further comprising:

a spectral envelope calculating part for calculating linear prediction coefficients representing a spectral envelope of an input signal for each frame;

an auxiliary information generating part for encoding said linear prediction coefficients as auxiliary information;

a predicting part for calculating, for each frame, an integral prediction value of the current input signal from the digital signal and linear prediction coefficients of the preceding frame; and a prediction error generating part for subtracting said predicted value from the current input digital signal to obtain, as said digital signal to be lossless coded, a prediction error signal.

59th aspect: The coder of 58th aspect, which further comprises an effective digit number detecting part for obtaining, as a number of effective digits, a digit number representing a maximum value of absolute values of said digital siganl and adjoining said number of effective digits to said auxiliary information, and wherein said lossless coding means generates, for each frame, said lossless code corresponding to the bitstream within said effective digits.

60th aspect: The coder of 52nd aspect, further comprising:

a lossy coding part for lossy coding of an input signal for each frame, with respect to a perceptual characteristics to a lossy compressed code and forming a locally reconstructed signal;

a modifying part supplied with said locally reconstructed signal, for modifying said locally reconstructed signal so as to reduce an error between said locally reconstructed signal and said input signal; and an error calculating part supplied with said input signal and said modified locally reconstructed signal, for generating an error signal between said input signal and said modified locally reconstructed signal as said digital signal.

61st aspect: The coder of 52nd aspect, further comprising:

a channel mixing part supplied with M-channel input signals, for mixing said M-channel input signals into N-channel signals, said N being an integer equal to or larger than 1 and equal to or smaller than said M, and M being an integer equal to or greater than 2;

coding part, supplied with said N-channel mixed signals, for encoding said N-channel signals to generating a main code, and N-channel locally reconstructed signals for said main code;

a channel expanding part supplied with said N-channel locally reconstructed signals, for transforming said N-channel locally reconstructed signals into M-channel locally reconstructed signals;

an error calculating part for producing, as said digital signal, error signals between said M-channel locally reconstructed signals and said M-channel input signals; and wherein said output means outputs said main code together with said lossless code.

62nd aspect: The coder of 52nd aspect, further comprising:

an inter-channel orthogonal transform part for transforming M-channel input signals into orthogonal transform signals, M being an integer equal to or greater than 2;

coding part for coding at least one part of said orthogonal transform signals to generate a main code and locally reconstructed signals;

an inter-channel orthogonal inverse transform part for transforming said locally reconstructed signals, to M-channel locally reconstructed signals; and an error calculating part for producing an error signal between each of said M-channel locally reconstructed signals and corresponding one of said M-channel input signals each as said digital signal to be lossless coded; and wherein said output means outputs said main code together with said lossless codes.

63rd aspect: The coder of 52nd aspect, further comprising:

an inter-channel orthogonal transform part for transforming M-channel input signals into orthogonal transform signals, M being an integer equal to or greater than 2;

coding part for coding at least one part of said orthogonal transform signals, to generate a main code and locally reconstructed signals; and an error calculating part for producing an error signal between each of said locally reconstructed signals and corresponding one of said orthogonal transform signals each as said digital signal to be lossless coded; and wherein said output means outputs said main code together with said lossless code.

64th aspect: The coder of 52nd aspect, further comprising:

a lossy coding part for lossy coding an input signal to produce a lossy code;

a local reconstructing part for producing, from said lossy code, a locally reconstructed signal;

a maximum variable digits number detecting part for detecting from said locally reconstructed signal a maximum number of variable digits for each frame or one or more sub-frames and producing a maximum digit code representing said maximum number of variable digits;

a truncating part for truncating or rounding components equal to or smaller than said maximum number of variable digits from said locally reconstructed signal to generate an accuracy-guaranteed locally reconstructed signal;

an error calculating part for generating, as said digital signal to be lossless coded, an error signal between said accuracy-guaranteed locally reconstructed signal and said input signal; and wherein said output means outputs said maximum number code and said lossy code together with said lossless code.

65th aspect: A decoder which reconstructs a sequence of samples of a digital signal for each frame, comprising:

means for decoding input codes to produce multiple sets of data either consisting of multiple sets of lossless data of bits over said samples at each one of bit positions of said digital signal in said frame or consisting of lossy data and lossless data of an error signal due to the lossy data; and means for reconstructing a digital signal based on said multiple sets of data.

66th aspect: The decoder of 65th aspect, further comprising:

a 2's complement converting part for converting each of said samples from a binary format consisting of a sign bit and an absolute value to 2's complement format to provide said samples.

67th aspect: The decoder of 65th or 66th aspect, further including:

a missing information compensating part for estimating missing bitstreams from known information, and correcting said sample sequences.

68th aspect: The decoder of 67th aspect, wherein said missing information compensating part comprises a lowpass filter for smoothing said sample sequences input thereto.

69th aspect: The decoder of 67th aspect, which further comprises an auxiliary information decoding part for decoding auxiliary information input thereto to obtain a spectral envelope; and wherein said missing information compensating part corrects said sample sequences so that their spectral envelope approaches said decoded spectral envelope.

70th aspect: The decoder of 69th aspect, wherein said missing information compensating part comprises:

a provisional samples generating part for substituting provisional samples for missing or error bits over samples;

a spectral envelope calculating part for calculating a spectral envelope of said provisional samples;

an inverse filter for normalizing the spectral envelope of said provisional samples by characteristics of said reconstructed spectral envelope or its modified spectral envelope;

a synthesis filter for producing a restored samples by using said reconstructed spectral envelope or said modified spectral envelope and said flattened spectral envelope.

71st aspect: The decoder of 69th aspect, wherein said missing information compensating part comprises:

a provisional waveform generating part for substituting provisional samples for missing or error bits;

a spectral envelope calculating part for calculating the spectral envelope of said provisional samples;

a composite spectral envelope calculating part for calculating linear prediction coefficients of a combination of inverse characteristics of said calculated spectral envelope or its modified spectral envelope and coefficients of reconstructed spectral envelope or its modified one;

a synthesis filter for reconstructing said provisional samples by use of said composite spectral envelope.

72nd aspect: The decoder of 71st aspect, wherein said composite spectral envelope calculating part comprises:

a first coefficient converting part for converting said calculated spectral envelope to linear prediction cepstrum coefficients Ca;

a second coefficient converting part for converting said reconstructed spectral envelope to linear prediction cepstrum coefficients Cb or using reconstructed envelope for said auxiliary information;

a subtracting part for calculating differences Cb−Ca between said linear prediction cepstrum coefficients Ca and Cb; and an inverse conversion part for inversely converting said difference Cb−Ca to obtain said linear prediction coefficients of composite spectral envelope.

73rd aspect: The decoder of 70th or 71st aspect, further comprising an error calculating part for:

calculating a distortion difference between the spectral envelope of said provisional samples or restored samples and said reconstructed spectral envelope, setting said provisional samples as restored samples; and if not within said predetermined value, supplying said provisional or restored samples to said inverse filter or said synthesis filter.

74th aspect: The decoder of 65th aspect, further comprising:

a lossy decoding part for lossy decoding lossy-codes to locally reconstructed signal; and adding part for adding said locally reconstructed signal to said digital signal.

75th aspect: The decoder of 65th aspect, further comprising: an auxiliary information decoding part for decoding input auxiliary information to obtain an effective digit for each frame; and a digit adjusting part for adjusting digits of said samples of said one frame or said restored samples in accordance with the number of effective digits.

76th aspect: The decoder of 75th aspect, wherein said auxiliary information decoding part is to decode average power as well, and said missing information compensating part is to correct the amplitudes of said samples sequences as well by use of said decoded average power.

77th aspect: The decoder of 65th aspect, wherein linear prediction of said samples are those of a prediction error signal, said auxiliary decoder further comprises:

an auxiliary information decoding part for decoding input auxiliary information to linear prediction coefficients;

a combining part for synthesizing reconstructed original signal from said prediction error signal and preceding samples of reconstructed original signal by use of said linear prediction coefficients; and a missing information compensating part for correcting the prediction error signal for an error or missing unit data based on the spectral envelope of the prediction error signal.

78th aspect: The decoder of 77th aspect, wherein said missing information compensating part comprises:

a provisional waveform generating part for substituting a provisional samples missing or error bits;

a spectral envelope calculating part for calculating the spectral envelope of said provisional samples;

a flatness deciding part for calculating a flatness of said spectral envelope, and if said flatness is within a predetermined value, setting said provisional samples as said prediction error signal; and an inverse filter for normalizing said provisional samples by said spectral envelope or modified spectral envelope waveform to obtain a normalized signals if said flatness is not within said predetermined value.

79th aspect: The decoder of 77th aspect, wherein said missing information compensating part comprises:

a provisional waveform generating part for substituting provisional samples for missing or error bits;

a first synthesis filter for filtering said provisional samples by use of said reconstructed linear prediction coefficients to generate a synthesized signal;

a spectral envelope calculating part for calculating a spectral envelope of said synthesized signal;

a synthetic spectral envelope calculating part for calculating linear prediction coefficients being is a combination of inverse characteristics of said calculated linear prediction coefficients or their band-enlarged linear prediction coefficients and said reconstructed linear prediction coefficients or their band-enlarged linear prediction coefficients; and a second synthesis filter for filtering said provisional samples by use of said combined linear prediction coefficients to produce the prediction error signal.

80th aspect: The decoder of 74th aspect, which further comprises:

a modifying part for modifying said locally reconstructed signal by reducing an error between said locally reconstructed signal and said digital signal, thereby generating a modified signal; and an adding part for combining said modified signal and said error signal to renew said reconstructed signal.

81st aspect: The decoder of 65th aspect, wherein said rearrangement part reconstructs M-channel error signals, said M being an integer equal to or greater than 2, said decoder further comprising:

a decoding part for decoding a main code to N-channel reconstructed signals, said N being an integer equal to or greater than 1 and equal to or smaller than said M;

a channel expansion part for transforming said N-channel reconstructed signals into M-channel reconstructed signals;

a erasure detecting part for detecting erasure bit and outputting an erasure signal, said information correcting part having a missing information compensating part for adding missing information to the waveform of said error signal corresponding to the erasure bit detected by said erasure detecting part; and an adding part for adding said M-channel error signals or corrected error signals and said M-channel reconstructed signals to generate M-channel digital signals.

82nd aspect: The decoder of 65th aspect, wherein M rearrangement parts are provided in correspondence to M channels, for outputting M-channel error signals, said M being an integer equal to or greater than 2, said decoder further comprising:

a decoding part for decoding a main code to locally reconstructed signals;

an inter-channel orthogonal inverse transform part for inter-channel orthogonal inverse transforming said locally reconstructed signals to M-channel reconstructed signals; and an adding part for adding said M-channel reconstructed signals and said M-channel error signals to reconstruct M-channel digital signals.

83rd aspect: The decoder of 65th aspect, wherein M rearrangement parts are provided in correspondence to M channels, for outputting M-channel error signals, said M being an integer equal to or greater than 2, said decoder further comprising:

a decoding part for decoding a main code to M-channel locally reconstructed signals;

an adding part for adding said M-channel locally reconstructed signals and said M-channel error signals to reconstruct M-channel added signal; and an inter-channel orthogonal inverse transform part for inter-channel orthogonal inverse transforming said M-channel added signals to reconstruct M-channel digital signals.

84th aspect: The decoder of 65th aspect, further comprising:

a lossy decoding part for decoding lossy code to produce a locally reconstructed signal;

a digit number decoding part for decoding a maximum digit code to obtain a maximum number of variable digits;

a truncating part for truncating components equal to or smaller than said maximum number of variable digits from said locally reconstructed signal to generate an accuracy-guaranteed signal; and an adding part for adding together said digital signal and said accuracy-guaranteed signal to obtain a reconstructed signal.

85th aspect: A coding program for implementing said coding methods of 1st to 22nd aspects on a computer.

86th aspect: A decoding program for implementing said coding methods of 23rd to 51st aspects on a computer.

What is claimed is:

1. A decoding method which reconstructs a sequence of samples of a digital signal for each frame, comprising the steps of:
   (a) decoding input codes to produce multiple sets of bit sequences and rearranging bits of said multiple sets of data to produce a provisional sequence of samples in said each frame;
   (b) inserting arbitrary values into bit positions where values are not available in said provisional sequence of samples, to reconstruct a provisional digital signal;
   (c) calculating a decoded spectral envelope by decoding input auxiliary information; and
   (d) correcting said provisional digital signal so that a spectral envelope of said provisional digital signal approaches said decoded spectral envelope to construct a decoded digital signal.

2. The decoding method according to claim 1, wherein said step (d) comprises the steps of:
   (d-1) calculating a spectral envelope of said provisional digital signal; and
   (d-2) giving an inverse characteristic of said spectral envelope of said provisional digital signal and a characteristic of said decoded spectral envelope to said provisional digital signal to obtain said decoded digital signal.

3. The decoding method according to claim 2, wherein said step (d-2) comprises the steps of:
   (d-2-1) converting said spectral envelope of said provisional digital signal to linear prediction cepstrum coefficients Ca;
   (d-2-2) converting said decoded spectral envelope to linear prediction cepstrum coefficients Cb;
   (d-2-3) calculating differences Cb–Ca between said linear prediction cepstrum coefficients Ca and Cb and converting said differences Cb–Ca into linear prediction coefficients; and
   (d-2-4) applying a linear prediction synthesis process by use of said linear prediction coefficients to said provisional digital signal to obtain said decoded digital signal.

4. The decoding method according to claim 2 or 3, wherein said step (d-2) further includes the steps of:
   checking whether an error between said decoded spectral envelope and said spectral envelope of said provisional digital signal is within a predetermined value; and
   if within said predetermined value, setting said provisional digital signal as said decoded digital signal.

5. The decoding method according to anyone of claims 1 to 3, further including the steps of:
   checking whether a bit in said decoded digital signal is different from a bit obtained from said multiple sets of data; and
   if different, substituting said bit obtained from said multiple sets of data for said bit in said decoded digital signal.

6. A computer readable recording medium storing a decoding program for execution on a computer, said decoding program comprising the method of claim 1.

7. A decoding method which reconstructs a sequence of samples of a digital signal for each frame, comprising the steps of:
   (a) decoding input codes to produce multiple sets of data of bit sequences and rearranging bits of said multiple sets of data to produce a provisional sequence of difference samples in said each frame;
   (b) inserting arbitrary values into bit positions where values are not available in said provisional sequence of difference samples, to reconstruct a provisional difference signal;
   (c) calculating a decoded spectral envelope by decoding input auxiliary codes;
   (d) correcting said provisional difference signal so that a spectral envelope of a decoded digital signal approximates said decoded spectral envelope to construct a decoded difference signal; and
   (e) giving a characteristic of said decoded spectral envelope to said decoded difference signal to obtain said decoded digital signal.

8. The decoding method according to claim 7, wherein said step (d) comprises the steps of:
   (d-1) giving a characteristic of said decoded spectral envelope to said provisional difference signal to obtain a provisional decoded signal;

(d-2) calculating a spectral envelope of said provisional decoded signal; and (d-3) giving an inverse characteristic of said spectral envelope of said provisional decoded signal to said provisional decoded signal to obtain said decoded difference signal.

9. The decoding method according to claim 7, wherein said step (d) comprises the steps of:

(d-4) calculating a spectral envelope of said provisional difference signal; and (d-5) giving an inverse characteristic of said spectral envelope of said provisional difference signal to said provisional difference signal to obtain said decoded difference signal.

10. The decoding method according to claim 9, wherein said step (d-5) further includes the step of:

if a degree of flatness of said provisional difference signal is within a predetermined value, setting said provisional difference signal as said decoded difference signal.

11. A computer readable recording medium storing a decoding program for execution on a computer, said decoding program comprising the method of claim 7.

12. A decoder which reconstructs samples of a digital signal of each frame, comprising:

(a) means for decoding input codes to produce multiple sets of data of bit sequences and rearranging bits of said multiple sets of data to produce a provisional sequence of samples in said each frame;

(b) means for inserting arbitrary values into bit positions where values are not available in said provisional sequence of samples, to reconstruct a provisional digital signal;

(c) means for calculating a decoded spectral envelope by decoding input auxiliary information; and (d) means for correcting said provisional digital signal so that a spectral envelope of said provisional digital signal approaches said decoded spectral envelope to construct a decoded digital signal.

13. The decoder according to claim 12, wherein said means (d) comprises:

(d-1) means for calculating a spectral envelope of said provisional digital signal; and (d-2) means for giving an inverse characteristic of said spectral envelope of said provisional digital signal and a characteristic of said decoded spectral envelope to said provisional digital signal to obtain said decoded digital signal.

14. The decoder according to claim 13, wherein said means (d-2) comprises:

(d-2-1) means for converting said spectral envelope of said provisional digital signal to linear prediction cepstrum coefficients Ca;

(d-2-2) means for converting said decoded spectral envelope to linear prediction cepstrum coefficients Cb;

(d-2-3) means for calculating differences Cb−Ca between said linear prediction cepstrum coefficients Ca and Cb and converting said differences Cb−Ca into linear prediction coefficients; and (d-2-4) means for applying a linear prediction synthesis process by use of said linear prediction coefficients to said provisional digital signal to obtain said decoded digital signal.

15. The decoder according to claim 13 or 14, wherein said means (d-2) further includes:

means for checking whether an error between said decoded spectral envelope and said spectral envelope of said provisional digital signal is within a predetermined value; and if within said predetermined value, means for setting said provisional digital signal as said decoded digital signal.

16. The decoder according to any one of claims 12 to 14, further including:

means for checking whether a bit in said decoded digital signal is different from a bit obtained from said multiple sets of data; and if different, means for substituting said bit obtained from said multiple sets of data for said bit in said decoded digital signal.

17. A decoder which reconstructs a sequence of samples of a digital signal for each frame, comprising:

(a) means for decoding input codes to produce multiple sets of data of bit sequences and rearranging bits of said multiple sets of data to produce a provisional sequence of difference samples in said each frame;

(b) means for inserting arbitrary values into bit positions where values are not available in said provisional sequence of difference samples, to reconstruct a provisional difference signal;

(c) means for calculating a decoded spectral envelope by decoding input auxiliary codes;

(d) means for correcting said provisional difference signal so that a spectral envelope of a decoded digital signal approaches said decoded spectral envelope to construct a decoded difference signal; and (e) means for obtaining said decoded digital signal by giving a characteristic of said decoded spectral envelope to said decoded difference signal.

18. The decoder according to claim 17, wherein said means (d) comprises:

(d-1) means for giving a characteristic of said decoded spectral envelope to said provisional difference signal to obtain a provisional decoded signal;

(d-2) means for calculating a spectral envelope of said provisional decoded signal; and (d-3) means for giving an inverse characteristic of said spectral envelope of said provisional decoded signal to said provisional decoded signal to obtain said decoded difference signal.

19. The decoder according to claim 17, wherein said means (d) comprises:

(d-4) means for calculating a spectral envelope of said provisional difference signal; and (d-5) means for giving an inverse characteristic of said spectral envelope of said provisional difference signal to said provisional difference signal to obtain said decoded difference signal.

20. The decoder according to claim 19, wherein said means (d-5) further includes:

means for setting said provisional difference signal as said decoded difference signal if a degree of flatness of said provisional difference signal is within a predetermined value.

* * * * *